(12) United States Patent
Durairajan et al.

(10) Patent No.: US 7,441,612 B2
(45) Date of Patent: Oct. 28, 2008

(54) PDC DRILL BIT USING OPTIMIZED SIDE RAKE ANGLE

(75) Inventors: Bala Durairajan, Houston, TX (US); Peter Thomas Cariveau, Spring, TX (US); Sujian J. Huang, Beijing (CN)

(73) Assignee: Smith International, Inc., Houston, TX (US)

( * ) Notice: Subject to any disclaimer, the term of this patent is extended or adjusted under 35 U.S.C. 154(b) by 254 days.

(21) Appl. No.: 11/329,976

(22) Filed: Jan. 11, 2006

(65) Prior Publication Data

US 2006/0180356 A1  Aug. 17, 2006

Related U.S. Application Data

(63) Continuation-in-part of application No. 11/041,895, filed on Jan. 24, 2005, now abandoned.

(51) Int. Cl.
*E21B 10/16* (2006.01)
(52) U.S. Cl. .................. 175/431; 175/426
(58) Field of Classification Search .......... 175/431, 175/426
See application file for complete search history.

(56) References Cited

U.S. PATENT DOCUMENTS

| | | | |
|---|---|---|---|
| 4,408,671 A | 10/1983 | Munson |
| 4,475,606 A | 10/1984 | Crow |
| 4,815,342 A | 3/1989 | Brett |
| 4,862,974 A | 9/1989 | Warren |
| 4,932,484 A | 6/1990 | Warren |
| 4,982,802 A | 1/1991 | Brett |
| 5,010,789 A | 4/1991 | Brett |
| 5,042,596 A | 8/1991 | Brett |
| 5,131,478 A | 7/1992 | Brett |
| 5,131,479 A | 7/1992 | Boulet et al. |
| 5,178,222 A | 1/1993 | Jones |
| RE34,435 E | 11/1993 | Warren et al. |
| 5,443,565 A | 8/1995 | Strange, Jr. |
| 5,456,141 A | 10/1995 | Ho |
| 5,605,198 A | 2/1997 | Tibbitts |
| 5,613,093 A | 3/1997 | Kolb |
| 5,787,022 A | 7/1998 | Tibbitts |

(Continued)

FOREIGN PATENT DOCUMENTS

BE   1013217 A6   10/2001

(Continued)

OTHER PUBLICATIONS

Official Action issued in corresponding Canadian Application No. 2,533,497; Dated Apr. 25, 2007; 2 pages.

(Continued)

*Primary Examiner*—Giovanna C Wright
(74) *Attorney, Agent, or Firm*—Osha · Liang LLP

(57) ABSTRACT

A fixed cutter drill bit and a method for designing a fixed cutter drill bit includes simulating the fixed cutter drill bit drilling in an earth formation. A performance characteristic of the simulated fixed cutter drill bit is determined. A side rake angle distribution of the cutters is adjusted at least along a cone region of a blade of the fixed cutter drill bit to change the performance characteristic of the fixed cutter drill bit.

9 Claims, 28 Drawing Sheets

U.S. PATENT DOCUMENTS

| | | | |
|---|---|---|---|
| 5,803,196 | A | 9/1998 | Fielder |
| 5,864,058 | A | 1/1999 | Chen |
| 5,868,213 | A | 2/1999 | Cisneros et al. |
| 5,903,743 | A | 5/1999 | Kolb |
| 5,950,747 | A | 9/1999 | Tibbitts |
| 6,021,377 | A | 2/2000 | Dubinsky et al. |
| 6,021,859 | A | 2/2000 | Tibbitts |
| 6,095,262 | A | 8/2000 | Chen |
| 6,213,225 | B1 | 4/2001 | Chen |
| 6,241,034 | B1 | 6/2001 | Steinke et al. |
| 6,269,893 | B1 | 8/2001 | Beaton |
| 6,290,006 | B1 | 9/2001 | Crawford |
| 6,298,930 | B1 | 10/2001 | Sinor |
| 6,308,790 | B1 | 10/2001 | Mensa-Wilmot et al. |
| 6,349,595 | B1 | 2/2002 | Civolani et al. |
| 6,401,839 | B1 | 6/2002 | Chen |
| 6,412,577 | B1 | 7/2002 | Chen |
| 6,435,058 | B1 | 8/2002 | Matthias |
| 6,516,293 | B1 | 2/2003 | Huang et al. |
| 6,536,543 | B2 | 3/2003 | Meiners |
| 6,619,411 | B2 | 9/2003 | Singh et al. |
| 6,695,073 | B2 | 2/2004 | Glass |
| 6,711,969 | B2 | 3/2004 | Meiners |
| 6,729,420 | B2 | 5/2004 | Mensa-Wilmot |
| 6,785,641 | B1 | 8/2004 | Huang |
| 2005/0015229 | A1 | 1/2005 | Huang |

FOREIGN PATENT DOCUMENTS

| | | |
|---|---|---|
| EP | 0728912 A2 | 8/1996 |
| EP | 1146200 A1 | 10/2001 |
| GB | 2241266 A | 8/1991 |
| GB | 2300208 A | 10/1996 |
| GB | 2329203 | 3/1999 |
| GB | 0972908 A2 | 1/2000 |
| GB | 2339815 A | 2/2000 |
| GB | 2346628 A | 8/2000 |
| GB | 2367843 A | 4/2002 |
| GB | 2379699 A | 3/2003 |
| SU | 933932 | 6/1982 |
| SU | 1461855 A1 | 2/1989 |
| SU | 1654515 A1 | 7/1991 |
| SU | 1691497 A1 | 11/1991 |
| WO | WO-00/12859 | 3/2000 |
| WO | WO-00/12860 | 3/2000 |
| WO | WO-01/33027 A2 | 5/2001 |
| WO | WO-02/077407 A1 | 10/2002 |

OTHER PUBLICATIONS

Combined Search and Examination Report issued in application No. GB0601410.4 dated Apr. 19, 2006 (7 pages).
Glowka, D.A., "Use of Single-Cutter Data in the Analysis of PDC Bit Designs: Part 2—Development and Use of the PDC Wear Computer Code", JPT, Aug. 1989 (pp. 850-859).
Certification and Notarization dated Nov. 12, 2003 from Universe Technical Translation.
D. Ma, et al. "Dynamics of Roller Cone Bits", Journal of Energy Resources Technology, Dec. 1985, vol. 107 (pp. 543-548).
Boris L. Steklianov, "Increasing the Efficiency of Rock-Cutting Tools on the Basis of Comparative Analysis of the Kinetic Characteristics of Their Cutting Structure"; NDERI, 1990 (24 pages).
RockBit International, "System Designed to Speed Continuous Coring Operation", (4 pages).
RockBit International, "The Leader in High-Speed Drill Bit Technology" (24 pages).
B. L. Steklyanov, et al.; "Improving the effectiveness of Drilling Tools"; KhM-3 Oil Industry Machine Building; (1991) pp. 1-35.
Ma Dekun, et al., "The Operational Mechanics of The Rock Bit", Petroleum Industry Press, 1996, pp. 1-243.
Society of Petroleum Engineers Paper No. 71053, "Development and Application of a New Roller Cone Bit with Optimized Tooth Orientation", S. L. Chen, et al., presented May 21-23, 2001 (15 pages).
Hancke, et al., G.P. A Control System for Optimizing Deep Hole Drilling Conditions, IECON 1991 International Conference on Industrial Electronics, Control and Instrumentation, 1991, pp. 2279-2284.
Hancke, G. P. The Effective Control of a Deep Hole Diamond Drill, Conference REcord of the IEEE Industry Applications Society Annual Meeting, 1991, pp. 1200-1205.
Howie, et al., W. L. A Smart Bolter for Improving Entry Stability, Conference Record of the IEEE Industry Applications Society Annual Meeting, 1989, pp. 1556-1564.
Ertunc, et al., H. M. Real Time Monitoring of Tool Wear Using Multiple Modeling Method, IEEE International Electric Machines and Drives Conference, IEMDC 2001, pp. 687-691.
Society of Petroleum Engineers Paper No. 71393, "Development and Field Applications of Roller Cone Bits with Balanced Cutting Structure", S. L. Chen, et al., presented Sep. 30-Oct. 3, 2001 (11 pages).
Society of Petroleum Engineers Paper No. 56439, "Field Investigation of the Effects of Stick-Slip, Lateral, and Whirl Vibrations on Roller Cone Bit Performance", S.L. Chen, et al., presented Oct. 3-6, 1999, (10 pages).
Dekun Ma, et al.; "The Computer Simulation of the Interaction Between Roller Bit and Rock"; International Meeting on Petroleum Engineering; PR China; Nov. 14-17, 1995; pp. 309-317.
Sandvik Rock Bits, "Sandvik in the World of Oil and Gas" (8 pages).
RockBit International, "If You've Ever Doubted RBI's Ability to Drill at a Lower Cost Per Foot . . . Ask the Folks Drilling This Well", (4 pages).
Robert L. McIntyre, "Surface Mine Rotary Drilling", Smith-Gruner (3 pages).
D. Ma, et al. "A New Way to Characterize the Gouging-Scraping Action of Roller Cone Bits", Society of Petroleum Engineers, 1989 (24 pgs.).
Translation of Description of Invention No. 933932 dated Jun. 7, 1982 (2 pages).
International Search Report dated Nov. 22, 2004, (6 pages).
Glowka, David A., "Use of Single-Cutter Data in the Analysis of PDC Bit Designs: Part 1—Development of a PDC Cutting Force Model"; JPT, Aug. 1989 (pp. 797-799, 844-849).
Glowka, et al., "Progress In the Advanced Synthetic-Diamond Drill Bit Program"; ASME International (pp. 87-95).
Candian Official Action dated Feb. 6, 2008 issued in Application No. 2533497 (3 pages).
Combined Search and Examination Report issued in corresponding GB Application No. 0712412.6 dated Aug. 2, 2007 (6 pages).

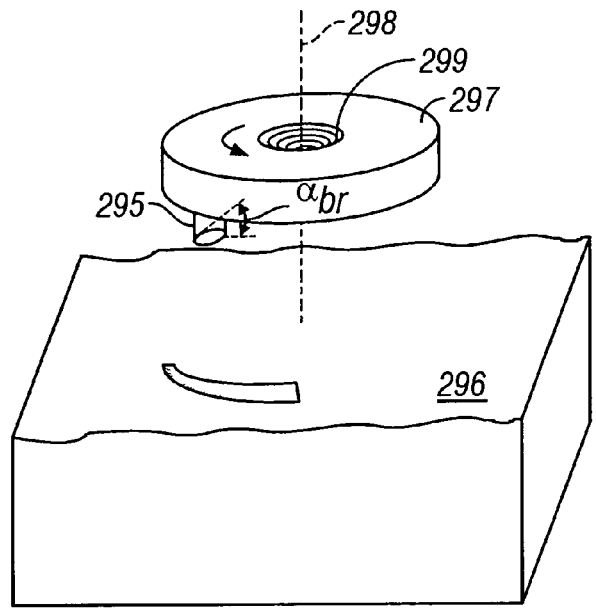
FIG. 10A
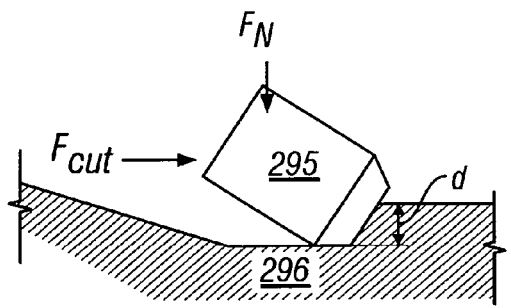 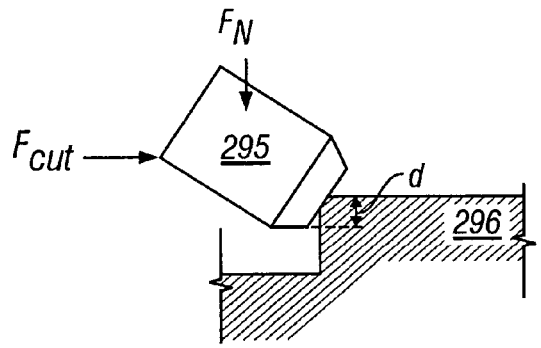
FIG. 10B          FIG. 10C
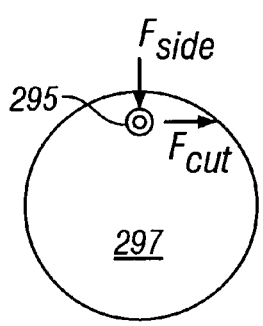 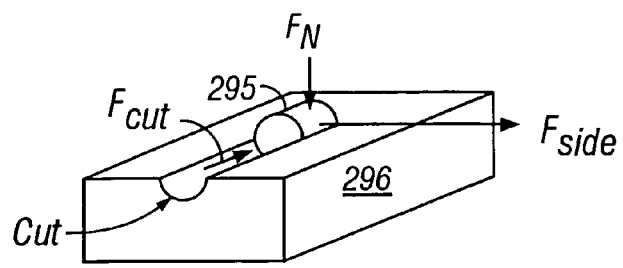
FIG. 10D          FIG. 10E

BEFORE SIDE RAKE
MULTI-LOBED, LARGE TRAJECTORY
DISPLACEMENTS

WITH SIDE RAKE
OFF-CENTER MOTION IS
MINIMIZED

PDC DRILL BIT USING OPTIMIZED SIDE RAKE ANGLE

CROSS-REFERENCE TO RELATED APPLICATIONS

This is an application for patent and is a continuation-in-part of co-pending and co-owned U.S. patent application Ser. No. 11/041,895 entitled "PDC Drill Bit Using Optimised Side Rake Distribution that Minimized Vibration and Deviation" filed on Jan. 24, 2005, which is related to co-pending and co-owned U.S. patent application Ser. No. 10/888,523 entitled "Methods For Designing Fixed Cutter Bits and Bits Made Using Such Methods" filed on Jul. 9, 2004, U.S. patent application Ser. No. 10/888,358 entitled "Methods For Modeling, Displaying, Designing, And Optimizing Fixed Cutter Bits filed on Jul. 9, 2004, U.S. patent application Ser. No. 10/888,354 entitled "Methods for Modeling Wear of Fixed Cutter Bits and for Designing and Optimizing Fixed Cutter Bits," filed on Jul. 9, 2004, and U.S. patent application Ser. No. 10/888,446 entitled "Methods For Modeling, Designing, and Optimizing Drilling Tool Assemblies," filed on Jul. 9, 2004, all of which are expressly incorporated by reference in their entireties.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The invention relates generally to fixed cutter drill bits used to drill boreholes in subterranean formations. More specifically, the invention relates to methods for modeling the drilling performance of a fixed cutter bit drilling through an earth formation, methods for designing fixed cutter drill bits, methods for improving and/or optimizing the drilling performance of a fixed cutter drill bit, and to drill bits formed using such methods.

2. Background Art

Fixed cutter bits, such as polycrystalline diamond compact (PDC) drill bits, are commonly used in the oil and gas industry to drill well bores. One example of a conventional drilling system for drilling boreholes in subsurface earth formations 100 is shown in FIG. 1. This drilling system includes a drilling rig 101 used to turn a drill string 103 which extends downward into a well bore 105. Connected to the end of the drill string 103 is a fixed cutter drill bit 109.

As shown in FIG. 2, a fixed cutter drill bit 111 typically includes a bit body 113 having an externally threaded connection at one end 115, and a plurality of blades 117 extending from the other end of bit body 113 and forming the cutting surface of the bit 113. A plurality of cutters 119 are attached to each of the blades 117 and extend from the blades to cut through earth formations when the bit 111 is rotated during drilling. The cutters 119 deform the earth formation by scraping and shearing. The cutters 119 may be tungsten carbide inserts, polycrystalline diamond compacts, milled steel teeth, or any other cutting elements of materials hard and strong enough to deform or cut through the formation. Hardfacing (not shown) may also be applied to the cutters 119 and other portions of the bit 111 to reduce wear on the bit 111 and to increase the life of the bit 111.

Significant expense is involved in the design and manufacture of drill bits and in the drilling of well bores. Having accurate models for predicting and analyzing drilling characteristics of bits can greatly reduce the cost associated with manufacturing drill bits and designing drilling operations because these models can be used to more accurately predict the performance of bits prior to their manufacture and/or use for a particular drilling application. For these reasons, models have been developed and employed for the analysis and design of fixed cutter drill bits.

Two of the most widely used methods for modeling the performance of fixed cutter bits or designing fixed cutter drill bits are disclosed in Sandia Report No. SAN86-1745 by David A. Glowka, printed September 1987 and titled "Development of a Method for Predicting the Performance and Wear of PDC drill Bits" and U.S. Pat. No. 4,815,342 to Bret et al. and titled "Method for Modeling and Building Drill Bits," and U.S. Pat. Nos. 5,010789, 5,042,596, and 5,131,478, which are all incorporated herein by reference. While these models have been useful in that they provide a means for analyzing the forces acting on the bit, their accuracy as a reflection of drilling might be improved because these models rely on generalized theoretical approximations (typically some equations) of cutter and formation interaction. A good representation of the actual interactions between a particular drill bit and the particular formation to be drilled is useful for accurate modeling. The accuracy and applicability of assumptions made for all drill bits, all cutters, and all earth formations can affect the accuracy of the prediction of the response of an actual drill bit drilling in an earth formation.

In one popular model for drill bit design, it is assumed that the centerline of the drill bit remains aligned with the centerline of the bore hole in which the drill bit is drilling. This type of centerline constrained model might be referred to as a "static model," even though the model calculates incremental dynamic rotation. The term static as applied to this type of modeling means not varying centerline alignment. In such prior modeling and fixed cutter drill bit design, there was little focus on the use of side rake angles of the cutters to improve performance of the drill bit. The focus was on the rate of penetration obtained and thus the cutter layout, position, and back rake angle were the parameters of predominate interest to improve cutting performance.

Fixed cutter drill bits are desired that have side rake angles and distributions of side rake angles that provide improved performance and stability. A method is desired for modeling the overall cutting action and drilling performance of a fixed cutter bit that takes into consideration and uses side rake angles and/or side rake angle distribution of cutters along blades of fixed cutter drill bits to improve and to optimize drill bit performance not only for rate of penetration but also for dynamic stability so that a desirable rate of penetration can be maintained during drilling.

BRIEF SUMMARY OF THE INVENTION

The invention relates to methods for modeling the performance of fixed cutter bit drilling earth formations. The invention also relates to methods for designing fixed cutter drill bits and methods for optimizing drilling parameters for the drilling performance of a fixed cutter bit. In one embodiment, the invention relates to modifying a side rake angle distribution for cutters on the drill bit to improve and/or to optimize performance of a fixed cutter drill bit that is modeled.

According to one aspect of one or more embodiments of the present invention, a method for modeling the dynamic performance of a fixed cutter PDC drill bit with the design optimized using a dynamic centerline analysis to provide a fixed cutter drill bit with improved performance including improved stability during drilling in earth formations. It has been discovered by the inventors using a dynamic centerline analysis and model, that modifications of the side rake angle of cutters and particularly the distribution of side rake angles along selected regions of the drill bit can improve the stability of the drill bit during drilling.

In other aspects of the invention, the modeling method can includes selecting a drill bit as a starting model to be simulated, selecting an earth formation to be represented as drilled, and simulating the bit drilling the earth formation. The simulation according to these aspects of the invention includes numerically rotating the bit calculating bit interaction with the earth formation during the rotating, and determining the resultant imbalance forces and predicting the stability of the drill bit.

In other aspects, the invention also provides a method for dynamically modeling a drill bit during simulated drilling in an earth formation. "Dynamically modeling" as used in this disclosure means modeling a drill string without an assumed constraint that the centerline of the drill bit is aligned with the centerline of the hole bored into the earth formation. Thus, if the drill bit wobbles or gyrates at the end of a drill string during drilling, the dynamic model accounts for the increased depth of cut for certain cutters and the decreased depth of cut for other cutters. The centerline of the drill bit for dynamically modeling a drill bit is not arbitrarily constrained to align with the centerline of the bore hole. For improved accuracy, the centerline of the drill bit is constrained by appropriately modeled physical and dynamic features of the drill string components, including the number of components, as size, length, strength, modulus of elasticity of each component and of the connectors between components, contact of the components with the bore hole, impact forces, friction forces, and/or other features that may be associated with a given drill string configuration. Empirical data for a drill bit and/or for a given earth formation can also be used to modify calculation coefficients to facilitate the accuracy of the calculations.

It has been discovered by the inventors that performance of a drill bit design can be predicted in some instances by modeling a drill bit drilling in an earth formation based upon a constrained centerline analysis. In cases where less than optimum performance is predicted, the performance can be improved by modifying the side rake angles and/or the side rake angle distribution.

In other aspects, the invention also provides a method for modeling a selected drill bit in a selected earth formation using static modeling (defined as modeling assuming that the centerline of the drill bit is aligned with the centerline of the hole bored into the earth formation) for purposes of determining wear predictions for the cutters of the drill bit, modifying the drill bit model according to the static wear model and dynamically modeling the drill bit with the static wear model characteristics substituted into the dynamic model calculations.

It has been discovered by the inventors that stability and performance of a drill bit design can be predicted by dynamically modeling a centerline trajectory of the drill bit during drilling. For one example only, a small diameter trajectory pattern is an indication of drill bit stability while drilling. Other trajectory patterns can also provide indications of drill bit stability in particular situations. It has been discovered by the inventors that in cases where instability is predicted, the stability can be improved by modifying the side rake angle distribution of cutters to adjust the centerline trajectory pattern to one that has a smaller diameter variation or that otherwise indicates drilling stability.

It has further been discovered that stability of a drill bit can be predicted using a dynamic centerline model to calculate a Beta angle between radial and circumferential vector components of imbalanced forces acting at the center of the face of the drill bit during drilling. Modifications to the design are made, and particularly, according to one embodiment of the invention, modifications to the side rake angle distribution are made, to decrease the magnitude of the total resultant imbalance forces and to increase the proportion of drilling time that the Beta angle is at or near $\beta=180°$.

It has further been discovered that the predicted bottom hole drilling pattern can be smoothed, the diameter of the trajectory of the centerline can be reduced or minimized, and/or the portion of the time that a dynamically modeled Beta angle is at or near to 180 degrees can by increased, and thus the stability of the drill bit drilling in an earth formation can be improved and/or optimized by modifying the side rake angle distribution of cutters along regions of the drill bit.

It has further been found useful to modify the distribution of side rake angles of cutters along the cone region of the drill bit.

It has further been found useful to modify the side rake angle distribution of cutters along the nose region of the drill bit.

According to one alternative embodiment of the invention, a method includes generating a visual representation of one or more of the bottom hole pattern, the total imbalance forces on the drill bit, the side rake induced imbalance forces on the drill bit, the centerline trajectory, and the Beta angle between radial and circumferential components of total imbalance forces for a fixed cutter drill bit dynamically drilling in an earth formation and designing a fixed cutter drill bit by modifying the side rake angle of cutters positioned along a portion of the drill bit.

In another aspect, the invention provides a method for optimizing side rake angle distribution for cutters of a fixed cutter drill bit based upon a representation of the drill bit showing the bottom hole pattern, the total imbalance forces on the drill bit, the side rake induced imbalance forces on the drill bit, the centerline trajectory, and/or the Beta angle ($\beta$) for the drill bit during dynamically simulated drilling rotation in an earth formation and modifying the drill bit design to smooth the predicted bottom hole pattern, to reduce the total imbalance forces on the drill bit, to reduce the side rake induced imbalance forces on the drill bit, to improve the centerline trajectory, and/or to increase the percentage of time during dynamic drilling that the Beta angle is at or near to $\beta=180°$, so that the stability of the drill bit design is improved or optimized.

In other aspects, the invention also provides a method for modeling a selected drill bit in a selected earth formation, simulating the drill bit drilling in an earth formation, determining the stability of the drill bit by determining a bottom hole pattern, determining the total imbalance forces on the drill bit, determining the side rake induced imbalance forces on the drill bit, determining the centerline trajectory, and/or determining the Beta angle between the radial and the circumferential components of imbalance forces over a selected period of the simulated drilling, displaying a graphical depiction of the bottom hole pattern, the total imbalance forces on the drill bit, the side rake induced imbalance forces on the drill bit, the centerline trajectory, and/or the Beta angle over a period of time during drilling, modifying the side rake angle distribution of cutters along a portion of the drill bit to improve predicted stability by improving the bottom hole pattern, the total imbalance forces on the drill bit, the side rake induced imbalance forces on the drill bit, the trajectory, and or the Beta angle and repeating the simulating, determining, displaying, and modifying at least until the predicted performance of he drill bit is improved and/or optimized.

In other aspects, the invention also provides a fixed cutter drill bit designed by the method of the invention.

Other aspects and advantages of the invention will be apparent from the following description and the appended claims.

BRIEF DESCRIPTION OF THE DRAWINGS

FIG. 10A-E shows a drill bit cutter in relation to a formation for purposes of modeling the cutter.

DETAILED DESCRIPTION OF PREFERRED EMBODIMENTS

Figure 1:
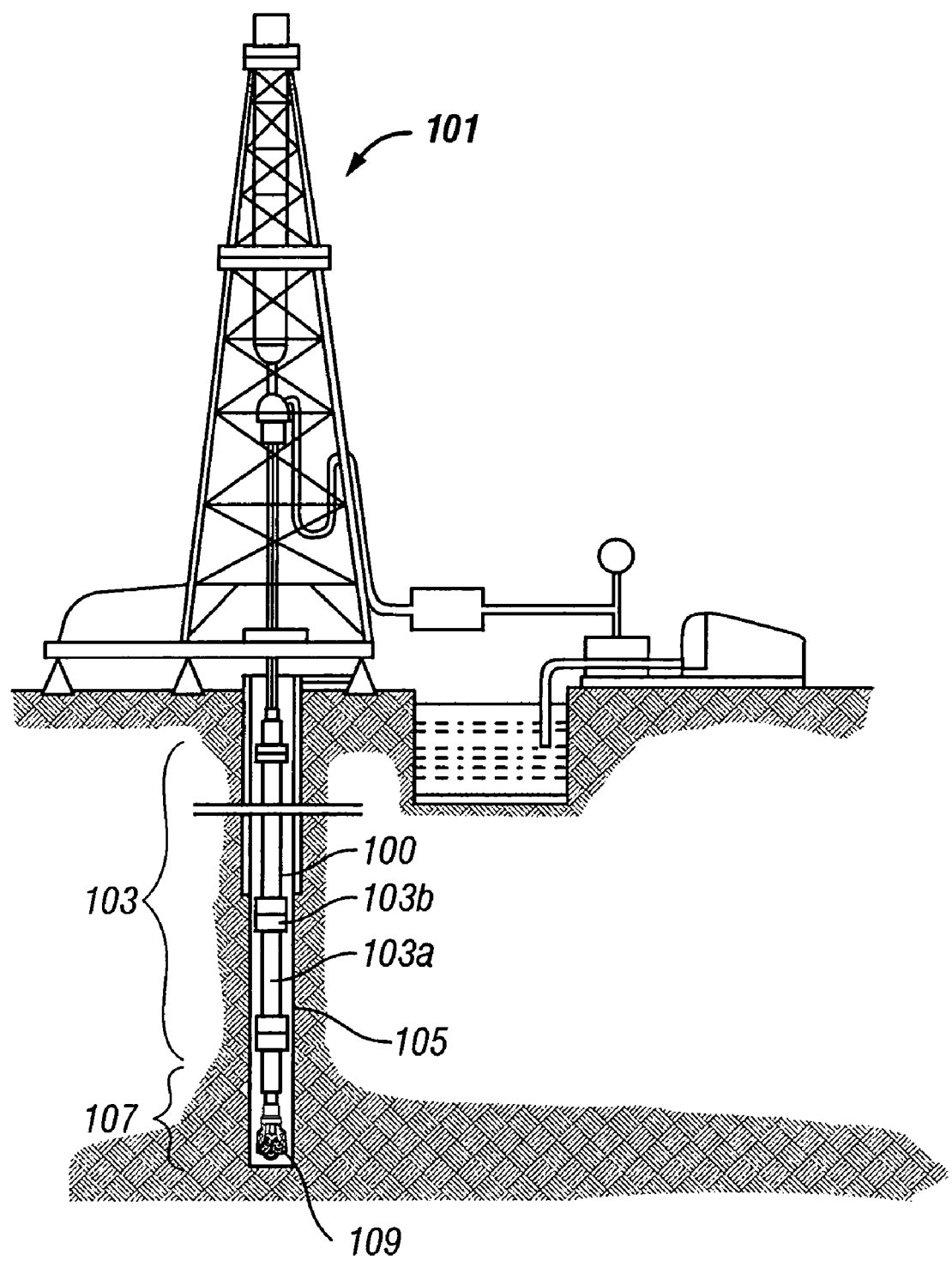
FIG. 1 shows a schematic diagram of a conventional drilling system for drilling earth formations.
Figure 2:
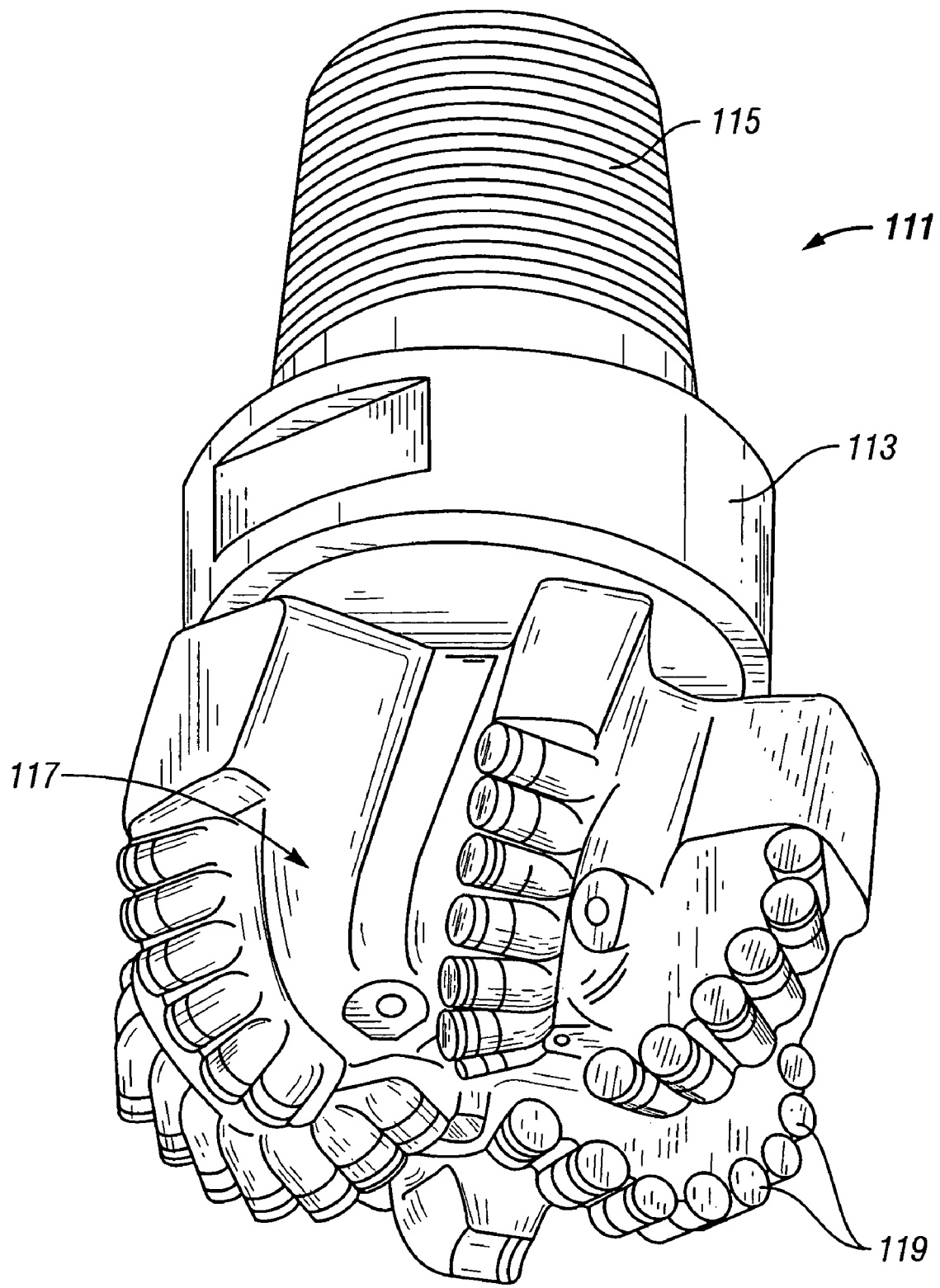
FIG. 2 shows a perspective view of a prior art fixed-cutter bit.

The present invention provides methods for predicting a performance response of a drilling tool assembly drilling an earth formation, methods for optimizing a drilling tool assembly design, methods for optimizing drilling operation parameters, and methods for optimizing drilling tool assembly performance.

The present invention provides methods for modeling the performance of a fixed cutter drill bit drilling in an earth formation. In one aspect, a method takes into account actual interactions between cutters and earth formation during drilling. Methods in accordance with one or more embodiments of the invention may be used to design a fixed cutter drill bit, to optimize the performance of the drill bit, to optimize the dynamic response of the drill bit in connection with an entire drill string during drilling, or to generate visual displays representing performance characteristics of the drill bit drilling in an earth formation. In one particular embodiment, the invention usefully provides a representation of radial and circumferential imbalance force components and a Beta ($\beta$) angle between such components during simulated drilling.

In accordance with one aspect of the present invention, one or more embodiments of a method for modeling the dynamic performance of a fixed cutter drill bit drilling in an earth formation includes selecting a drill bit design and an earth formation to be represented as drilled, wherein a geometric model of the drill bit a geometric model of a drill string on which the drill bit is to be supported for drilling, and a geometric model of the earth formation to be represented as drilled are generated. The method also includes incrementally rotating the drill string with the drill bit to simulate drilling in the formation and calculating the interaction between the cutters on the drill bit and the earth formation during the incremental rotation. The method further includes determining the forces on the cutters of the drill bit during the incremental rotation, determining the interaction between the drill bit and the earth formation, and determining resultant radial and circumferential components of imbalance forces acting on the drill bit and the Beta angle between such imbalance force components during a period of full or partial rotation of the drill bit in the formation. By graphically displaying at least a representation of the Beta angle for a drill bit during drilling, a design of a drill bit can be obtained that provides useful performance characteristics.

Methods for determining the dynamic response of a drilling tool assembly to drilling interaction with an earth formation were initially disclosed in U.S. Pat. No. 6,785,641 by Huang, which is assigned to the assignee of the present invention and incorporated herein by reference in its entirety. New methods developed for modeling fixed cutter drill bits are disclosed in U.S. Patent Application No. 60/485,642 by Huang, filed on Jul. 9, 2003, titled "Method for Modeling, Designing, and Optimizing Fixed Cutter Bits," assigned to the assignee of the present application and incorporated herein by reference in its entirety. Methods disclosed in the '642 application may advantageously allow for a more accurate prediction of the actual performance of a fixed cutter bit in drilling selected formations by incorporating the use of actual cutting element/earth formation interact data or related empirical formulas to accurately predict the interaction between cutting elements and earth formations during drilling. Embodiments of the invention disclosed herein relate to the use of methods disclosed in the '641 patent combined with methods disclosed in the '642 application and other novel methods related to drilling tool assembly design.

FIG. 1 shows one example of a drilling tool assembly that may be designed, modeled, or optimized in accordance with one or more embodiments of the invention. The drilling tool assembly includes a drill string 103 coupled to a bottom hole assembly (BHA) 107. The drill string 103 includes one or more joints of drill pipe. A drill string may further include additional components, such as tool joints, a kelly, kelly cocks, a kelly saver sub, blowout preventers, safety valves, and other components known in the art. The BHA 107 includes at least a drill bit. A BHA 107 may also include one or more drill collars, stabilizers, a downhole motor, MWD tools, LWD tools, jars, accelerators, push the bit directional drilling tools, pull the bit directional drilling tools, point stab tools, shock absorbers, bent subs, pup joints, reamers, valves, and other components.

While in practice, a BHA comprises a drill bit, in embodiments of the invention described below, the parameters of the drill bit, required for modeling interaction between the drill bit and the bottomhole surface, are generally considered separately from the BHA parameters. This separate consideration of the drill bit allows for interchangeable use of any drill bit model as determined by the system designer.

To simulate the dynamic response of a drilling tool assembly, such as the one shown in FIG. 1, components of the drilling tool assembly need to be defined. For example, the drill string may be defined in terms of geometric and material parameters, such as the total length, the total weight, inside diameter (ID), outside diameter (OD), and material properties of each of the various components that make up the drill string. Material properties of the drill string components may include the strength and elasticity of the component material. Each component of the drill string may be individually defined or various parts may be defined in the aggregate. For example, a drill string comprising a plurality of substantially identical joints of drill pipe may be defined by the number of drill pipe joints of the drill string, and the ID, OD, length, and material properties for one drill pipe joint. Similarly, the BHA may be defined in terms of geometrical and material parameters of each component of the BHA, such as the ID, OD, length, location, and material properties of each component.

The geometry and material properties of the drill bit also need to be defined as required for the method selected for simulating drill bit interaction with earth formation at the bottom surface of the wellbore. Examples of methods for modeling drill bits are known in the art, see for example U.S. Pat. No. 6,516,293 to Huang, U.S. Pat. No. 6,213,225 to Chen for roller cone bits, and U.S. Pat. No. 4,815,342; U.S. Pat. No. 5,010,789; U.S. Pat. No. 5,042,596; and U.S. Pat. No. 5,131,479, each to Brett et al. for fixed cutter bits, which are each hereby incorporated by reference in their entireties. Other methods for modeling, designing, and optimizing fixed cutter drill bits are also disclosed in U.S. Patent Application No. 60/485,642, previously incorporated herein by reference.

To simulate the dynamic response of a drilling tool assembly drilling through an earth formation, the wellbore trajectory in which the drilling tool assembly is to be confined should also be defined along with its initial bottomhole geometry. The wellbore trajectory may be straight, curved, or a combination of straight and curved sections at various angular orientations. The wellbore trajectory may be defined in terms of parameters for each of a number of segments of the trajectory. For example, a wellbore defined as comprising N segments may be defined by the length, diameter, inclination angle, and azimuth direction of each segment along with an index number indicating the order of the segments. The material or material properties of the formation defining the wellbore surfaces can also be defined.

Additionally, drilling operation parameters, such as the speed at which the drilling tool assembly is rotated and the rate of penetration or the weight on bit (which may be determined from the weight of the drilling tool assembly suspended at the hook) may also be defined. Once the drilling system parameters are defined, they can be used along with selected interaction models to simulate the dynamic response of the drilling tool assembly drilling an earth formation as discussed below.

In connection with dynamically modeling a drill bit, it has been found that the dynamic model can often benefit from input obtained from static modeling.

Method for Simulating

In one aspect, the invention provides a method for determining the dynamic response of a drilling tool assembly during a drilling operation. Advantageously, in one or more embodiments, the method takes into account interactions between an entire drilling tool assembly and the drilling environment. The interactions may include the interaction between the drill bit at the end of the drilling tool assembly and the formation at the bottom of the wellbore. The interactions between the drilling tool assembly and the drilling environment may also include the interactions between the drilling tool assembly and the side (or wall) of the wellbore. Further, interactions between the drilling tool assembly and drilling environment may include the viscous damping effects of the drilling fluid on the dynamic behavior of the drilling tool assembly. In addition, the drilling fluid also provides buoyancy to the various components in the drilling tool assembly, reducing the effective masses of these components.

Figure 3:
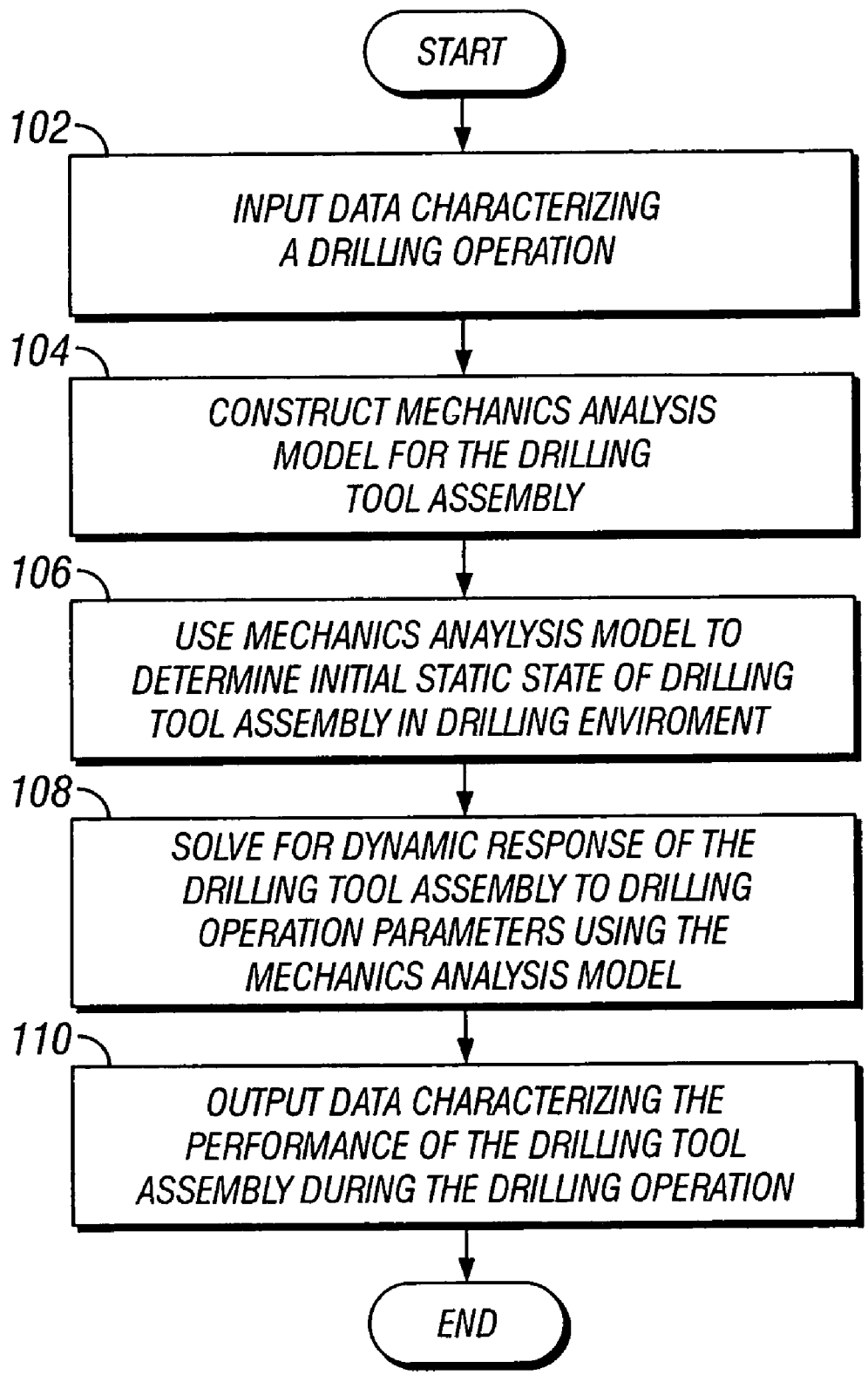
FIG. 3 shows a flow chart of a method for determining the dynamic response of a drilling tool assembly drilling through an earth formation.

A flow chart for one embodiment of a method in accordance with an aspect of the present invention is shown in FIG. 3. The method includes inputting data characterizing a drilling operation to be simulated 102. The input data may include drilling tool assembly parameters, drilling environment parameters, and drilling operation parameters. The method also includes constructing a mechanics analysis model for the drilling tool assembly 104. The mechanics analysis model can be constructed using finite element analysis with drilling tool assembly parameters and Newton's law of motion. The method further includes determining an initial static state of the drilling tool assembly in the drilling environment 106 using the mechanics analysis model along with drilling environment parameters. Then, based on the initial static state and operational parameters provided as input, the dynamic response of the drilling tool assembly in the drilling environment is incrementally calculated 108.

Figure 4:
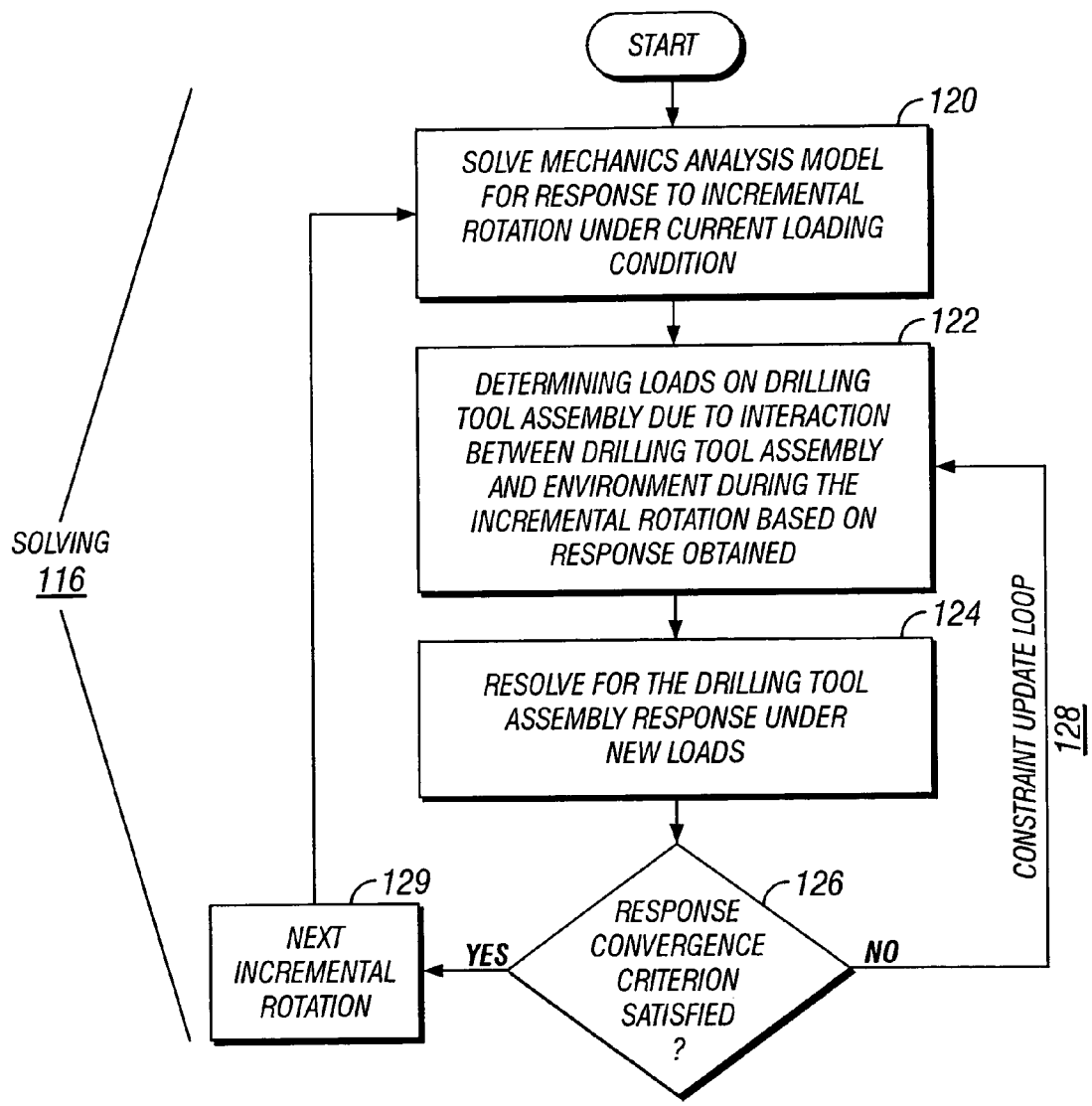
FIG. 4 shows a flow chart of one embodiment of the method predicting the dynamic response of a drilling tool assembly drilling through an earth formation in accordance with the method shown in FIG. 3.

Results obtained from calculation of the dynamic response of the drilling tool assembly are then provided as output data. The output data may be input into a graphics generator and used to graphically generate visual representations characterizing aspects of the performance of the drilling tool assembly in drilling the earth formation 110. One of ordinary skill in the art would appreciate from the present disclosure that the order of these steps is for illustration only and other permutations are possible without departing from the scope of the invention. For example, the data needed to characterize the drilling operation may be provided after the construction of the mechanics analysis model In one example, illustrated in FIG. 4, solving for the dynamic response 116 may not only include solving the mechanics analysis model for the dynamic response to an incremental rotation 120, but may also include determining, from the response obtained, loads (e.g., drilling environment interaction forces, bending moments, etc.) on the drilling tool assembly due to interactions between the drilling tool assembly and the drilling environment during the incremental rotation 122, and resolving for the response of the drilling tool assembly to the incremental rotation 124 under the newly determined loads. The determining and resolving may be repeated in a constraint update loop 128 until a response convergence criterion 126 is satisfied.

For example, assuming the simulation is performed under a constant WOB, with each incremental rotation, the drill bit is rotated by a small angle and moved downward (axially) by a small distance. During this movement, the interference between the drill bit and the bottom of the hole generates counter force acting against the drill bit (loads). If the load is more than the WOB, then the rotation or downward movement of the drill bit is too much. The parameters (constraints) should be adjusted (e.g., reduced the downward movement distance) and the incremental rotation is again performed. On the other hand, if the load after the incremental rotation is less than the WOB, then the incremental rotation should be performed with a larger angular or axial movement.

Once a convergence criterion is satisfied, the entire incremental solving process 116 may be repeated for successive increments until an end condition for simulation is reached. These steps (incremental rotation, load calculation, comparison with a criterion, and adjustment of constraints) are repeated until the computed load from the incremental rotation is within a selected criterion (step 126). Once a convergence criterion is satisfied, the entire incremental solving process 116 may be repeated for successive increments 129 until an end condition for simulation is reached.

During the simulation, the constraint forces initially used for each new incremental calculation step may be the constraint forces determined during the last incremental rotation. In the simulation, incremental rotation and calculations are repeated for a select number of successive incremental rotations until an end condition for simulation is reached.

Figures 1, 5A:
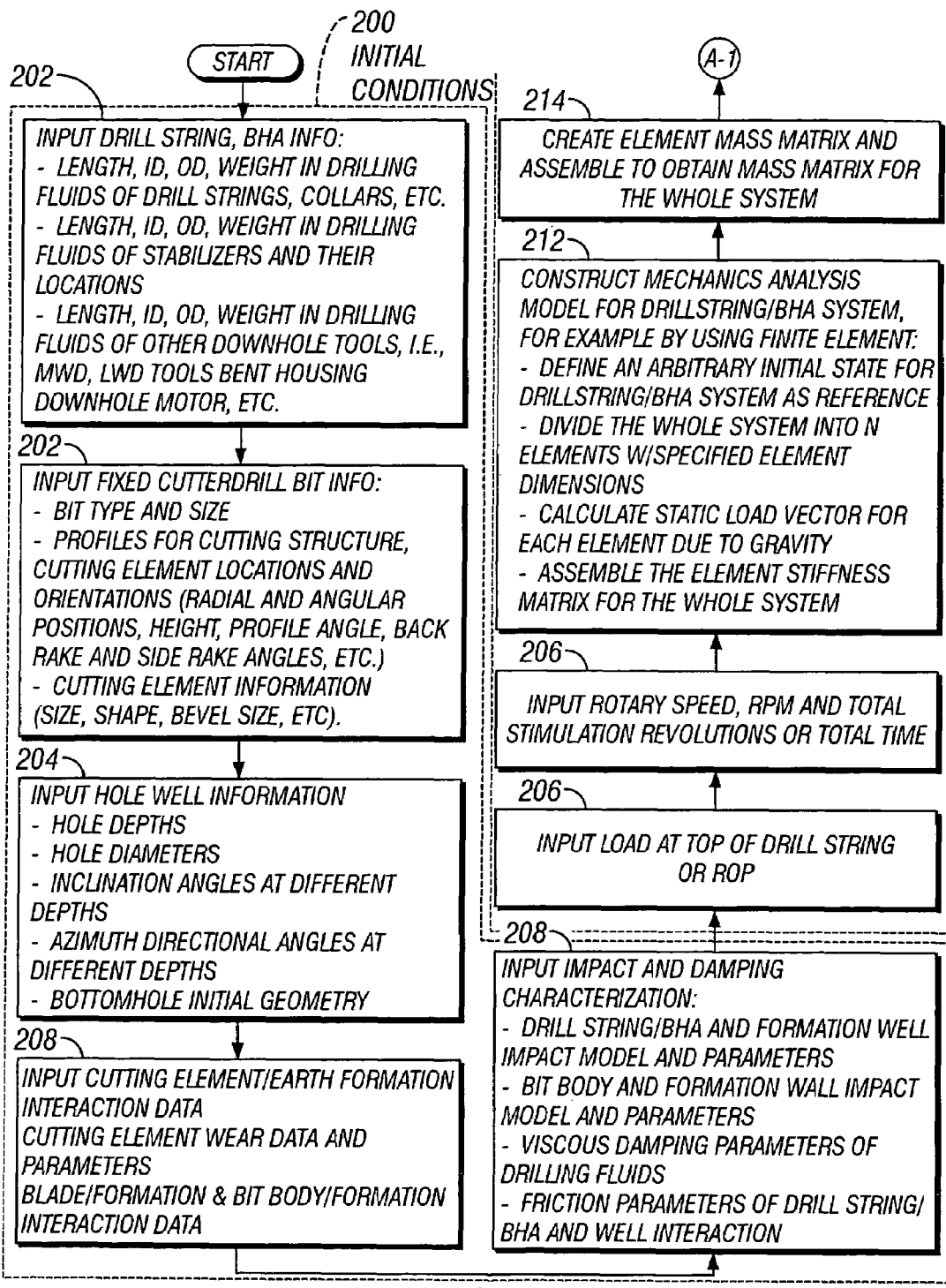
FIGS. 5A-C show a flowchart of a method for modeling the performance of a fixed cutter drill bit drilling in an earth formation.
Figures 2, 5A:
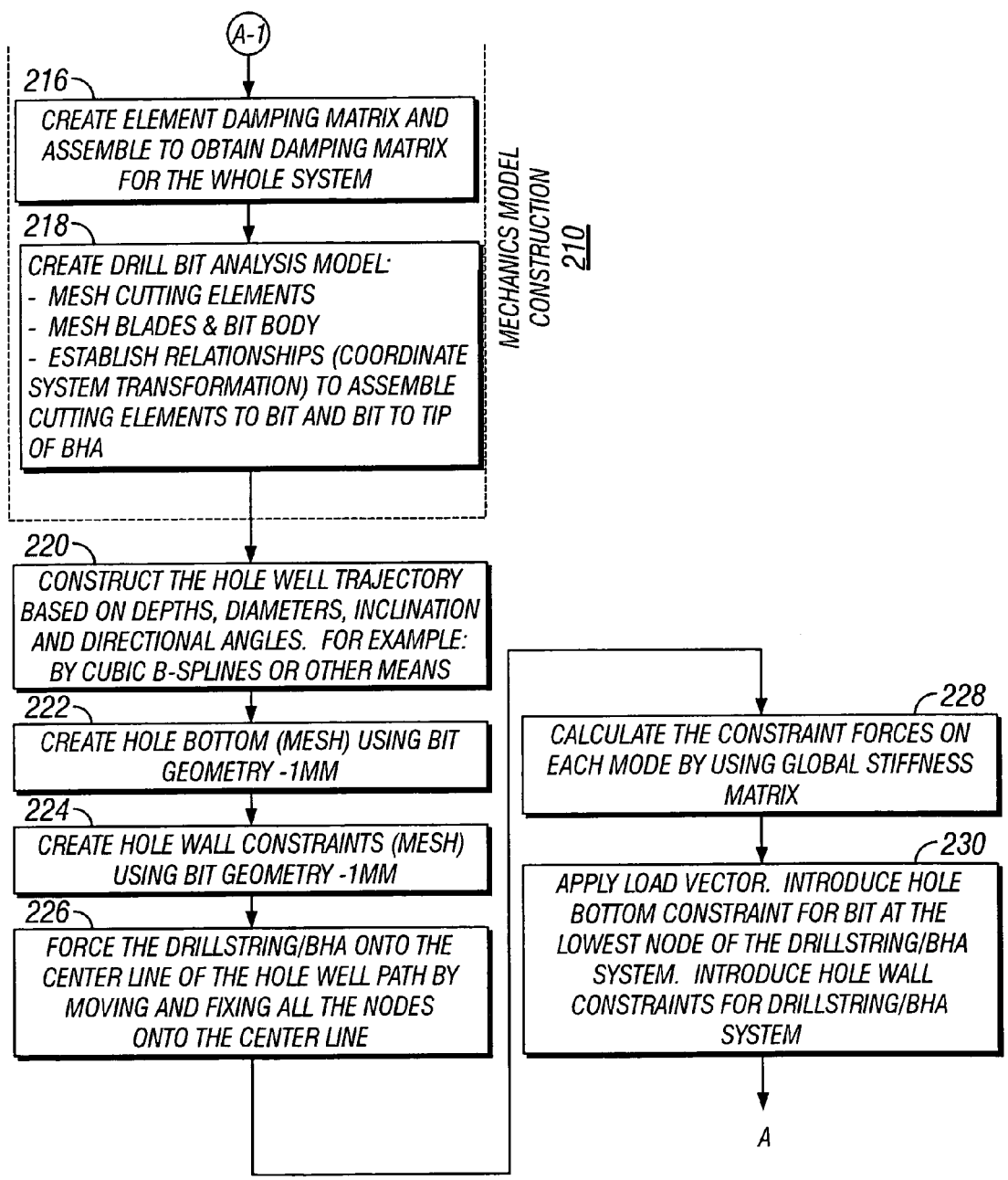
Figures 1, 5B:
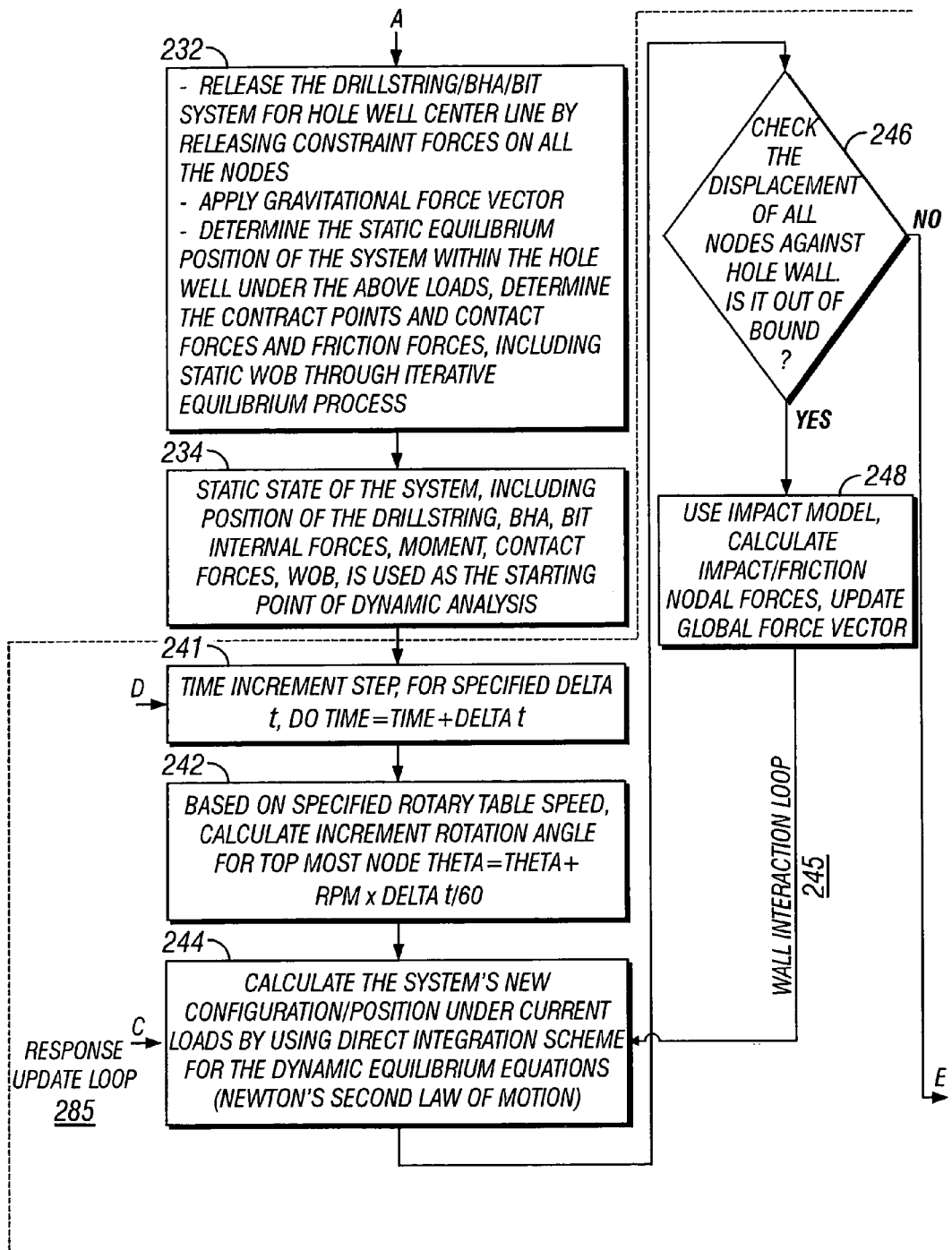
Figures 2, 5B:
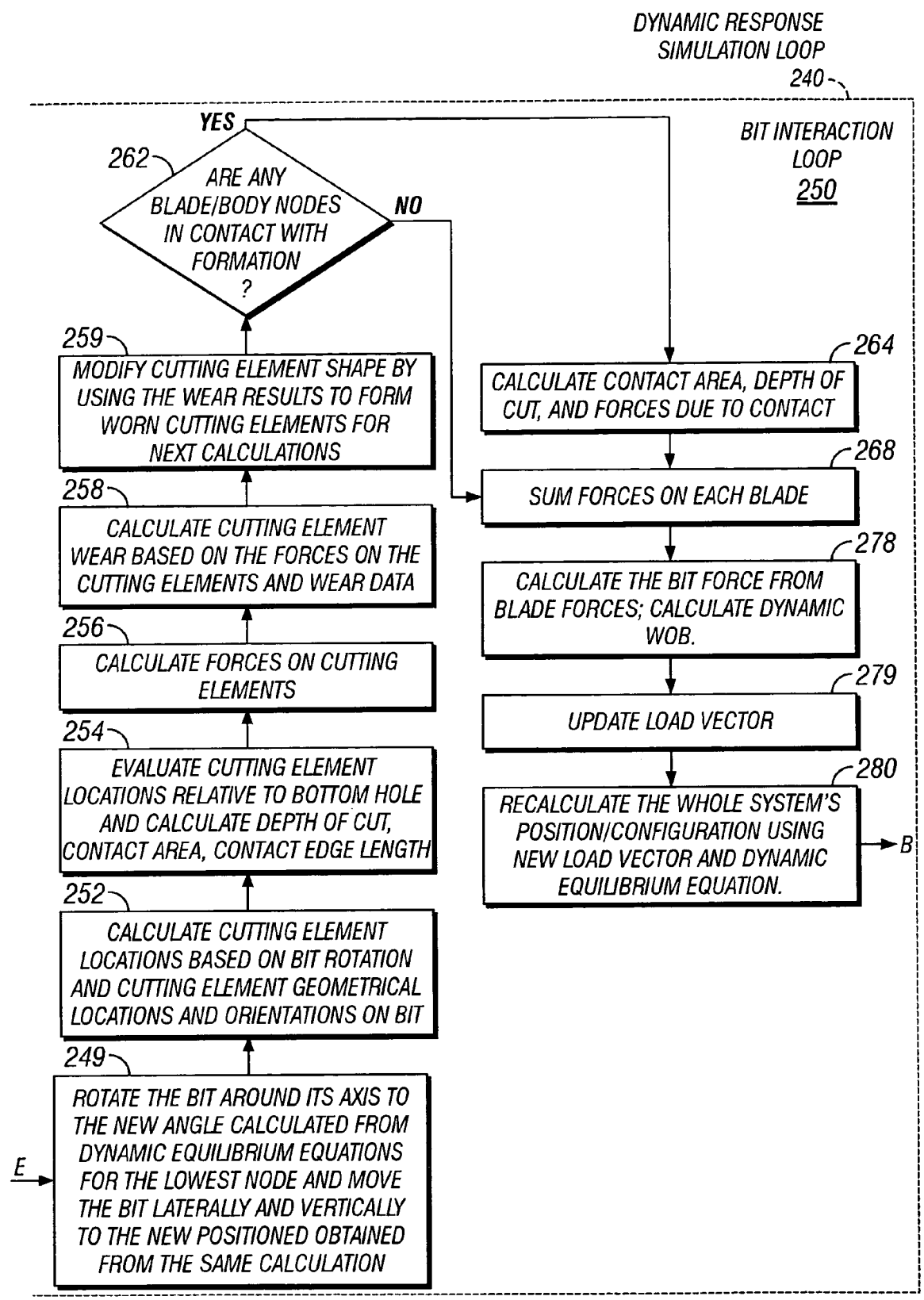

As shown in FIGS. 5A-B, the parameters provided as input 200 include drilling tool assembly design parameters 202, initial drilling environment parameters 204 and drilling operation parameters 206. Drilling tool assembly/drilling environment interaction parameters are also provided or selected as input 208.

Drilling tool assembly design parameters 202 include drill string design parameters and BHA design parameters. The drill string can be defined as a plurality of segments of drill pipe with tool joints and the BHA may be defined as including a number of drill collars, stabilizers, and other downhole components, such as a bent housing motor, MWD tool, LWD tool, thruster, point the bit directional drilling tool, push the bit directional drilling tool, shock absorber, point stab, and a drill bit. One or more of these items may be selected from a library list of tools and used in the design of a drilling tool assembly model, as shown in FIG. 5A. Also, while the drill bit is generally considered part of the BHA, the drill bit design parameters may be defined in a bit parameter input screen and used separately in a detailed modeling of bit interaction with the earth formation that can be coupled to the drilling tool assembly design model and described below. Considering the detailed interaction of the bit with the earth formation separately in a bit calculation subroutine coupled to the drilling tool assembly model advantageously allows for the interchangeable use of any type of drill bit which can be defined and modeled using any desired drill bit analysis model. The calculated response of the bit interacting with the formation is coupled to the drilling tool assembly design model so that the effect of the selected drill bit interacting with the formation during drilling can be directly determined for the selected drilling tool assembly.

As previously discussed above, drill string design parameters may include the length, inside diameter (ID), outside diameter (OD), weight (or density), and other material properties of the drill string in the aggregate. Alternatively, in one or more embodiments, drill string design parameters may include the properties of each component of the drill string and the number of components and location of each component of the drill string. In the example shown in FIG. 8, the length, ID, OD, weight, and material properties of a segment of drill pipe may be provided as input along with the number of segments of drill pipe that make up the drill string. Material properties of the drill string provided as input may also include the type of material and/or the strength, elasticity and density of the material. The weight of the drill string, or individual segment of the drill string may be provided as its "air" weight or as "weight in drilling fluids" (the weight of the component when submerged in the selected drilling fluid).

In accordance with one or more embodiments of the invention, the drill string need not be represented in true relative dimensions in the simulation. Instead, the drill string may be represented as sections (nodes) of different lengths. For example, the nodes closer to the BHA and drill bit may be represented as shorter sections (closer nodes) in order to better define the dynamics of the drill string close to the drill bit. On the other hand, drill string sections farther away from the BHA may be represented as longer sections (far apart nodes) in the simulation to save the computer resources.

BHA design parameters include, for example, the bent angle and orientation of the motor, the length, equivalent inside diameter (ID), outside diameter (OD), weight (or density), and other material properties of each of the various components of the BHA. In the example shown, the drill collars, stabilizers, and other downhole components are defined by their lengths, equivalent IDs, ODs, material properties, and eccentricity of the various parts, their weight in drilling fluids, and their position in the drilling tool assembly recorded.

Drill bit design parameters are also provided as input and used to construct a model for the selected drill bit. Drill bit design parameters include, for example, the bit type such as a fixed-cutter drill bit and geometric parameters of the bit. Geometric parameters of the bit may include the bit size (e.g., diameter), number of cutting elements, and the location, shape, size, and orientation of the cutting elements. In the case of a fixed cutter bit, the drill bit design parameters may further include the size of the bit, parameters defining the profile and location of each of the blades on the cutting face of the drill bit, the number and location of cutting elements on each blade, the back rake and side rake angles for each cutting element. In general, drill bit, cutting element, and cutting structure geometry may be converted to coordinates and provided as input to the simulation program. In one or more embodiments, the method used for obtaining bit design parameters involves uploading of 3-dimensional CAD solid or surface model of the drill bit to facilitate the geometric input. Drill bit design parameters may further include material properties of the various components that make up the drill bit, such as strength, hardness, and thickness of various materials forming the cutting elements, blades, and bit body.

In one or more embodiments, drilling environment parameters 204 include one or more parameters characterizing aspects of the wellbore. Wellbore parameters may include wellbore trajectory parameters and wellbore formation parameters. Wellbore trajectory parameters may include any parameter used in characterizing a wellbore trajectory, such as an initial wellbore depth (or length), diameter, inclination angle, and azimuth direction of the trajectory or a segment of the trajectory. In the typical case of a wellbore comprising different segments having different diameters or directional orientations, wellbore trajectory parameters may include depths, diameters, inclination angles, and azimuth directions for each of the various segments. Wellbore trajectory information may also include an indication of the curvature of each segment, and the order or arrangement of the segments in wellbore. Wellbore formation parameters may also include the type of formation being drilled and/or material properties of the formation such as the formation compressive strength, hardness, plasticity, and elastic modulus. An initial bottom surface of the wellbore may also be provided or selected as input. The bottomhole geometry may be defined as flat or contour and provided as wellbore input. Alternatively, the initial bottom surface geometry may be generated or approximated based on the selected bit geometry. For example, the initial bottomhole geometry may be selected from a "library" (i.e., database) containing stored bottomhole geometries resulting from the use of various drill bits.

In one or more embodiments, drilling operation parameters 206 include the rotary speed (RPM) at which the drilling tool assembly is rotated at the surface and/or a downhole motor speed if a downhole motor is used. The drilling operation parameters also include a weight on bit (WOB) parameter, such as hook load, or a rate of penetration (ROP). Other drilling operation parameters 206 may include drilling fluid parameters, such as the viscosity and density of the drilling fluid, rotary torque and drilling fluid flow rate. The drilling operating parameters 206 may also include the number of bit revolutions to be simulated or the drilling time to be simulated as simulation ending conditions to control the stopping point of simulation. However, such parameters are not necessary for calculation required in the simulation. In other embodiments, other end conditions may be provided, such as a total drilling depth to be simulated or operator command.

In one or more embodiments, input is also provided to determine the drilling tool assembly/drilling environment interaction models 208 to be used for the simulation. As discussed in U.S. Pat. No. 6,516,293 and U.S. Provisional Application No. 60/485,642, cutting element/earth formation interaction models may include empirical models or numerical data useful in determining forces acting on the cutting elements based on calculated displacements, such as the relationship between a cutting force acting on a cutting element, the corresponding scraping distance of the cutting element through the earth formation, and the relationship between the normal force acting on a cutting element and the corresponding depth of penetration of the cutting element in the earth formation. Cutting element/earth formation interaction models may also include wear models for predicting cutting element wear resulting from prolonged contact with the earth formation, cutting structure/formation interaction models and bit body/formation interaction models for determining forces on the cutting structure and bit body when they are determined to interact with earth formation during drilling. In one or more embodiments, coefficients of an interaction model may be adjustable by a user to adapt a generic model to more closely fit characteristics of interaction as seen during drilling in the field. For example, coefficients of the wear model may be adjustable to allow for the wear model to be adjusted by a designer to calculate cutting element wear more consistent with that found on dull bits run under similar conditions.

Drilling tool assembly/earth formation impact, friction, and damping models or parameters can be used to characterize impact and friction on the drilling tool assembly due to contact of the drilling tool assembly with the wall of the wellbore and due to viscous damping effects of the drilling fluid. These models may include drill string-BHA/formation impact models, bit body/formation impact models, drill string-BHA/formation friction models, and drilling fluid viscous damping models. One skilled in the art will appreciate that impact, friction and damping models may be obtained through laboratory experimentation. Alternatively, these models may also be derived based on mechanical properties of the formation and the drilling tool assembly, or may be obtained from literature. Prior art methods for determining impact and friction models are shown, for example, in papers such as the one by Yu Wang and Matthew Mason, entitled "Two-Dimensional Rigid-Body Collisions with Friction," Journal of Applied Mechanics, September 1992, Vol. 59, pp. 635-642.

Input data may be provided as input to a simulation program by way of a user interface which includes an input device coupled to a storage means, a database and a visual display, wherein a user can select which parameters are to be defined, such as operation parameters, drill string parameters, well parameters, and etc. Then, once the type of parameters to be defined is selected, the user selected the component or value desired to be changed and enter or select a changed value for use in performing the simulation.

In one or more embodiments, the user may select to change simulation parameters, such as the type of simulation mode desired (such as from ROP control to WOB control, etc.), or various calculation parameters, such as impact model modes (force, stiffness, etc.), bending-torsion model modes (coupled, decoupled), damping coefficients model, calculation incremental step size, etc. The user may also select to define and modify drilling tool assembly parameters. The user may construct a drilling tool assembly to be simulated by selecting the component to be included in the drilling tool assembly from a database of components and by adjusting the parameters for each of the components as needed to create a drilling tool assembly model that very closely represents the actual drilling tool assembly being considered for use.

In one embodiment, the specific parameters for each component selected from the database may be adjustable, for example, by selecting a component added to the drilling tool assembly and changing the geometric or material property values defined for the component in a menu screen so that the resulting component selected more closely matches with the actual component included in the actual drilling tool assembly. For example, in one embodiment, a stabilizer in the drilling tool assembly may be selected and any one of the overall length, outside body diameter, inside body diameter, weight, blade length, blade OD, blade width, number of blades, thickness of blades, eccentricity offset, and eccentricity angle may be provided as well as values relating to the material properties (e.g., Young's modulus, Poisson's ratio, etc.) of the tool may be specifically defined to more accurately represent the stabilizer to be used in the drilling tool assembly being modeled. Similar features may also be provided for each of the drill collars, drill pipe, cross over subs, etc., included in the drilling tool assembly. In the case of drill pipe, and similar components, additional features defined may include the length and outside diameter of each tool connection joint, so that the effect of the actual tool joints on stiffness and mass throughout the system can be taken into account during calculations to provide a more accurate prediction of the dynamic response of the drilling tool assembly being modeled.

The user may also select and define the well by selecting well survey data and wellbore data. For example, for each segment a user may define the measured depth, inclination angle, and azimuth angle of each segment of the wellbore, and the diameter, well stiffness, coefficient of restitution, axial and transverse damping coefficients of friction, axial and transverse scraping coefficient of friction, and mud density.

Constructing the Model

As shown in FIGS. 5A-B, once input data 200 are selected, determined, or otherwise provided, a two-part mechanics analysis model of the drilling tool assembly may be constructed 210 and used to determine the initial static state 212 of the drilling tool assembly in the wellbore. The first part of the mechanics analysis model construction 210 takes into consideration the overall structure of the drilling tool assembly, with the drill bit being only generally represented. In this embodiment, a finite element method is used (generally described at 212), wherein an arbitrary initial state (such as hanging in the vertical mode free of bending stresses) is defined for the drilling tool assembly as a reference and the drilling tool assembly is divided into N elements of specified element dimensions (i.e., meshed). The static load vector for each element due to gravity is calculated. Then, element stiffness matrices are constructed based on the material properties, element length, and cross sectional geometrical properties of drilling tool assembly components provided as input for the entire drilling tool assembly (wherein the drill bit is generally represented by a single node). Similarly, element mass matrices are constructed by determining the mass of each element (based on material properties, etc.) for the entire drilling tool assembly 214. Additionally, element damping matrices can be constructed (based on experimental data, approximation, or other method) for the entire drilling tool assembly 216. Methods for dividing a system into finite elements and constructing corresponding stiffness, mass, and damping matrices are known in the art and thus are not explained in detail here. Examples of such methods are shown, for example, in "Finite Elements for Analysis and Design" by J. E. Akin (Academic Press, 1994).

The second part of the mechanics analysis model 210 of the drilling tool assembly is a mechanics analysis model of the drill bit 218 which takes into account details of selected drill bit design. The drill bit mechanics analysis model 218 may be constructed by creating a mesh (or a surface model or a solid model) of the cutting elements and establishing a coordinate relationship (coordinate system transformation) between the cutting elements and the bit, and between the bit and the tip of the BHA. As previously noted, examples of methods for constructing mechanics analysis models for fixed cutter bits are disclosed in SPE Paper No. 15618 by T. M. Warren et al., entitled "Drag Bit Performance Modeling," U.S. Pat. No. 4,815,342, U.S. Pat. No. 5,010,789, U.S. Pat. No. 5,042,596, and U.S. Pat. No. 5,131,479 to Brett et al, and U.S. Provisional Application No. 60/485,642.

For each incremental rotation, the method may include calculating cutter wear based on forces on the cutters, the interference of the cutters with the formation, and a wear model and modifying cutter shapes based on the calculated cutter wear. These steps may be inserted into the method at the point indicated by the node labeled "A."

Further, those having ordinary skill will appreciate that the work done by the bit and/or individual cutters may be determined. Work is equal to force times distance, and because embodiments of the simulation provide information about the force acting on a cutter and the distance into the formation that a cutter penetrates, the work done by a cutter may be determined.

Other implementations of a method developed in accordance with this aspect of the invention may include a drilling model based on ROP control. Other implementations may include a drilling model based upon WOB control. Generally speaking the method includes selecting or otherwise inputting parameters for a dynamic simulation. Parameters provided as input include drilling parameters, bit design parameters, cutter/formation interaction data and cutter wear data, and bottomhole parameters for determining the initial bottomhole shape. The data and parameters provided as input for the simulation can be stored in an input library and retrieved as needed during simulation calculations.

Drilling parameters may include any parameters that can be used to characterize drilling. In the method shown, the drilling parameters provided as input include the rate of penetration (ROP) or the weight on bit (WOB) and the rotation speed of the drill bit (revolutions per minute, RPM). Those having ordinary skill in the art would recognize that other parameters (e.g., mud weight) may be included.

Bit design parameters may include any parameters that can be used to characterize a bit design. In the method shown, bit design parameters provided as input include the cutter locations and orientations (e.g., radial and angular positions, heights, profile angles, back rake angles, side rake angles, etc.) and the cutter sizes (e.g., diameter), shapes (i.e., geometry) and bevel size. Additional bit design parameters may include the bit profile, bit diameter, number of blades on bit, blade geometries, blade locations, junk slot areas, bit axial offset (from the axis of rotation), cutter material make-up (e.g., tungsten carbide substrate with hardfacing overlay of selected thickness), etc. Those skilled in the art will appreciate that cutter geometries and the bit geometry can be meshed, converted to coordinates and provided as numerical input. Preferred methods for obtaining bit design parameters for use in a simulation include the use of 3-dimensional CAD solid or surface models for a bit to facilitate geometric input.

Cutter/formation interaction data includes data obtained from experimental tests or numerically simulations of experimental tests which characterize the actual interactions between selected cutters and selected earth formations, as previously described in detail above. Wear data may be data generated using any wear model known in the art or may be data obtained from cutter/formation interaction tests that included an observation and recording of the wear of the cutters during the test. A wear model may comprise a mathematical model that can be used to calculate an amount of wear on the cutter surface based on forces on the cutter during drilling or experimental data which characterizes wear on a given cutter as it cuts through the selected earth formation. U.S. Pat. No. 6,619,411 issued to Singh et al. discloses methods for modeling wear of roller cone drill bits. This patent is assigned to the present assignee and is incorporated by reference in its entirety. Wear modeling for fixed cutter bits (e.g., PDC bits) will be described in a later section. Other patents related to wear simulation include U.S. Pat. Nos. 5,042,596, 5,010,789, 5,131,478, and 4,815,342. The disclosures of these patents are incorporated by reference in their entireties.

Bottomhole parameters used to determine the bottomhole shape may include any information or data that can be used to characterize the initial geometry of the bottomhole surface of the well bore. The initial bottomhole geometry may be considered as a planar surface, but this is not a limitation on the invention. Those skilled in the art will appreciate that the geometry of the bottomhole surface can be meshed, represented by a set of spatial coordinates, and provided as input. In one implementation, a visual representation of the bottomhole surface is generated using a coordinate mesh size of 1 millimeter.

Once the input data is entered or otherwise made available and the bottomhole shape determined, the steps in a main simulation loop can be executed. Within the main simulation loop, drilling is simulated by "rotating" the bit (numerically) by an incremental amount, $\Delta\theta_i$. The rotated position of the bit at any time can be expressed as, $$\theta_{bit} = \sum^{i} \Delta\theta_{bit,i}. \tag{1}$$

$\Delta\theta_{bit,i}$, may be set equal to 3 degrees, for example. In other implementations, $\Delta\theta_{bit,i}$ may be a function of time or may be calculated for each given time step. The new location of each of the cutters is then calculated, based on the known incremental rotation of the bit, $\Delta\theta_{bit,i}$, and the known previous location of each of the cutters on the bit. At this step, the new cutter locations only reflect the change in the cutter locations based on the incremental rotation of the bit. The newly rotated location of the cutters can be determined by geometric calculations known in the art. The axial displacement of the bit, $\Delta d_{bit,i}$, resulting for the incremental rotation, $\Delta\theta_{bit,i}$, may be determined using an equation such as:

$$\Delta d_{bit,i} = \frac{(ROP_i / RPM_i)}{60} \cdot (\Delta\theta_{bit,i})/360. \tag{2}$$

Once the axial displacement of the bit, $\Delta d_{bit,i}$, is determined, the bit is "moved" axially downward (numerically) by the incremental distance, $\Delta d_{bit,i}$, (with the cutters at their newly rotated locations). Then the new location of each of the cutters after the axial displacement is calculated. The calculated location of the cutters now reflects the incremental rotation and axial displacement of the bit during the "increment of drilling." Then, the interference of each cutter with the bottomhole is determined. Determining cutter interactions with the bottomhole includes calculating the depth of cut, the interference surface area, and the contact edge length for each cutter contacting the formation during the increment of drilling by the bit. These cutter/formation interaction parameters can be calculated using geometrical calculations known in the art.

Figure 8:
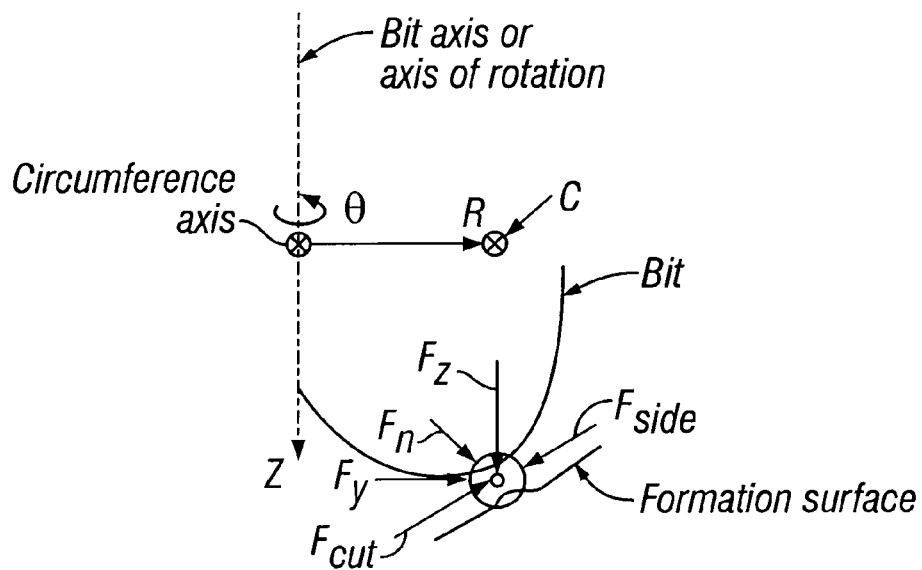
FIG. 8 schematically shows a cutter element in relation to a drill bit acting against a formation.

Once the correct cutter/formation interaction parameters are determined, the axial force on each cutter (in the Z direction with respect to a bit coordinate system as illustrated in FIG. 8) during increment drilling step, i, is determined. The force on each cutter is determined from the cutter/formation interaction data based on the calculated values for the cutter/formation interaction parameters and cutter and formation information.

Referring to FIG. 8, the normal force, cutting force, and side force on each cutter is determined from cutter/formation interaction data based on the known cutter information (cutter type, size, shape, bevel size, etc.), the selected formation type, the calculated interference parameters (i.e., interference surface area, depth of cut, contact edge length) and the cutter orientation parameters (i.e., back rake angle, side rake angle, etc.). For example, the forces may be determined by accessing a cutter/formation interaction database for a cutter and formation pair similar to the cutter and earth formation interaction during drilling. Then, the values calculated for the interaction parameters (depth of cut, interference surface area, contact edge length, back rack, side rake, and bevel size) during drilling are used to look up the forces required on the cutter to cut through formation in the cutter/formation interaction database. If values for the interaction parameters do not match values contained in the cutter/formation interaction database, records containing the most similar parameters are used and values for these most similar records can be used to interpolate the force required on the cutting element during drilling.

The displacement of each of the cutters is calculated based on the previous cutter location. The forces on each cutter are then determined from cutter/formation interaction data based on the cutter lateral movement, penetration depth, interference surface area, contact edge length, and other bit design parameters (e.g., back rake angle, side rake angle, and bevel size of cutter). Cutter wear is also calculated for each cutter based on the forces on each cutter, the interaction parameters, and the wear data for each cutter. The cutter shape is modified using the wear results to form a worn cutter for subsequent calculations.

Figure 9A:
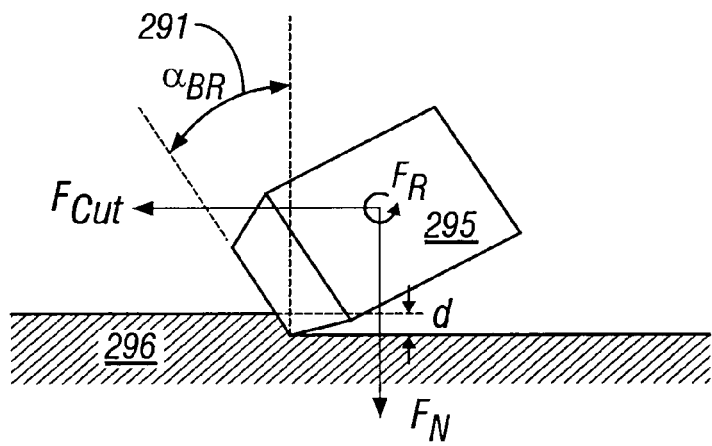
FIGS. 9A-C shows nomenclature for a drill bit cutter in relation to a formation for purposes of modeling the cutter.
Figure 9B:
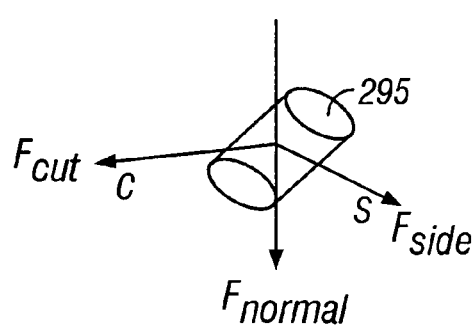
Figure 9C:
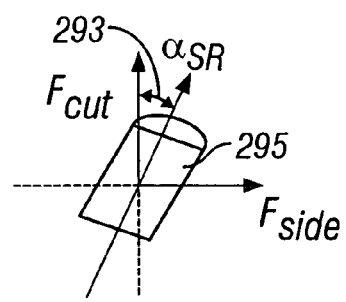

FIG. 9A shows a single cutter 295 in an example of a modeled position for engaging a formation 296 and FIGS. 9B and 9C show force orientation and nomenclature for discussion purposes. The back rake angle $\beta_{br}$ is shown at 291 in FIG. 9A and the side rake angle $\alpha_{sr}$ is shown at 293 in FIG. 9C. Once the forces, for example $F_N$, $F_{cut}$, and $F_{side}$ (see FIG. 9B), on each of the cutters during the incremental drilling step are determined. These forces may be resolved into bit coordinate system, $O_{ZR\theta}$, illustrated in FIG. 8, (axial (Z), radial (R), and circumferential (C) that is perpendicular into the page in FIG. 8). Then, all of the forces on the cutters in the axial direction are summed to obtain a total axial force $F_Z$ on the bit. The axial force required on the bit during the incremental drilling step is taken as the weight on bit (WOB) required to achieve the given ROP or alternatively the ROP required to achieve a given WOB is determined.

The total force required on the cutter to cut through earth formation can be resolved into components in any selected coordinate system, such as the Cartesian coordinate system shown in FIGS. 9A-C and 10A-C. As shown in FIG. 9B, the force on the cutter can be resolved into a normal component (normal force), $F_N$, a cutting direction component (cut force), $F_{cut}$, and a side component (side force), $F_{side}$. In the cutter coordinate system shown in FIG. 9B, the cutting axis is positioned along the direction of cut. The normal axis is normal to the direction of cut and generally perpendicular to the surface of the earth formation 296 interacting with the cutter. The side axis is parallel to the surface of the earth formation 296 and perpendicular to the cutting axis. The origin of this cutter coordinate system is shown positioned at the center of the cutter 295.

The bottomhole pattern is updated. The bottomhole pattern can be updated by removing the formation in the path of interference between the bottomhole pattern resulting from the previous incremental drilling step and the path traveled by each of the cutters during the current incremental drilling step.

Output information, such as forces on cutters, weight on bit, and cutter wear, may be provided for further analysis. The output information may include any information or data which characterizes aspects of the performance of the selected drill bit drilling the specified earth formations. For example, output information can include forces acting on the individual cutters during drilling, scraping movement/distance of individual cutters on the hole bottom and on the hole wall, total forces acting on the bit during drilling, and the weight on bit to achieve the selected rate of penetration for the selected bit. Output information may be used to generate a visual display of the results of the drilling simulation. The visual display can include a graphical representation of the well bore being drilled through earth formations. The visual display can also include a visual depiction of the earth formation being drilled with cut sections of formation calculated as removed from the bottomhole during drilling being visually "removed" on a display screen. The visual representation may also include graphical displays of forces, such as a graphical display of the forces on the individual cutters, on the blades of the bit, and on the drill bit during the simulated drilling. The visual representation may also include graphical displays force angles, Beta angle separation between force components, and historic or time dependent depictions of forces and angles. The means, whether a graph, a visual depiction or a numerical table used for visually displaying aspects of the drilling performance can be a matter of choice for the system designer, and is not a limitation on the invention. According to one aspect of the invention, it is useful to display the Beta angle between cut direction component of the total of imbalance force and the radial direction component of the total imbalance force during a period of time of simulated drilling.

As should be understood by one of ordinary skill in the art, with reference to co-owned, co-pending U.S. patent application Ser. No. 10/888,446, incorporated herein by reference in its entirety, the steps within a main simulation loop are repeated as desired by applying a subsequent incremental rotation to the bit and repeating the calculations in the main simulation loop to obtain an updated cutter geometry (if wear is modeled) and an updated bottomhole geometry for the new incremental drilling step. Repeating the simulation loop as described above will result in the modeling of the performance of the selected fixed cutter drill bit drilling the selected earth formations and continuous updates of the bottomhole pattern drilled. In this way, the method as described can be used to simulate actual drilling of the bit in earth formations.

An ending condition, such as the total depth to be drilled, can be given as a termination command for the simulation, the incremental rotation and displacement of the bit with subsequent calculations in the simulation loop will be repeated until the selected total depth drilled is reached, as calculated below:

$$D = \sum^{i} \Delta d_{bit,i}. \tag{3}$$

Alternatively, the drilling simulation can be stopped at any time using any other suitable termination indicator, such as a selected input from a user or a desired output from the simulation.

Embodiments of the present invention advantageously provide the ability to model inhomogeneous regions and transitions between layers. With respect to inhomogeneous regions, sections of formation may be modeled as nodules or beams of different material embedded into a base material, for example. That is, a user may define a section of a formation as including various non-uniform regions, whereby several different types of rock are included as discrete regions within a single section.

Returning to FIGS. 5A-C, in accordance with some embodiments of the invention, wellbore constraints for the drilling tool assembly may be determined, at 222, 224, because the response of the drilling tool assembly is subject to the constraint within the wellbore. First, the trajectory of the wall of the wellbore, which constrains the drilling tool assembly and forces it to conform to the wellbore path, is constructed at 220 using wellbore trajectory parameters provided as input at 204. For example, a cubic B-spline method or other interpolation method can be used to approximate wellbore wall coordinates at depths between the depths provided as input data. The wall coordinates are then discretized (or meshed), at 224 and stored. Similarly, an initial wellbore bottom surface geometry, which is either selected or determined, is also discretized, at 222, and stored. The initial bottom surface of the wellbore may be selected as flat or as any other contour, which can be provided as wellbore input at 204 or 222. Alternatively, the initial bottom surface geometry may be generated or approximated based on the selected bit geometry. For example, the initial bottomhole geometry may be selected from a "library" (i.e., database) containing stored bottomhole geometries resulting from the use of various bits.

In the example embodiment shown in FIG. 5A, a coordinate mesh size of 1 millimeter is selected for the wellbore surfaces (wall and bottomhole); however, the coordinate mesh size is not intended to be a limitation on the invention. Once meshed and stored, the wellbore wall and bottomhole geometry, together, comprise the initial wellbore constraints within which the drilling tool assembly operates, and, thus, within which the drilling tool assembly response is constrained.

Once the mechanics analysis model for the drilling tool assembly including the bit is constructed 210 and the wellbore constraints are specified 222, 224, the mechanics model and constraints can be used to determine the constraint forces on the drilling tool assembly when forced to the wellbore trajectory and bottomhole from its original "stress free" state. In this embodiment, the constraint forces on the drilling tool assembly are determined by first displacing and fixing the nodes of the drilling tool assembly so the centerline of the drilling tool assembly corresponds to the centerline of the wellbore, at 226. Then, the corresponding constraining forces required on each node (to fix it in this position) are calculated at 228 from the fixed nodal displacements using the drilling tool assembly (i.e., system or global) stiffness matrix from 212. Once the "centerline" constraining forces are determined, the hook load is specified, and initial wellbore wall constraints and bottomhole constraints are introduced at 230 along the drilling tool assembly and at the bit (lowest node). The centerline constraints are used as the wellbore wall constraints. The hook load and gravitational force vector are used to determine the WOB.

As previously noted, the hook load is the load measured at the hook from which the drilling tool assembly is suspended. Because the weight of the drilling tool assembly is known, the bottomhole constraint force (i.e., WOB) can be determined as the weight of the drilling tool assembly minus the hook load and the frictional forces and reaction forces of the hole wall on the drilling tool assembly.

Once the initial loading conditions are introduced, the "centerline" constraint forces on all of the nodes may be removed, a gravitational force vector may be applied, and the static equilibrium position of the assembly within the wellbore may be determined by iteratively calculating the static state of the drilling tool assembly 232. Iterations are necessary since the contact points for each iteration may be different. The convergent static equilibrium state is reached and the iteration process ends when the contact points and, hence, contact forces are substantially the same for two successive iterations. Along with the static equilibrium position, the contact points, contact forces, friction forces, and static WOB on the drilling tool assembly may be determined. Once the static state of the system is obtained, it can be used as the staring point for simulation of the dynamic response of the drilling tool assembly drilling earth formation 234.

During the simulation, the constraint forces initially used for each new incremental calculation step may be the constraint forces determined during the last incremental rotation. In the simulation, incremental rotation calculations are repeated for a select number of successive incremental rotations until an end condition for simulation is reached.

Figure 5C:
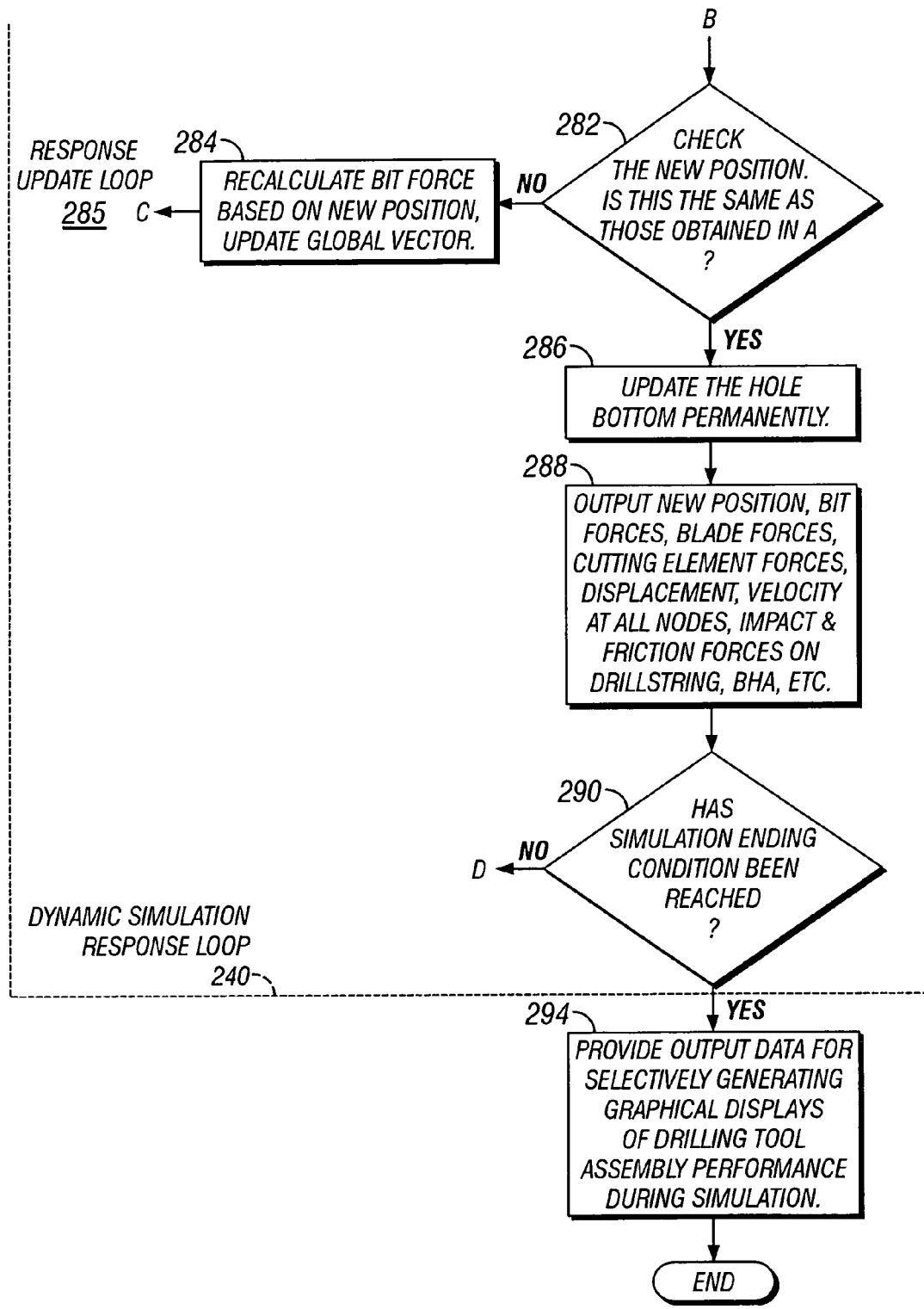

As shown in FIGS. 5A-C, once input data are provided and the static state of the drilling tool assembly in the wellbore is determined, calculations in the dynamic response simulation loop 240 can be carried out. Briefly summarizing the functions performed in the dynamic response loop 240, the drilling tool assembly drilling earth formation is simulated by "rotating" the top of the drilling tool assembly (and at the location corresponding to a downhole motor, if used) through an incremental angle (at 242) corresponding to a selected time increment, and then calculating the response of the drilling tool assembly under the previously determined loading conditions 244 to the incremental rotation(s). The constraint loads on the drilling tool assembly resulting from interaction with the wellbore wall during the incremental rotation are iteratively determined (in loop 245) and are used to update the drilling tool assembly constraint loads (i.e., global load vector), at 248, and the response is recalculated under the updated loading condition. The new response is then rechecked to determine if wall constraint loads have changed and, if necessary, wall constraint loads are re-determined, the load vector updated, and a new response calculated. Then, the bottomhole constraint loads resulting from bit interaction with the formation during the incremental rotation are evaluated based on the new response (ay 252), the load vector is updated (at 279), and a new response is calculated (at 280). The wall and bottomhole constraint forces are repeatedly updated (in loop 285) until convergence of a dynamic response solution is obtained (i.e., changes in the wall constraints and bottomhole constraints for consecutive solutions are determined to be negligible). The entire dynamic simulation loop 240 is then repeated for successive incremental rotations until an end condition of the simulation is reached (at 290) or until simulation is otherwise terminated. A more detailed description of the elements in the simulation loop 240 follows.

Prior to the start of the simulation loop 240, drilling operation parameters 206 are specified. As previously noted, the drilling operation parameters 206 may include the rotary table speed, downhole motor speed (if a downhole motor is included in the BHA), rate of penetration (ROP), and the hook load (and/or other weight on bit parameter). In this example, the end condition for simulation is also provided at 206, as either the total number of revolutions to be simulated or the total time for the simulation. Additionally, the incremental step desired for calculations should be defined, selected, or otherwise provided. In the embodiment shown, an incremental time step of $\Delta t = 10^{-3}$ seconds is selected. However, it should be understood that the incremental time step is not intended to be a limitation on the invention.

Once the static state of the system is known (from 232) and the operational parameters are provided, the dynamic response simulation loop 240 can begin. First, the current time increment is calculated at 241, wherein:

$$t_{i+1} = t_i + \Delta t. \tag{4}$$

Then, the incremental rotation occurring during that time increment is calculated at 242. In this embodiment, RPM is considered an input parameter. Therefore, the formula used to calculate the incremental rotation angle at time $t_{i+1}$ is:

$$\Delta \theta_{i+1} = RPM * 360 * \Delta t / 60, \tag{5}$$

wherein RPM is the rotational speed (in RPM) of the rotary table or top drive provided as input data (at 206). The calculated incremental rotation angle is applied proximal to the top of the drilling tool assembly (at the node(s) corresponding to the position of the rotary table). If a downhole motor is included in the BHA, the downhole motor incremental rotation is also calculated and applied at the nodes corresponding to the downhole motor.

Once the incremental rotation angle and current time are determined, the system's new configuration (nodal positions) under the extant loads and the incremental rotation is calculated (at 244) using the drilling tool assembly mechanics analysis model and the rotational input as an excitation. A direct integration scheme can be used to solve the resulting dynamic equilibrium equations for the drilling tool assembly. The dynamic equilibrium equation (like the mechanics analysis equation) can be derived using Newton's second law of motion, wherein the constructed drilling tool assembly mass, stiffness, and damping matrices along with the calculated static equilibrium load vector can be used to determine the response to the incremental rotation. For the example shown in Figure FIGS. 5A-C, it should be understood that at the first time increment $t_1$ the extant loads on the system are the static equilibrium loads (calculated for to) which include the static state WOB and the constraint loads resulting from drilling tool assembly contact with the wall and bottom of the wellbore.

As the drilling tool assembly is incrementally "rotated," constraint loads acting on the bit may change. For example, points of the drilling tool assembly in contact with the borehole surface prior to rotation may be moved along the surface of the wellbore resulting in friction forces at those points. Similarly, some points of the drilling tool assembly, which were close to contacting the borehole surface prior to the incremental rotation, may be brought into contact with the formation as a result of the incremental rotation. This may result in impact forces on the drilling tool assembly at those locations. As shown in FIGS. 5A-C, changes in the constraint loads resulting from the incremental rotation of the drilling tool assembly can be accounted for in the wall interaction update loop 245.

In the example shown, once the system's response (i.e., new configuration) under the current loading conditions is obtained, the positions of the nodes in the new configuration are checked at 246 in the wall constraint loop 245 to determine whether any nodal displacements fall outside of the bounds (i.e., violate constraint conditions) defined by the wellbore wall. If nodes are found to have moved outside of the wellbore wall, the impact and/or friction forces which would have occurred due to contact with the wellbore wall are approximated for those nodes at 248 using the impact and/or friction models or parameters provided as input at 208. Then the global load vector for the drilling tool assembly is updated, also at 248, to reflect the newly determined constraint loads. Constraint loads to be calculated may be determined to result from impact if, prior to the incremental rotation, the node was not in contact with the wellbore wall. Similarly, the constraint load can be determined to result from frictional drag if the node now in contact with the wellbore wall was also in contact with the wall prior to the incremental rotation. Once the new constraint loads are determined and the global load vector is updated, at 248, the drilling tool assembly response is recalculated (at 244) for the same incremental rotation under the newly updated load vector (as indicated by loop 245). The nodal displacements are then rechecked (at 246) and the wall interaction update loop 245 is repeated until a dynamic response within the wellbore constraints is obtained.

Once a dynamic response conforming to the borehole wall constraints is determined for the incremental rotation, the constraint loads on the drilling tool assembly due to interaction with the bottomhole during the incremental rotation are determined in the bit interaction loop 250. Those skilled in the art will appreciate that any method for modeling drill bit/earth formation interaction during drilling may be used to determine the forces acting on the drill bit during the incremental rotation of the drilling tool assembly. An example of one method is illustrated in the bit interaction loop 250 in FIG. 5B.

In the bit interaction loop 250, the mechanics analysis model of the drill bit is subjected to the incremental rotation angle calculated for the lowest node of the drilling tool assembly, and is then moved laterally and vertically to the new position obtained from the same calculation, as shown at 249. As previously noted, the drill bit in this example is a fixed cutter drill bit. The interaction of the drill bit with the earth formation is modeled in accordance with a method disclosed in U.S. Provisional Application No. 60/485,642, which has been incorporated herein by reference. Thus, in this example, once the rotation and new position for the bit node are known, they are used as input to the drill bit model and the drill bit model is used to calculate the new position for each of the cutting elements on the drill bit. Then, the location of each cutting element relative to the bottomhole and wall of the wellbore is evaluated, at 254, to determine for each cutting element whether cutting element interference with the formation occurred during the incremental movement of the bit.

If cutting element contact is determined to have occurred with the earth formation, surface contact area between the cutter and the earth formation is calculated along with the depth of cut and the contact edge length of the cutter, and the orientation of the cutting face with respect to the formation (e.g., back rake angle, side rake angle, etc.) at 264. The depth of cut is the depth below the formation surface that a cutting element contacts earth formation, which can range from zero (no contact) to the full height of the cutting element. Surface area contact is the fractional amount of the cutting surface area out of the entire area corresponding to the depth of cut that actually contacts earth formation. This may be a fractional amount of contact due to cutting element grooves formed in the formation from previous contact with cutting elements. The contact edge length is the distance between farthest points on the edge of the cutter in contact with formation at the formation surface. Scraping distance takes into account the movement of the cutting element in the formation during the incremental rotation.

Once the depth of cut, surface contact area, contact edge length, and scraping distance are determined for a cutting element, these parameters can be stored and used along with the cutting element/formation interaction data to determine the resulting forces acting on the cutting element during the incremental movement of the bit (also indicated at 264). For example, in accordance a simulation method described in U.S. Provisional Application No. 60/485,642 noted above, resulting forces on each of the cutters can be determined using cutter/formation interaction data stored in a data library involving a cutter and formation pair similar to the cutter and earth formation interacting during the simulated drilling. Values calculated for interaction parameters (depth of cut, interference surface area, contact edge length, back rack, side rake, and bevel size) during drilling are used to determine the corresponding forces required on the cutters to cut through the earth formation. In cases where the cutting element makes less than full contact with the earth formation due to grooves in the formation surface, an equivalent depth of cut and equivalent contact edge length may be calculated to correspond to the interference surface area and these values are used to determine the forces required on the cutting element during drilling.

Once the cutting element/formation interaction variables (contact area, depth of cut, force, etc.) are determined for cutting elements, the geometry of the bottom surface of the wellbore is temporarily updated, to reflect the removal of formation by each cutting element during the incremental rotation of the drill bit.

After the bottomhole geometry is temporarily updated, insert wear and strength can also be analyzed, as shown at 258, based on wear models and calculated loads on the cutting elements to determine wear on the cutting elements resulting from contact with the formation and the resulting reduction in cutting element strength.

As noted above, cutter wear is a function of the force exerted on the cutter. In addition, other factors that may influence the rates of cutter wear include the velocity of the cutter brushing against the formation (i.e., relative sliding velocity), the material of the cutter, the area of the interference or depth of cut (d), and the temperature. Various models have been proposed to simulate the wear of the cutter. For example, U.S. Pat. No. 6,619,411 issued to Singh et al. (the '411 patent) discloses methods for modeling the wear of a roller cone drill bit.

As disclosed in the '411 patent, abrasion of materials from a drill bit may be analogized to a machining operation. The volume of wear produced will be a function of the force exerted on a selected area of the drill bit and the relative velocity of sliding between the abrasive material and the drill bit. Thus, in a simplistic model, $$WR = f(F_N, v), \quad (6)$$

where WR is the wear rate, $F_N$ is the force normal to the area on the drill bit and v is the relative sliding velocity. $F_N$, which is a function of the bit-formation interaction, and v can both be determined from the above-described simulation.

While the simple wear model described above may be sufficient for wear simulation, other embodiments of the invention may use any other suitable models. For example, some embodiments of the invention use a model that takes into account the temperature of the operation, such as:

$$WR = f(F_N, v, T), \quad (7)$$

while other embodiments may use a model that includes another measurement as a substitute for the force acting on the bit or cutter. For example, the force acting on a cutter may be represented as a function of the depth of cut (d). Therefore, $F_N$ may be replace by the depth of cut (d) in some model, as shown in equation (8):

$$WR = a1 \times 10^{a2} \times d^{a3} \times v^{a4} \times T^{a5} \quad (8)$$

where WR is the wear rate, d is the depth of cut, v is the relative sliding velocity, T is a temperature, and a1-a5 are constants.

The wear model shown in equation (8) is flexible and can be used to model various bit-formation combinations. For each bit-formation combination, the constants (a1-a5) may be fine tuned to provide an accurate result. These constants may be empirically determined using defined formations and selected bits in a laboratory or from data obtained in the fields. Alternatively, these constants may be based on theoretical or semi-empirical data.

The term $a1 \times 10^{a2}$ is dependent on the bit/cutter (material, shape, arrangement of the cutter on the bit, etc.) and the formation properties, but is independent of the drilling parameters. Thus, the constants a1 and a2 once determined can be used with similar bit-formation combinations. One of ordinary skill in the art would appreciate that this term ($a1 \times 10^{a2}$) may also be represented as a simple constant k.

The wear properties of different materials may be determined using standard wear tests, such as the American Society for Testing and Materials (ASTM) standards G65 and B611, which are typically used to test abrasion resistance of various drill bit materials, including, for example, materials used to form the bit body and cutting elements. Further, superhard materials and hardfacing materials that may be applied to selected surfaces of the drill bit may also be tested using the ASTM guidelines. The results of the tests are used to form a database of rate of wear values that may be correlated with specific materials of both the drill bit and the formation drilled, stress levels, and other wear parameters.

The remaining term in equation (8), $d^{a3} \times v^{a4} \times T^{a5}$ is dependent on the drilling parameters (i.e., the depth of cut, the relative sliding velocity, and the temperature). With a selected bit-formation combination, each of the constants (a3, a4, and a5) may be determined by varying one drilling parameter and holding other drilling parameters constant. For example, by holding the relative sliding velocity (v) and temperature (T) constant, a3 can be determined from the wear rate changes as a function of the depth of cut (d). Once these constants are determined, they can be used in the dynamic simulation and may also be stored in a database for later simulation/modeling.

The performance of the worn cutters may be simulated with a constrained centerline model or a dynamic model to generate parameters for the worn cutters and a graphical display of the wear. The parameters of the worn cutters can be used in a next iteration of simulation. For example, the worn cutters can be displayed to the design engineer and the parameters can be adjusted by the design engineer accordingly, to change wear or to change one or more other performance characteristics. Simulating, displaying and adjusting of the worn cutters can be repeated, to optimize a wear characteristic, or to optimize or one or more other performance characteristics. By using the worn cutters in the simulation, the results will be more accurate. By taking into account all these interactions, the simulation of the present invention can provide a more realistic picture of the performance of the drill bit.

Note that the simulation of the wear may be performed dynamically with the drill bit attached to a drill string. The drill string may further include other components commonly found in a bottom-hole assembly (BHA). For example, various sensors may be included in drill collars in the BHA. In addition, the drill string may include stabilizers that reduce the wobbling of the BRA or drill bit.

The dynamic modeling may also take into account the drill string dynamics. In a drilling operation, the drill string may swirl, vibrate, and/or hit the wall of the borehole. The drill string may be simulated as multiple sections of pipes. Each section may be treated as a "node," having different physical properties (e.g., mass, diameter, flexibility, stretchability, etc.). Each section may have a different length. For example, the sections proximate to the BHA may have shorter lengths such that more "nodes" are simulated close to BHA, while sections close to the surface may be simulated as longer nodes to minimize the computational demand.

In addition, the "dynamic modeling" may also take into account the hydraulic pressure from the mud column having a specific weight. Such hydraulic pressure acts as a "confining pressure" on the formation being drilled. In addition, the hydraulic pressure (i.e., the mud column) provides buoyancy to the BHA and the drill bit.

The dynamic simulation may also generate worn cutters after each iteration and may use the worn cutters in the next iteration. By using the worn cutters in the simulation, the results will be more accurate. By taking into account all these interactions, the dynamic simulation of the present invention can provide a more realistic picture of the performance of the drill bit.

Returning to FIG. 5B, once interactions of all of the cutting elements on a blade is determined, blade interaction with the formation may be determined by checking the node displacements at the blade surface, at 262, to determine if any of the blade nodes are out of bounds or make contact with the wellbore wall or bottomhole surface. If blade contact is determined to occur during the incremental rotation, the contact area and depth of penetration of the blade are calculated and used to determine corresponding interaction forces on the blade surface resulting from the contact. Once forces resulting from blade contact with the formation are determined, or it is determined that no blade contact has occurred, the total interaction forces on the blade during the incremental rotation are calculated by summing all of the cutting element forces and any blade surface forces on the blade, at 268.

Once the interaction forces on each blade are determined, any forces resulting from contact of the bit body with the formation may also be determined and then the total forces acting on the bit during the incremental rotation calculated and used to determine the dynamic weight on bit 278. The newly calculated bit interaction forces are then used to update the global load vector at 279, and the response of the drilling tool assembly is recalculated at 280 under the updated loading condition. The newly calculated response is then compared to the previous response at 282 to determine if the responses are substantially similar. If the responses are determined to be substantially similar, then the newly calculated response is considered to have converged to a correct solution. However, if the responses are not determined to be substantially similar, then the bit interaction forces are recalculated based on the latest response at 284 and the global load vector is again updated at 284. Then, a new response is calculated by repeating the entire response calculation (including the wellbore wall constraint update and drill bit interaction force update) until consecutive responses are obtained which are determined to be substantially similar (indicated by loop 285), thereby indicating convergence to the solution for dynamic response to the incremental rotation.

Once the dynamic response of the drilling tool assembly to an incremental rotation is obtained from the response force update loop 285, the bottomhole surface geometry is then permanently updated at 286 to reflect the removal of formation corresponding to the solution. At this point, output information desired from the incremental simulation step can be stored and/or provided as output. For example, the velocity, acceleration, position, forces, bending moments, torque, of any node in the drill string may be provided as output from the simulation. Additionally, the dynamic WOB, cutting element forces, resulting cutter wear, blade forces, and blade or bit body contact points may be output from the simulation.

This dynamic response simulation loop 240 as described above is then repeated for successive incremental rotations of the bit until an end condition of the simulation (checked at 290) is satisfied. For example, using the total number of bit revolutions to be simulated as the termination command, the incremental rotation of the drilling tool assembly and subsequent iterative calculations of the dynamic response simulation loop 240 will be repeated until the selected total number of revolutions to be simulated is reached. Repeating the dynamic response simulation loop 240 as described above will result in simulating the performance of an entire drilling tool assembly drilling earth formations with continuous updates of the bottomhole pattern as drilled, thereby simulating the drilling of the drilling tool assembly in the selected earth formation. Upon completion of a selected number of operations of the dynamic response simulation loop, results of the simulation may be used to generate output information at 294 characterizing the performance of the drilling tool assembly drilling the selected earth formation under the selected drilling conditions, as shown in FIGS. 5A-C. It should be understood that the simulation can be stopped using any other suitable termination indicator, such as a selected wellbore depth desired to be drilled, indicated divergence of a solution, etc.

The dynamic model of the drilling tool assembly described above usefully allows for six degrees of freedom of moment for the drill bit. In one or more embodiments, methods in accordance with the above description can be used to calculate and accurately predict the axial, lateral, and torsional vibrations of drill strings when drilling through earth formation, as well as bit whirl, bending stresses, and other dynamic indicators of performance for components of a drilling tool assembly.

Optimizing Performance for a Dynamic Model

In another aspect, the invention provides a method for predicting, analyzing, improving and optimizing the performance of a drilling tool assembly and particularly the performance of a drill bit design when it is drilling in earth formations. For example, the method may include simulating a dynamic response of a drilling tool assembly, determining the radial components and circumferential components of the total imbalanced force, determining the Beta angle between the component forces over a period of time, determining the bottom hole pattern, determining the dynamic trajectory of the centerline of the drill bit, and/or determining the side rake imbalance forces, displaying at least one of the determined performance indicating, adjusting the value of at least one drill bit design parameter including the side rake angle distribution, repeating the simulating, and repeating the adjusting and the simulating until a value of at least one performance indicating parameter is determined to be an optimal value.

Methods in accordance with this aspect of the invention may be used to analyze relationships between drill bit design parameters and the performance indicating parameters such as the radial components and circumferential components of the total imbalanced force, the Beta angle between the component forces over a period of time, the bottom hole pattern, the dynamic trajectory of the centerline of the drill bit, and/or the side rake imbalance forces and the relationship of these characteristics of the drill bit design and performance to other design parameters and performance characteristics. This method also may be used to design a drilling tool assembly having enhanced drilling characteristics. Further, the method may be used to analyze the effect of changes in a drilling tool configuration on drilling performance. Additionally, the method may enable a drilling tool assembly designer or operator to determine an optimal value of a drill bit design parameter or of a drilling tool assembly design parameter for drilling at a particular depth or in a particular formation.

Examples of drilling tool assembly design parameters include the type and number of components included in the drilling tool assembly; the length, ID, OD, weight, and material properties of each component; and the type, size, weight, configuration, and material properties of the drill bit; and the type, size, number, location, orientation, and material properties of the cutting elements on the bit, and in one particular embodiment, the side rake angle distribution. Material properties in designing a drilling tool assembly may include, for example, the strength, elasticity, density, wear resistance, hardness, and toughness of the material. It should be understood that drilling tool assembly design parameters may include in addition to the side rake angle distribution any other configuration of parameter for the drilling tool assembly without departing from the spirit of the invention.

Examples of drilling performance parameters include rate of penetration (ROP), rotary torque required to turn the drilling tool assembly, rotary speed at which the drilling tool assembly is turned, drilling tool assembly vibrations induced during drilling (e.g., lateral and axial vibrations), weight on bit (WOB), and forces acting on the bit, cutting support structure, and cutting elements. Drilling performance parameters may also include the inclination angle and azimuth direction of the borehole being drilled. One skilled in the art will appreciate that other drilling performance parameters exist and may be considered as determined by the drilling tool assembly designer without departing from the scope of the invention.

Figure 6:
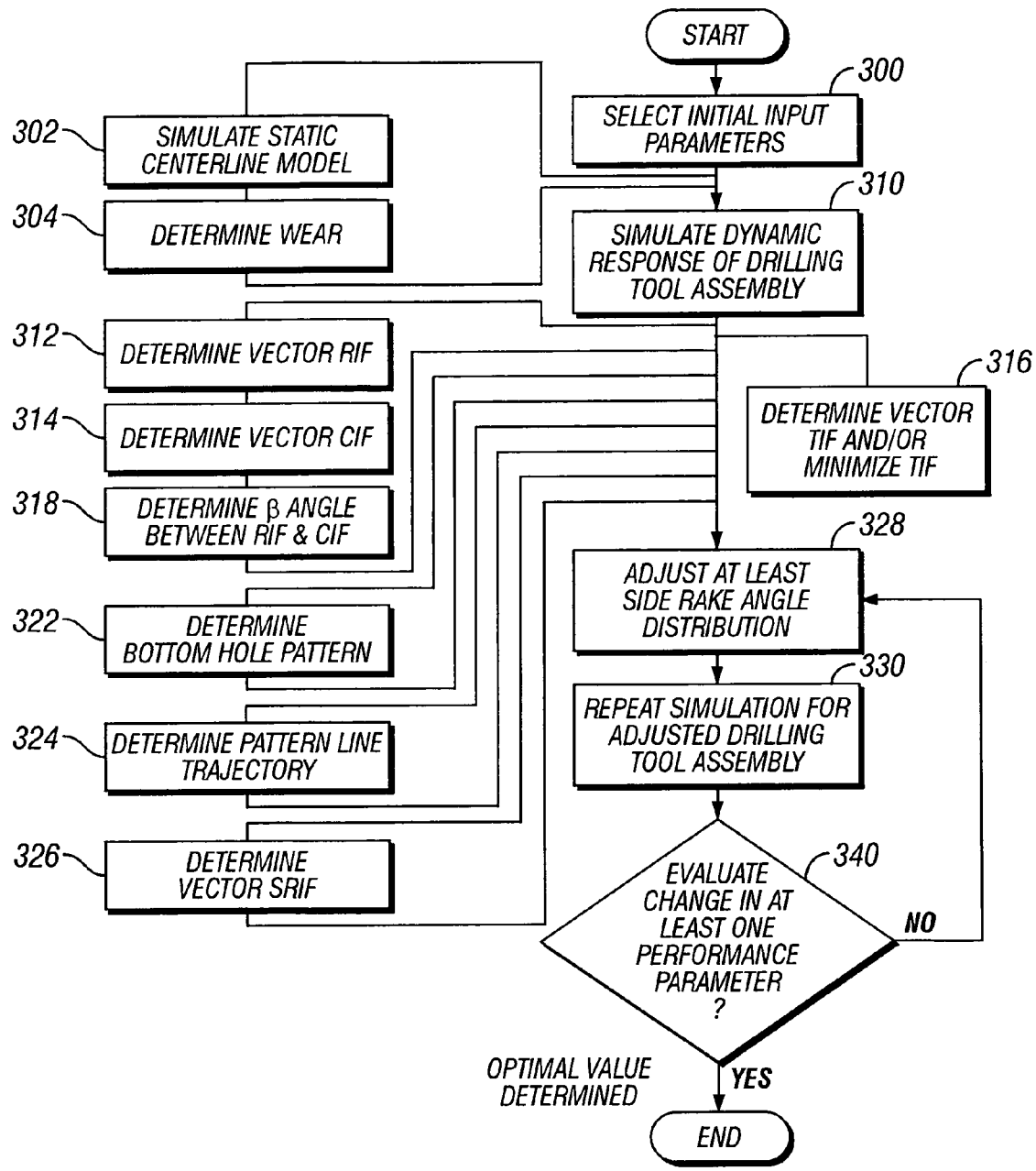
FIG. 6 shows a flow chart of a method for determining an optimal value of at least a side rake angle distribution as drilling tool assembly design parameter.

In one embodiment of the invention, illustrated in FIG. 6, the method comprises defining, selecting or otherwise providing initial input parameters at 300 (including drill bit and drilling tool assembly design parameters). The method may further comprise simulating the response of a drill bit design using a static model 302 (a static model defined for these purposes as a model in which it is assumed that the centerline of the drill bit is constrained to be concentric with the centerline of the wellbore while the drill bit is rotated through increments of simulated rotational drilling in an earth formation) to determine cutter wear data 304. The method further comprises using the wear data in a dynamic model (defined as a model in which the centerline of the drill bit is constrained only by the dynamic characteristics of the drilling tool assembly including the drill string and the drill bit design) and simulating the dynamic response of the drilling tool assembly at 310. The dynamic simulation may be used to determine a radial component 312 and a circumferential component 314 of the total imbalanced forces (TIF) on the drill bit and the Beta angle 318 between the radial and circumferential vector components 312 and 314. The total imbalance force vector TIF may be determined and/or minimized. Other performance indicating parameters may also be determined. For example, the bottomhole pattern may be determined at 322, the centerline trajectory may be determined at 324 and/or the side rake imbalance force vector (SRIF) may be determined at 326. The method further comprises adjusting at least one drilling tool assembly design parameter including the side rake angle distribution at 328 in response to one or more of the determined performance parameters, and repeating the simulating of the drilling tool assembly 330. The method also comprises evaluating the change in value of at least one of the performance parameters, and based on that evaluation, repeating the adjusting, the simulating, and the evaluating until at least one performance parameter is optimized.

In one embodiment the total imbalance forces may be determined and/or decreased at 316 to an acceptably small force and even minimized prior to, or concurrently with, the process for modifying or optimizing the performance parameters for the simulated drilling.

As used herein "optimized" or "optimizing" means obtaining an improvement in a particular characteristic that is acceptable to the designer for the intended purposes of the drill bit design. This may for example satisfy criterion set by the bit designer for a design providing an acceptable value for a particular performance parameter or acceptable values for a selected group of performance parameters as determined by modeling, laboratory testing, field testing or field use to produce a consistently stable drill bit in a given type or a given variety of types of formations and for intended operating parameters. This may for example satisfy criterion set by the designer for a design providing a sooth bottom hole pattern, a small TIF, a small SRIF, a small diameter trajectory, or a Beta angle at 180 degrees for a sufficient portion of the time or for a larger percent of the time as determined by modeling, testing, or field use to produce a consistently stable drill bit in a given type or a given variety of types of formations and for intended operating parameters.

In the case of a constrained centerline model, the graphical depiction can include dynamic movement in the axial direction while the fixed cutter drill bit is constrained about the centerline of the wellbore, but the bit is only allowed to move up and down and rotate around the well axis. Based upon the teachings of the present invention, it will be appreciated that other embodiments may be derived with or without this constraint. For example, a fully dynamic model of the fixed cutter drill bit allows for six degrees of freedom for the drill bit. Thus, using a dynamic model in accordance with embodiments of the invention allows for the prediction of axial, lateral, and torsional vibrations as well as bending moments at any point on the drill bit or along a drilling tool assembly as may be modeled in connection with designing the drill bit.

Figure 7:
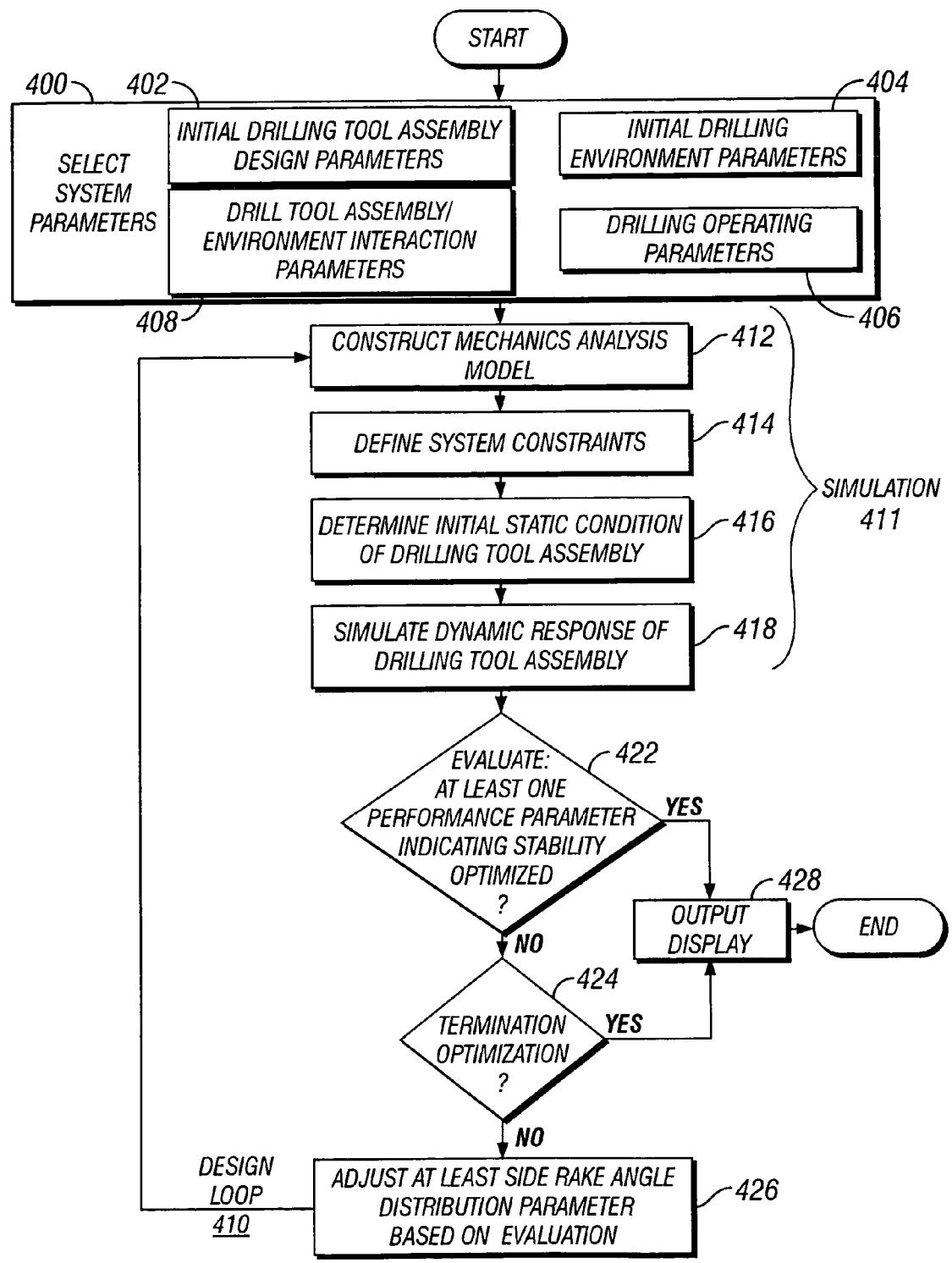
FIG. 7 shows a flow chart of one embodiment of the method for determining an optimal value of at least a side rake angle distribution as a design parameter in accordance with the method shown in FIG. 6.

In the embodiment of FIG. 7, initial parameters 400 may include initial drilling tool assembly parameters 402, initial drilling environment parameters 404, drilling operating parameters 406, and drilling tool assembly/drilling environment interaction parameters and/or models 408. These parameters may be substantially the same as the input parameters described above for the previous aspect of the invention.

In this example, simulating 411 comprises constructing a mechanics analysis model of the drilling tool assembly 412 based on the drilling tool assembly parameters 402, determining system constraints at 414 using the drilling environment parameters 404, and then using the mechanics analysis model along with the system constraints to solve for the initial static state of the drilling tool assembly in the drilling environment 416. Simulating 411 further comprises using the mechanics analysis model along with the constraints and drilling operation parameters 406 to incrementally solve for the response of the drilling tool assembly to rotational input from a rotary table 418 and/or downhole motor, if used. In solving for the dynamic response, the response is obtained for successive incremental rotations until an end condition signaling the end of the simulation is detected.

Incrementally solving for the response may also include determining, from drilling tool assembly/environment interaction information, loads on the drilling tool assembly during the incremental rotation resulting from changes in interaction between the drilling tool assembly and the drilling environment during the incremental rotation, and then recalculating the response of the drilling tool assembly under the new constraint loads. Incrementally solving may further include repeating, if necessary, the determining loads and the recalculating of the response until a solution convergence criterion is satisfied.

In the example shown in FIG. 7, adjusting at least one drilling tool assembly design parameter 426 comprises changing a value of at least one drilling tool assembly design parameter after each simulation by data input from a file, data input from an operator, or based on calculated adjustment factors in a simulation program. For example, the side rake angle distribution may be adjusted.

Drilling tool assembly design parameters may include any number of the drilling tool assembly parameters in addition to modifications to the side rake angle distribution. Thus in one example, a design parameter, such as the length of a drill collar, can be repeatedly adjusted and simulated to determine the effects of BHA weight and length on a drilling performance parameter (e.g., ROP, TIF, SRIF, Beta angle, bottom hole pattern, and/or centerline trajectory). Similarly, the inner diameter or outer diameter of a drilling collar may be repeatedly adjusted and a corresponding change response obtained. Similarly, a stabilizer or other component can be added to the BHA or deleted from the BHA and a corresponding change in response obtained. Further, a drill bit design parameter may be repeatedly adjusted and corresponding dynamic responses obtained to determine the effect on a performance parameter of changing one or more drill bit design parameters, such as the cutting support structure profile (e.g., cutter layout, blade profile, cutting element shape and size, orientation and/or back rake angle distribution) on the drilling performance of the drilling tool assembly.

In the example of FIG. 7, repeating the simulating 411 for the "adjusted" drilling tool assembly comprises constructing a new (or adjusted) mechanics analysis model (at 412) for the adjusted drilling tool assembly, determining new system constraints (at 414), and then using the adjusted mechanics analysis model along with the corresponding system constraints to solve for the initial static state (at 416) of the of the adjusted drilling tool assembly in the drilling environment. Repeating the simulating 411 further comprises using the mechanics analysis model, initial conditions, and constraints to incrementally solve for the response of the adjusted drilling tool assembly to simulated rotational input from a rotary table and/or a downhole motor, if used.

Once the response of the previous assembly design and the response of the current assembly design are obtained, the effect of the change in value of at least one design parameter on a performance indicating parameter can be evaluated (at 422). For example, during each simulation, values of desired drilling performance parameters ROP, TIF, SRIF, Beta angle, bottomhole pattern, centerline trajectory, impact loads, axial, lateral, or torsional vibration, and etc.) can be calculated and stored. Then, these values or other factors related to the drilling response, can be analyzed to determine the effect of adjusting the drilling tool assembly design parameter on the value of the at least one drilling performance parameter.

Once an evaluation of at least one drilling parameter is made, based on that evaluation the adjusting and the simulating may be repeated until it is determined that the at least one performance parameter is optimized or an end condition for optimization has been reached (at 424). The performance parameter may be determined to be at an optimal value when the performance parameter is at or near a predetermined value for the simulated drilling. It has been found that such an optimization of the dynamic model provides improved drilling stability and thus minimized axial or lateral impact force or evenly distributed forces about the cutting structure of a drill bit. For example, an increased average Beta angle over a period of dynamically modeled drilling simulation can indicate optimized stability of the drill bit and can also be an indicator of other performance parameters such as a maximum rate of penetration, a minimum rotary torque for a given rotation speed, and/or most even weight on bit for a given set of adjustment variables.

Usefully, embodiments of the invention may be used to analyze the relationship between drilling tool assembly design parameters and drilling performance in a selected drilling environment. Additionally, embodiments of the invention may be used to design a drilling tool assembly having optimal drilling performance for a given set of drilling conditions. Those skilled in the art will appreciate that other embodiments of the invention exist which do not depart from the spirit of this aspect of the invention.

Examples of Side Rake Angle Distribution Adjustments

Figure 11:
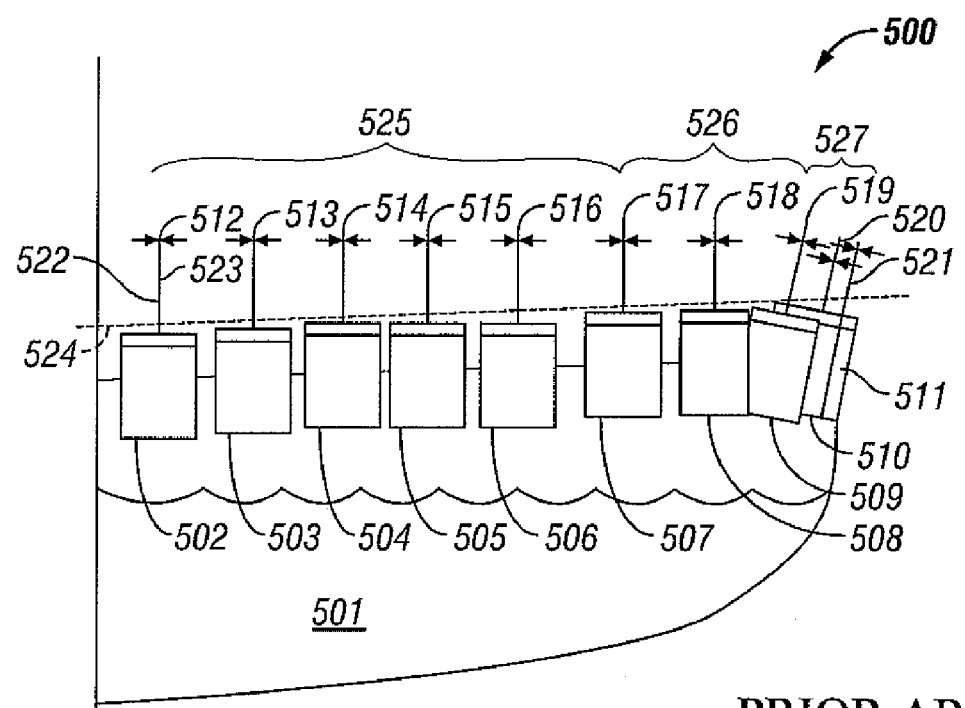
FIG. 11 shows a partial end view of a fixed cutter bit with a typical distribution of side rake angles along one exemplary blade and in which the side rake angle distribution is not optimum.

FIG. 11 shows a partial end view of a fixed cutter bit 500 with a typical distribution of side rake angles along one exemplary blade 501, in which the side rake angle distribution is not optimum. A plurality of individual cutters 502-511 are positioned having side rake angles 512-521 respectively. The side rake angles 512-521 are determined by measuring the angle $\alpha_{sr}$ between an imaginary line 522 drawn through the center and perpendicular to a cutting face of a cutter and a tangent line 523 at the center of the cutter. Thus, the tangent line 523 is parallel to the direction of cutting for the cutter when the drill bit is rotated about the center 524 of the drill bit. In FIG. 11, the cutters 502-506 are in the cone region 525, the cutters 507-510 are in the nose region 526, and cutter 511 are in the shoulder or gauge region 527 of the drill bit 500. The side rake angle distribution in each of the regions 525, 526, and 527 are considered generally "flat" as all of the cutters 502-511 have essentially the same side rake angle of about zero degrees ($\alpha_{sr}$=0.0°).

Figure 12:
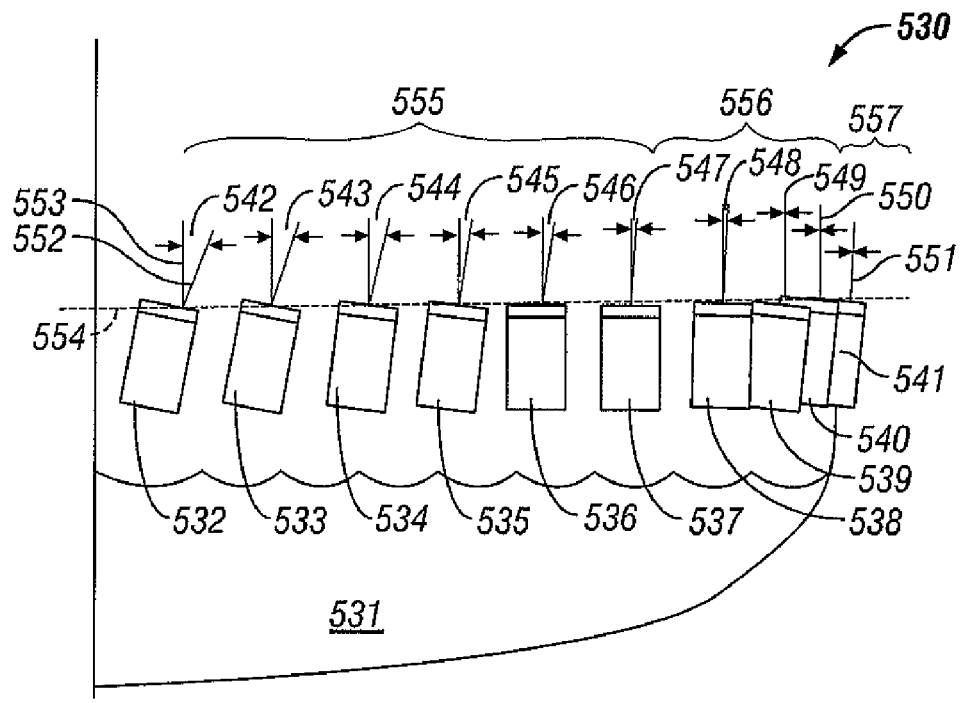
FIG. 12 shows a partial end view of a fixed cutter bit with a modified distribution of side rake angles along one exemplary blade and in which the modified side rake angle distribution improves performance over the side rake angle distribution shown in FIG. 11.

FIG. 12 shows a partial end view of a fixed cutter bit 530 with a modified distribution of side rake angles along one exemplary blade 531 and in which the modified side rake angle distribution improves performance over the side rake angle distribution shown in FIG. 11. A plurality of individual cutters 532-541 are positioned having side rake angle 542-551 respectively. The side rake angles 542-551 are determined by measuring the angle $\alpha_{sr}$ between an imaginary line 552 drawn through the center and perpendicular to a cutting face of a cutter and a tangent line 553 at the center of the cutter. Thus, the tangent line 553 is parallel to the direction of cutting for the cutter when the drill bit is rotated about its center 554. In FIG. 12, the cutters 532-536 are in the cone region 555, the cutters 537-540 are in the nose region 556, and cutter 541 is in the shoulder or gauge region 557 of the drill bit 530. The side rake angle distribution in the cone region 555 varies from a large side rake angle toward the center 554 of the drill bit 530 and progressively smaller side rake angles in the cone region 555 toward the nose region 556, smaller in the nose region and then smaller yet toward the shoulder or gauge region 557. For example, from a large side rake angle 542 of about eleven degrees (11°) at the cutter 532, to a side rake angle 543 of about ten degrees (10°) at cutter 533, to a side rake angle 544 of about nine degrees (9°) at cutter 534, to a side rake angle 545 of about eight degrees (8°) at cutter 535, a side rake angle 546 of about seven degrees (7°) at cutter 536, and a side rake angle 547 of about six degrees (6°) at cutter 537 in the cone region 555. In the nose region, the distribution may, for example, include a side rake angle 548 of about five degrees (5°) at cutter 538 and a side rake angle 549 of about four degrees (4°) at cutter 539. In the shoulder and gauge region, a side rake angle 551 of about three degrees (3°) might be provided at cutter 541 and others if any along the gauge (not shown). It will be understood that the side rake angles 542-551 and the distribution provided by the combination of side rake angles indicated for the cutters 532-541 of FIG. 12 are examples only and that other side rake angles and other side rake angle distributions may be provided with out departing from the scope of the invention.

Figure 13:
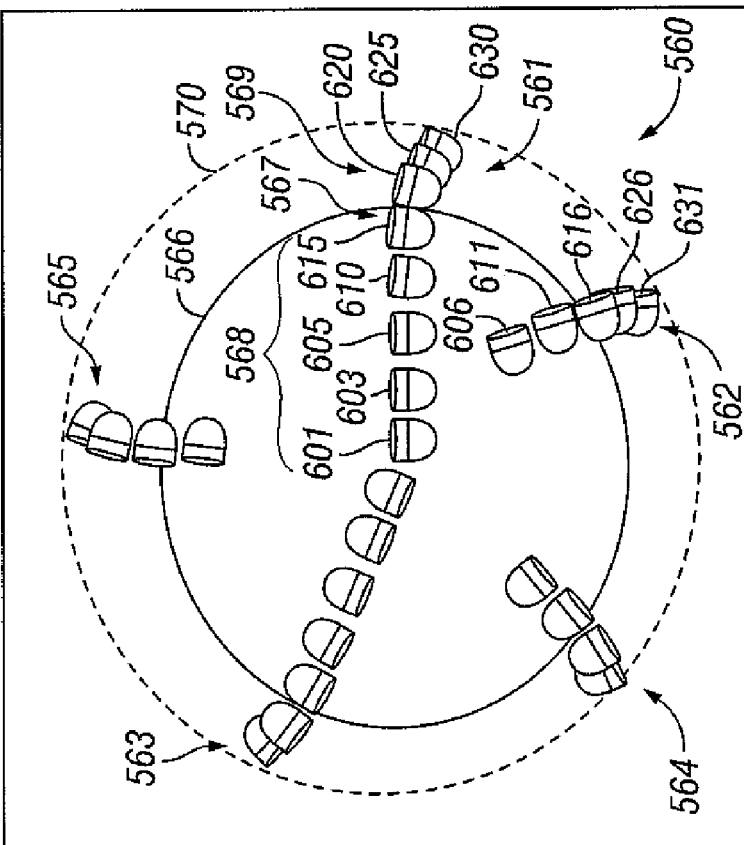
FIG. 13 shows a schematic layout of fixed cutters on an end view of a drill bit and showing the cone region of the bit and an adjacent nose region.

FIG. 13 shows a schematic end view of a drill bit 560 having a layout of a plurality of fixed cutters (601, 603, 605, 610, 615, 620, 625 and 630) on a lead blade 561, a plurality of cutters (606, 611, 616, 626 and 631) on a trailing blade 562. A plurality of cutters is also depicted on another lead blade 563 and on additional trailing blades 564 and 565. An imaginary circle 566 is generally at the nose 567 and indicates that the cone region 568 is inside of the circle 566. Outside of the circle 566 the nose region 567 joins with the shoulder 569 and the gauge 570. It has been found by the inventors that by modifying the various side rake angles of the cutters in the cone area, the nose area, and/or the shoulder area the performance of the drill bit can be improved. Indications of improved performance include a smaller dynamic centerline trajectory for the drill bit and corresponding improved stability of the drill bit when drilling in a formation. Table 1 below shows a variety of side rake angle distributions for cutters located on a drill bit in various areas or regions. An outward side rake angle (i.e., with the face of the cutter tilted outward from a tangent line) is considered a positive side rake angle and an inward side rake angle is designated with a negative number.

TABLE 1

| | Side Rake Angle Distribution (Degrees) | | | | |
|---|---|---|---|---|---|
| #1 cutter | Inner cutters | Inside of Nose | Nose Cutters | Outside of Nose | Shoulder |
| 0.0-5.0 | 4.0-5.0 | 4.0-3.0 | 3.0-2.0 | 3.0-1.0 | 2.0-0.0 |
| 0.0-15.0 | 1.0-15.0 | 1.0-15.0 | 1.0-15.0 | 1.0-15.0 | 1.0-15.0 |
| 12.0 | 10.0 | 8.0 | 5.0 | 5.0 | 3.0 |
| 5.0 | 4.0 | −1.0 | −2.0 | −3.0 | −2.0 |
| 5.0 | 5.0 | 4.0 | 2.0 | −2.0 | −2.0 |

Figure 14:
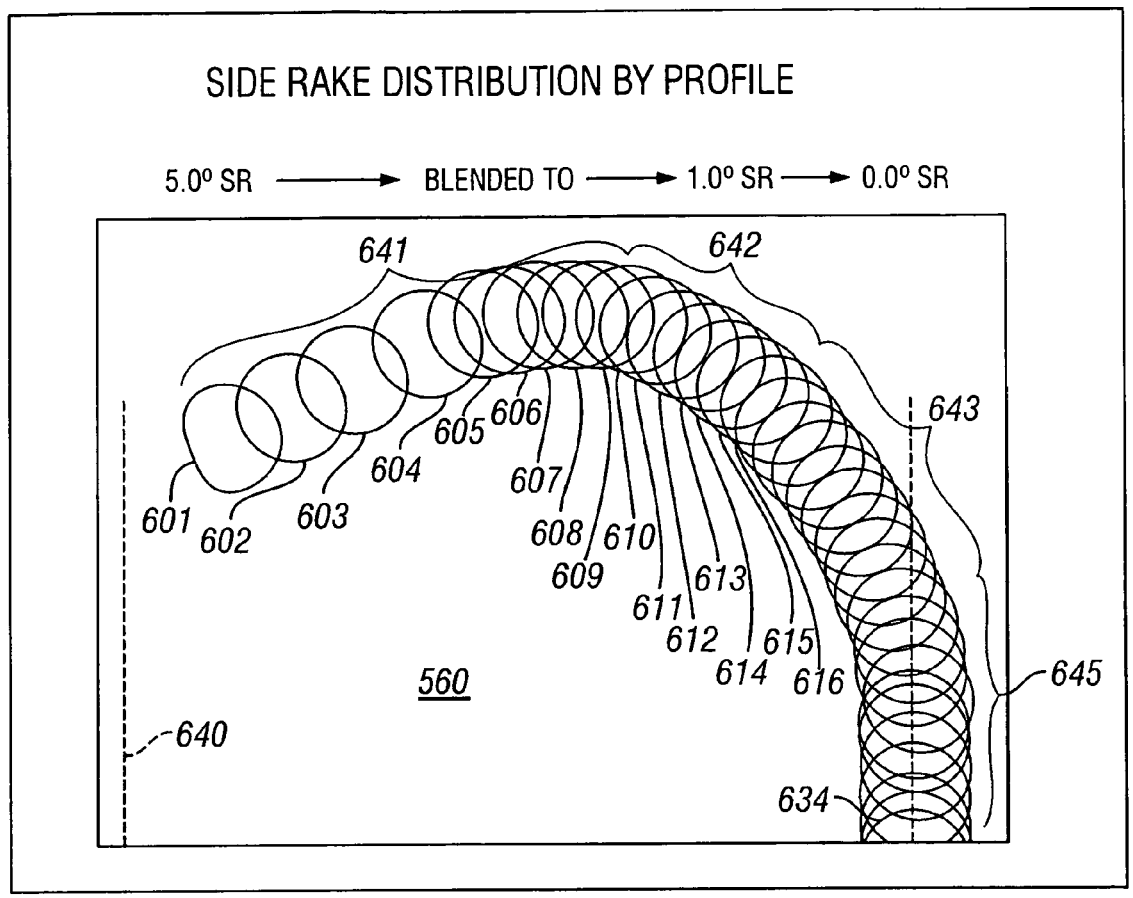
FIG. 14 shows a schematic layout of the cut profile generated across one radial plane by the rotation of the fixed cutters on the drill bit of FIG. 13.

The description above generally describes side rake angle distributions of cutters on the same blade. Some embodiments of the invention have side rake angle distributions coordinated among cutters on different blades. FIG. 14 shows a schematic layout of the cutter alignments when all the blades are superimposed. The profile is one that might be generated across one radial plane by the rotation of the fixed cutters on the drill bit 560 of FIG. 13. As shown in FIG. 14, the side rake angle distribution of the cutters exhibits a gradual change, or "blending," of the side rake angles from the most inward cutter 601 to the most outward cutter 634. In this embodiment the cutters 601-634 effectively define a cutter profile shape including a cone region 641, a nose region 642, a shoulder region 643 and a gauge region 645. The improved side rake angle distribution includes blending in the cone section 641 of the side rake angle from five degrees (5°) side rake angle for the first cutter 601 adjacent to the central axis 640 of the cone 641 and progressively decreasing side rake angle in cutters 602-610 down to one degree (1.0°) at the nose region 642 (cutters 611-616), and further decreasing down to zero degrees (0.0°) around the shoulder region 643 and gauge region 645 of the drill bit 560. Thus the gradual change of side rake angles among the cutters is coordinated among all the blades of the drill bit 560.

Figure 15:
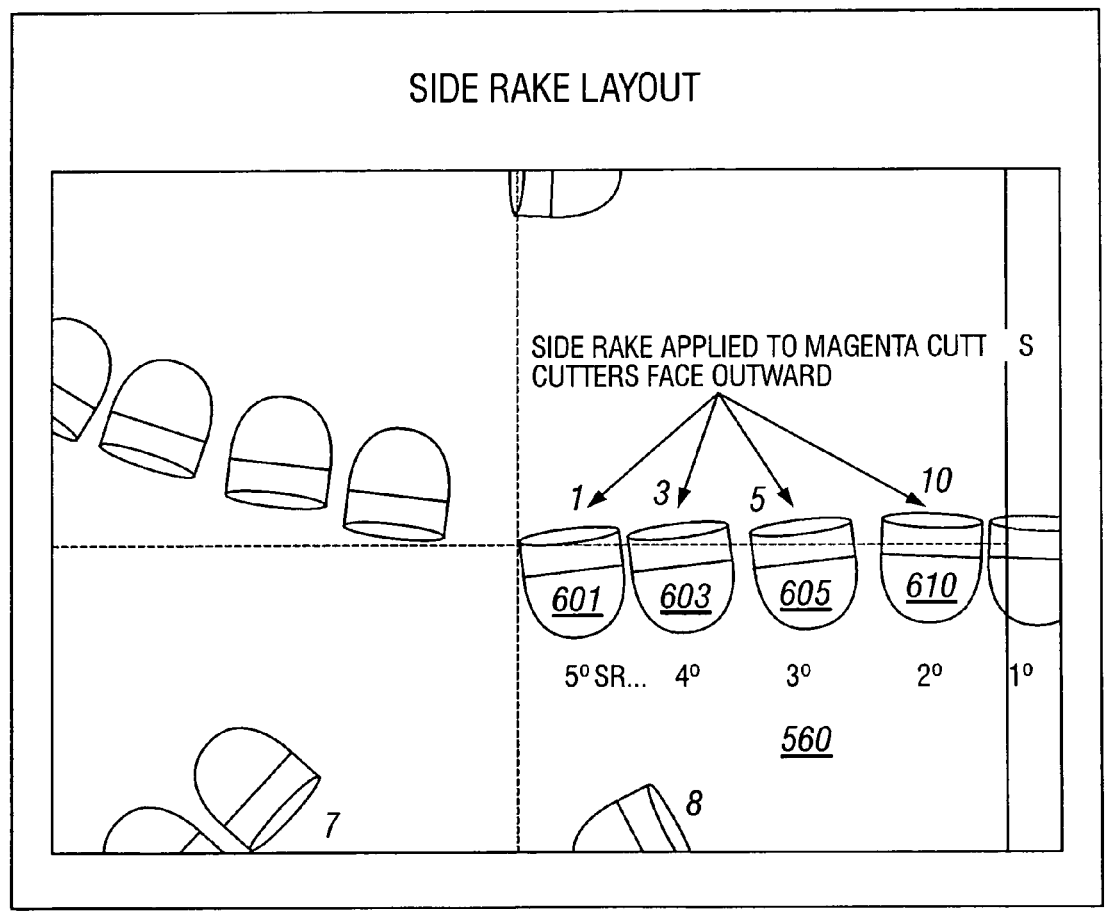
FIG. 15 shows a partial schematic end view layout of cutters on one blade having a modified side rake angle distribution applied to cutters in the cone region of the drill bit.

FIG. 15 shows a partial schematic end view layout of some of the cutters of the drill bit 560 of FIGS. 13 and 14. The cutters 601, 603, 605, and 610 are shown on a first leading blade, while cutters 602, 604, and 609 are on a leading second blade. In this embodiment the side rake angle for the cutter 602 on the second blade will be between the side rake angles for cutters 601 and 603 on the first leading blade. Similarly the side rake angle for the cutter 604 on the second leading blade will be between the side rake angles for cutters 603 and 605 on the first leading blade. For example, the cutters 601, 603, 605, and 610 have a modified side rake angle distribution of five, four, three, and two degrees (5.0°, 4.0°, 3.0°, and 2.0°) respectively, and the cutters 602 and 604 have a modified side rake angle distribution of four and one-half, and three and one-half degrees (4.5°, and 3.5°) respectively.

In other embodiments, the cutters can include higher side rake angles. A higher side rake angle can reduce the frontal impact to the cutter, reduce torque fluctuations, and may allow for more aggressive cutter geometries by reducing the cross section of earthen material in front of a cutter, reducing the fracture plane extending across the ridge being cut. The higher side rake can reduce the cut force on the face of the cutter and smooth the torque fluctuations produced by the drill bit. Additionally, higher side rake angles can present a sharper cutting edge to the formation and can lead to a higher ROP. In some embodiments, side rake angles can be greater than about 15 degrees; in other embodiments, side rake angles can be up to about 45 degrees or more. In some embodiments, a side rake angle of a cutter can be substantially up to about 90 degrees.

Referring again to FIG. 14, in some embodiments, a cutter in a cone region 641 may have a side rake angle greater than about 15 degrees and less than about 90 degrees, and a cutter in a nose region 642 may have a side rake angle smaller than the side rake angle of the cutter in the cone region 641. In other embodiments, the cutters along the cone region 641 of the blade of the fixed cutter drill bit may have a side rake angle distribution including a cutter in the cone region 641 toward the center of drill bit having a side rake angle in a range of greater than 15 degrees and up to about 45 degrees, the cutters in the nose region 642 may have side rake angles in a range of about −3 degrees to about 40 degrees, and the side rake angles of cutters in the cone region 641 between the cutters toward the center and the cutters at the nose region 642 may be blended, as described above.

Referring again to FIG. 15, in some embodiments the cutters may include side rake angles of greater than 15 degrees. For example, the cutters 601, 603, 605, and 610 may have a modified side rake angle distribution of 45, 43, 41, and 39 degrees (45.0°, 43.00, 41.0°, and 39.0°) respectively, and the cutters 602 and 604 may have a modified side rake angle distribution of 44 and 42 degrees (44.0°, and 42.0°) respectively, with side rake angles progressively decreasing through the nose, shoulder, and gauge regions.

Displaying Performance Parameters Affected by Modified Side Rake Angle Distribution As noted above, output information from a dynamic simulation of a drilling tool assembly drilling an earth formation may include, for example, the drilling tool assembly configuration (or response) obtained for each time increment, and corresponding cutting element forces, blade forces, bit forces, impact forces, friction forces, dynamic WOB, bending moments, displacements, vibration, resulting bottomhole geometry, radial and circumferential components of total imbalance forces, Beta angle between the components of the imbalance forces, side rake imbalance forces, centerline trajectory, and more. Among these, vibration, total imbalance force (TIF), Beta angle, bottom hole pattern, centerline trajectory and side rake imbalance force (SRIF) are considered sensitive to side rake angle distribution. Therefore these parameters can provide useful indication for side rake angle optimization. However, based upon the present disclosure, one of ordinary skill will appreciate that any output parameter sensitive to side rake angle changes may be used to monitor the side rake angle distribution optimization process. This output information may be presented in the form of a visual representation (indicated at 294 in FIG. 5C).

Examples of the visual representations include a visual representation of the dynamic output information for the drilling tool assembly presented on a computer screen. Usefully, the visual representation may include a historic representation of the output information over a given period of time or a given number of rotations that are calculated or otherwise obtained during the simulation. For example, a time history of the dynamic total imbalance forces, the Beta angle, the side rake imbalance forces, and the centerline trajectory over a period of time or a number of rotations during simulated drilling may be graphically displayed to a designer. The means used for visually displaying the output information simulated during drilling is a matter of convenience for the system designer, and not a limitation on the invention.

Figure 16:
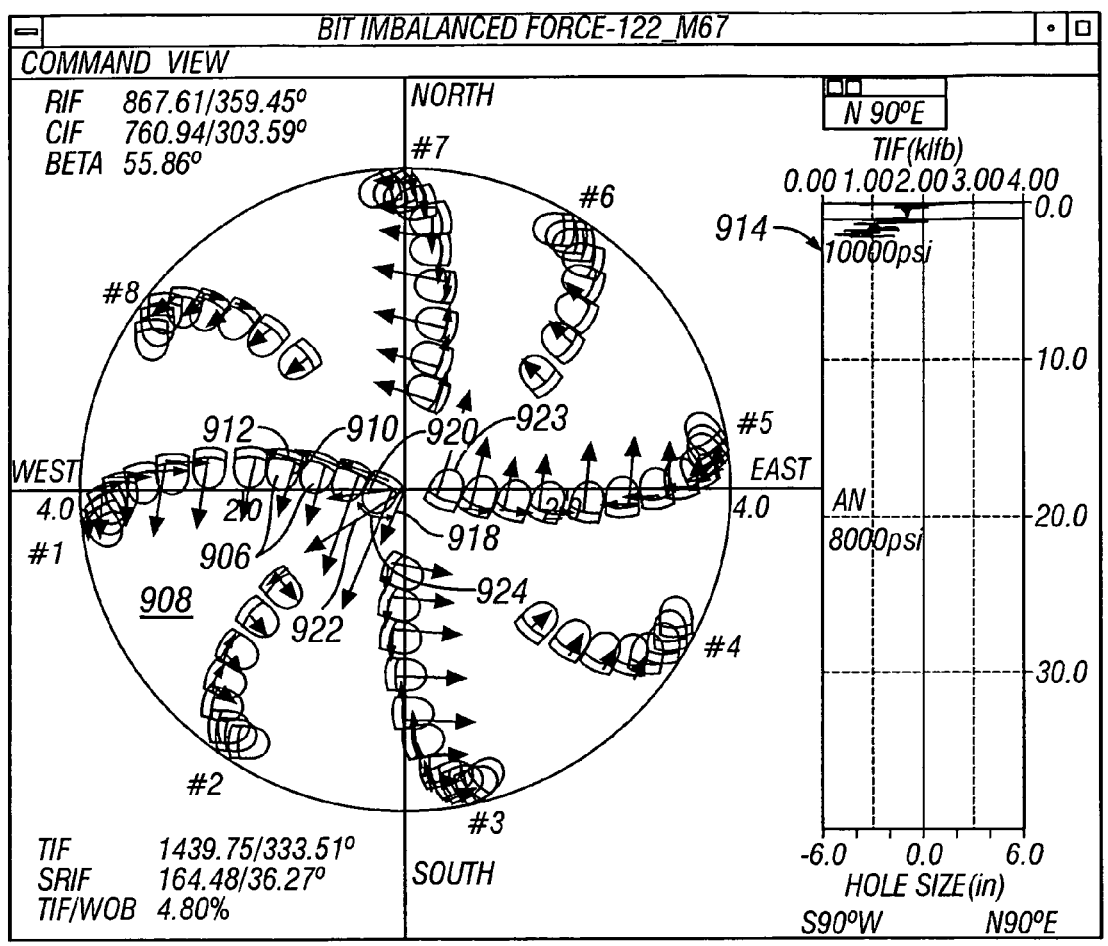
FIG. 16 shows one example of graphically displaying and modeling dynamic response of a fixed cutter drill bit drilling through different layers and through a transition between the different layers, in accordance with an embodiment of the present invention.

FIG. 16 shows a graphical depiction of various imbalance forces. As shown a plurality of cutters 906 are spatially oriented on a drill bit 908 with cutting forces 910 and radial forces 912 on each cutter. The display can be presented at increments of rotation. A sequence or rotation increments can also be displayed. As the bit 908 is sequentially rotated according to the simulation, the cutting forces 910 and the radial forces 912 on each of the individual cutters 906 will change according to the forces determined at each increment of rotation. A graphically displayed plot 914 of a selected force, for example the total imbalance force (TIF) 922, may be displayed relative to the simulated drilling depth. The components of the total imbalance force (TIF) 922 acting on the center of on the drill bit are depicted including a circumferential imbalance force vectors (CIF) 918 calculated as the vector sum of all the individual cutting forces 910, and a radial imbalance force vector (RIF) 920 calculated as the vector sum of all the individual radial forces 912 for all of the cutters 906 on the drill bit 908. A visual depiction of the Beta angle 924 between the total imbalance force components (CIF) 918 and (RIF) 920 is also graphically displayed. Similar to the computation for the CIF and the RIF, the imbalance force due to the side fake of each cutter can be computed and combined to give and to display the side rake imbalance force (SRIF) 923 for the drill bit. The side rake angle distribution may be optimized, to reduce the SRIF or one or more of the various other imbalance forces. Alternatively, one or more of the imbalance forces may be otherwise reduced to an extent possible without changing the side rake angle distribution and then the side rake angle distribution may be optimized to further reduce the same or another one of the one or more imbalance forces. Similarly, the side rake angle distribution may be optimized, to produce a Beta angle at or near 180 degrees for a larger portion of the time. Alternatively, the Beta angle at or near 180 degrees for a large portion of the time may be optimized to an extent possible without changing the side rake angle distribution and the time that the Beta angle is at or near 180 degrees.

Figure 17:
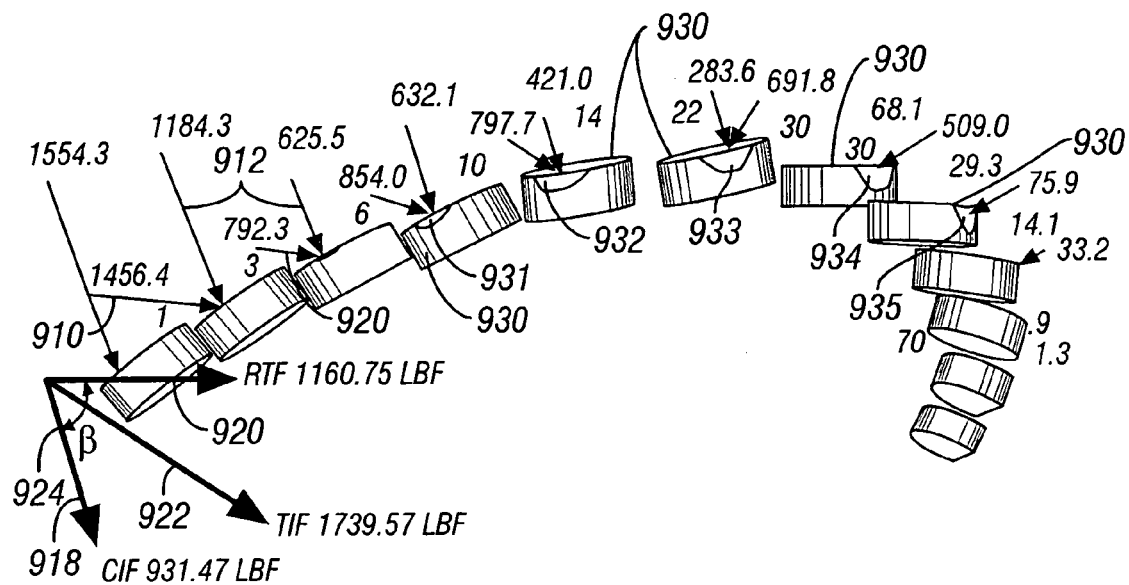
FIG. 17 shows a graphical display of a group of worn cutters illustrating different extents of wear on the cutters in accordance with an embodiment of the invention.

FIG. 17 shows a graphical display of a group of worn cutters 930 for a single blade of a drill bit, illustrating different extents of wear, for example, at 931, 932, 933, 934, and 935 on the cutters 930 in accordance with an embodiment of the invention. Being able to model the wear of the cutting elements (cutters) and/or the bit accurately makes it possible to design a fixed cutter bit to achieve the desired wear characteristics. In addition, it has been found that the demand of computing power and speed can be reduced by using wear modeling conducted in a static or constrained centerline model and then inserting the wear data into a dynamic model at the appropriate times for use during a dynamic drilling modeling to update the drill bit parameters according to the simulated wear predicted with the simpler static wear model. Inventors have found that this can significantly improve the speed of the dynamic modeling computations without significantly reducing the accuracy of the drilling simulation because the wear rates and results are similar for both constrained centerline analysis and for dynamic analysis.

Graphically Displaying Results of Modeling and Simulation

According to one aspect of the invention output, information from the modeling may be presented in the form of a visual representation.

Other exemplary embodiments of the invention include graphically displaying results of the modeling or simulation of the performance of the fixed cutter drill bit, the performance of the cutters, or performance characteristics of the fixed cutter drill bit drilling in an earth formation. Graphically displaying the drilling performance may be further enhanced by also displaying input parameters.

Figure 18:
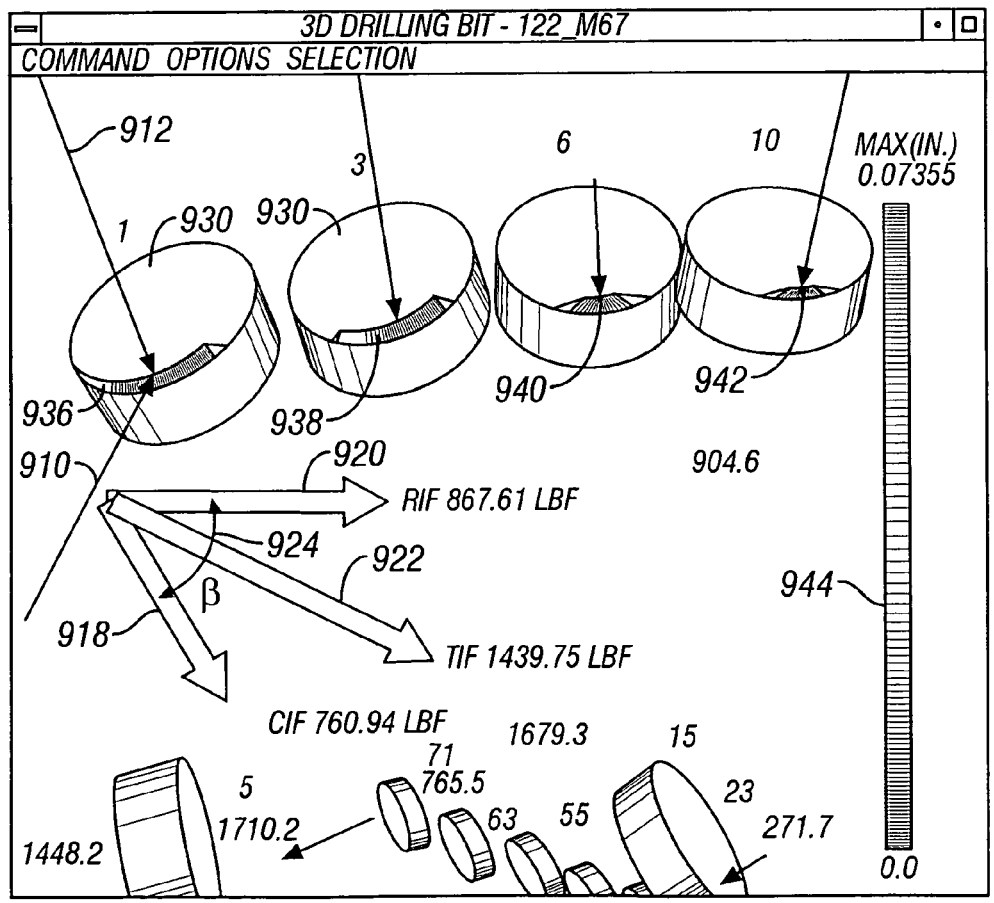
FIG. 18 shows an example of modeling and of graphically displaying performance of individual cutters of a fixed cutter drill bit, for example cut area shape and distribution, together with performance characteristics of the drill bit, for example imbalance force vectors, and Beta angle between the components in accordance with an embodiment of the present invention.

FIG. 18 shows an example of modeling and of graphically displaying performance of individual cutters 930 of a fixed cutter drill bit, for example cut area shape and distribution, together with performance characteristics of the drill bit, for example total imbalance force 922, and Beta angle 924 between the circumferential and radial components 918 and 920, respectively, in accordance with an embodiment of the present invention.

According to one alternative embodiment, FIG. 18 also shows an example of modeling and of graphically displaying performance of individual cutters of a fixed cutter drill bit, for example cut area shapes 936, 938, 940, and 942 and distribution of loading represented by a color coding, shown here as a the gray scale, at 944, together with performance characteristics of the drill bit, and in particular components of a total imbalance force vector (TIF) at 922, including radial imbalance force vector component (RIF) at 920 and the circumferential imbalance force vector component (CIF) at 918 of the total imbalance force. The Beta angle 924 between the forces components applied to the center of the drill bit is also depicted. In accordance with one embodiment the Beta angle 924 is presented as a performance parameter that can be visually observed by the design engineer to get a feel for the effect of any adjustments made to the drill bit design parameters (e.g., side rake angle distributions). The magnitude of the forces and the directions are visually displayed. The components of imbalance forces and the components of the forces may also be displayed in a time sequence depiction to help visualize the duration of the Beta angle remaining at or above a given level for a portion of the simulated drilling time. The design engineer can select any portion of the possible information to be provided visually in such graphical displays. For example, an individual cutter can be selected; it can be virtually rotated and studied from different orientations. The design parameters (e.g., side rake angles) of individual cutters can be adjusted and the simulation repeated to provide another graphical display. The adjustment can be made to change the performance characteristics. The adjustments can also be made, repeatedly if necessary, to optimize a parameter or a plurality of parameters of the design for an optimum resultant Beta angle and duration of the Beta angle at or near 180 degrees.

Figure 19:
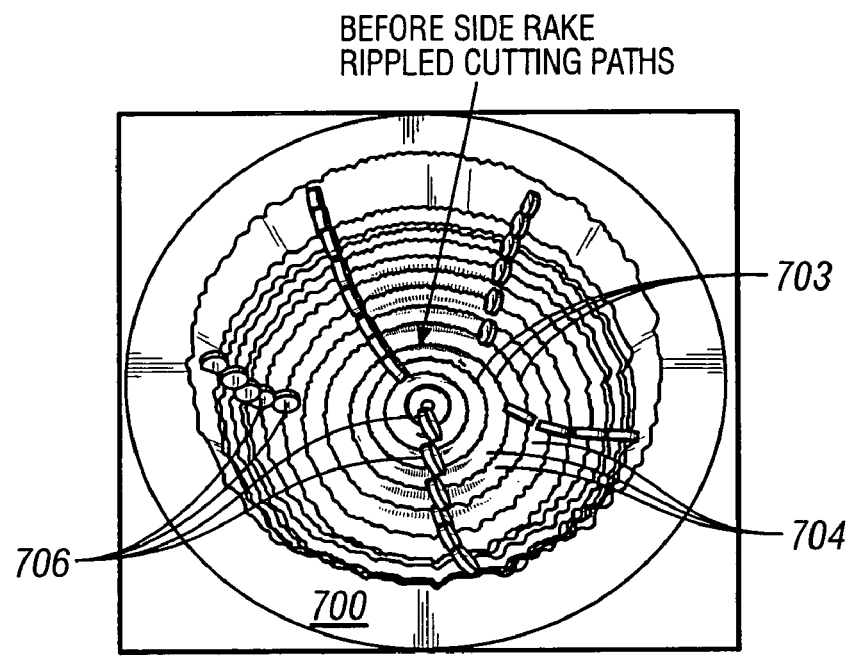
FIG. 19 shows a historic graphical plot of a side rake imbalance forces simulated according to a typical side rake angle distribution that is not optimum.

FIG. 19 shows a bottom hole cutting pattern 700 simulated with a drill bit, in which the side rake angle distribution is not optimum, as for example the drill bit depicted in FIG. 11 above. It is observed that over a period of simulated drill bit revolutions the bottom hole pattern 700 has chatter marks 702 along the various cut paths 704 made by the series of cutters 706. The rough cutting pattern can indicate instability of the drill bit and a decreased rate of penetration. The smoothness and uniformity of the bottom hole pattern is not optimized and thus the side rake angle distribution that produced this simulated bottom hole pattern is not optimum.

Figure 20:
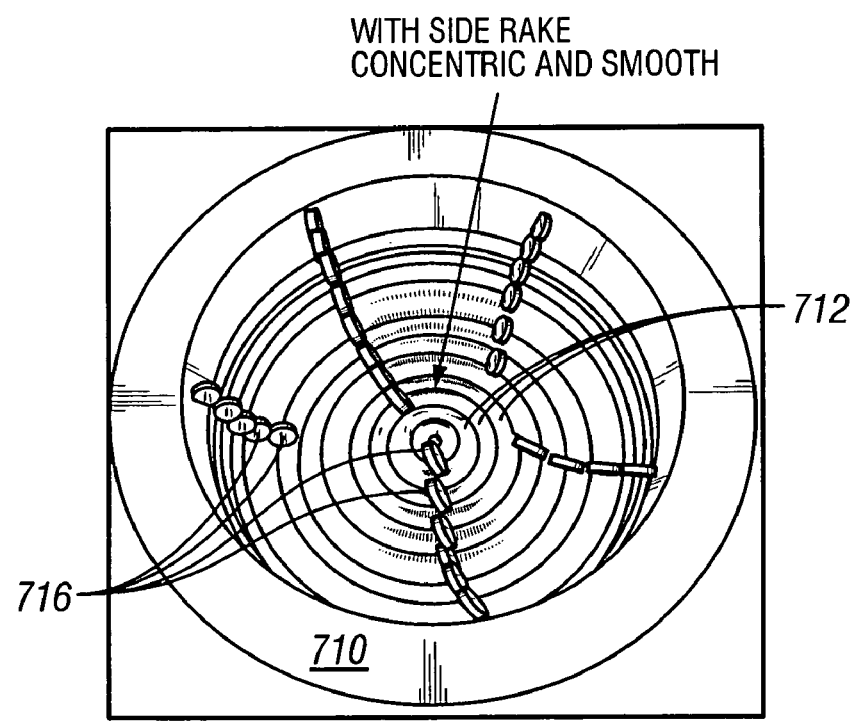
FIG. 20 shows a historic graphical plot of a side rake imbalance forces simulated according to an improved side rake angle distribution according to one embodiment of the invention.

FIG. 20 shows a bottom hole cutting pattern 710 simulated with a drill bit, in which the side rake angle distribution according to one embodiment of the invention, as for example one of the side rake angle distributions shown in FIGS. 12, 13, 14, 15, or in Table 1 above. It is observed that over a period of simulated drill bit revolutions the bottomhole pattern 710 has smooth, uniform, concentric circular trough-shaped cutting paths 712 made by the series of cutters 716. The smooth, uniform cutting pattern 710 can indicate stability of the drill bit and an increased rate of penetration. The smoothness and uniformity of the bottom hole pattern might be considered optimized such that a side rake distribution might be considered optimized based upon observation of this performance parameter.

Figure 21:
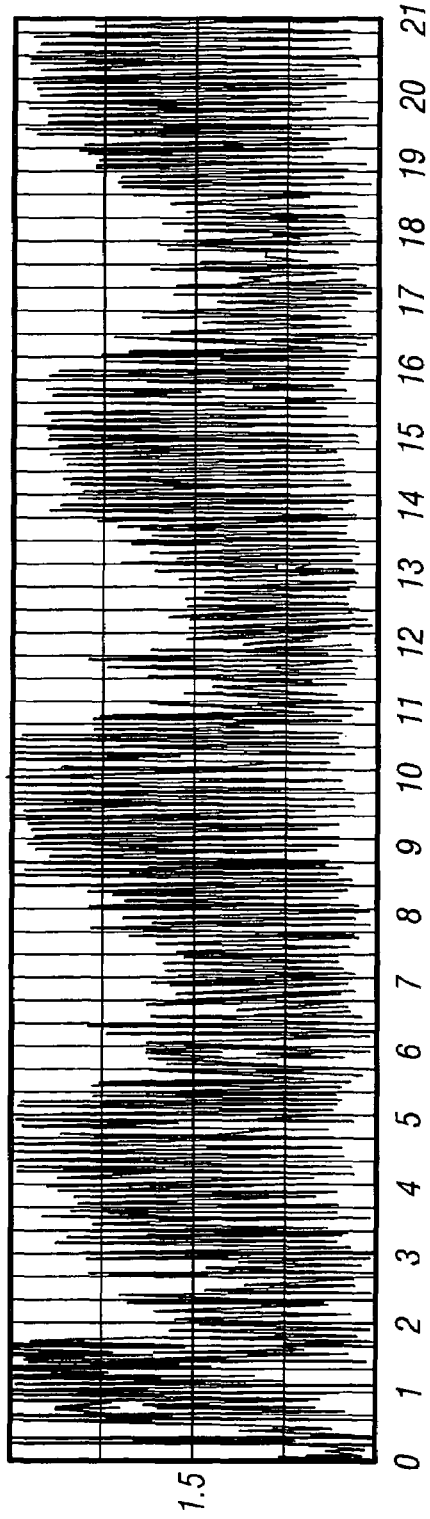
FIG. 21 shows a bottom hole cutting pattern simulated according to a typical side rake angle distribution that is not optimum.

FIG. 21 shows a historic graphical plot of side rake imbalance forces (SRIF) simulated with a drill bit having a typical side rake angle distribution, as for example the side rake distribution depicted in FIG. 11 above. The SRIF may be computed in a similar manner to the calculations of CIF and RIF (circumferential and radial components of imbalance force). Each cutter has an effective side rake because of the cut shape imposed on the cuter by the bottom hole geometry created by cut path overlap. This means that even if a cutter is assembled on the profile and is defined to have 0.0 degrees side rake at the assembly tip point, the cutter may generate some side cutting force because of the interference pattern generated. Thus for each cutter, the side force can be computed at 0.0 degrees side rake or at any other side rake angle set for individual cutters and then the vector total for all the cutters can be calculated to give the SRIF for the drill bit. It is observed that over a period of simulated drill bit revolutions, the SRIF varies significantly and has cyclically high values that can indicate instability of the drill bit. The performance parameter SRIF is not optimized and thus the side rake angle distribution of this drill bit is not optimum.

Figure 22:
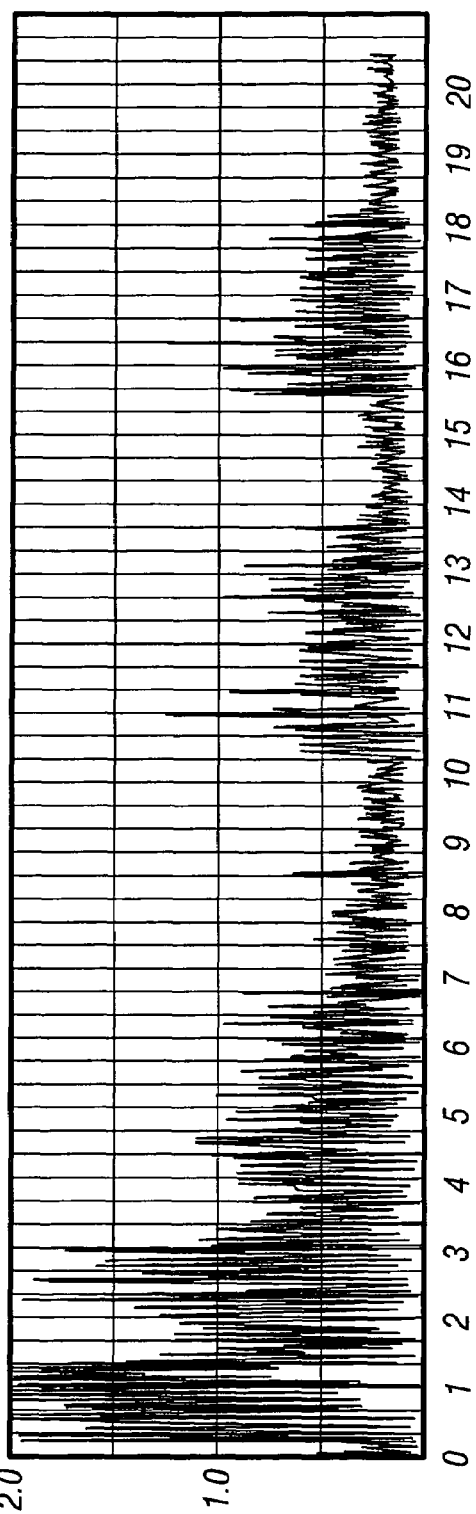
FIG. 22 shows a bottom hole cutting pattern simulated according to an improved side rake angle distribution according to one embodiment of the invention.

FIG. 22 shows a historic graphical plot of side rake imbalance forces (SRIF) simulated with a drill bit having an improved side rake angle distribution according to one embodiment of the invention, as for example one of the side rake angle distributions shown in FIGS. 12, 13, 14, 15, or in Table 1 above. It is noted that the SRIF stabilize after a few simulated revolutions of the drill bit to a consistent and relatively low values. Such a side rake angle distribution might be considered optimized based upon observation of this performance parameter.

Figure 23:
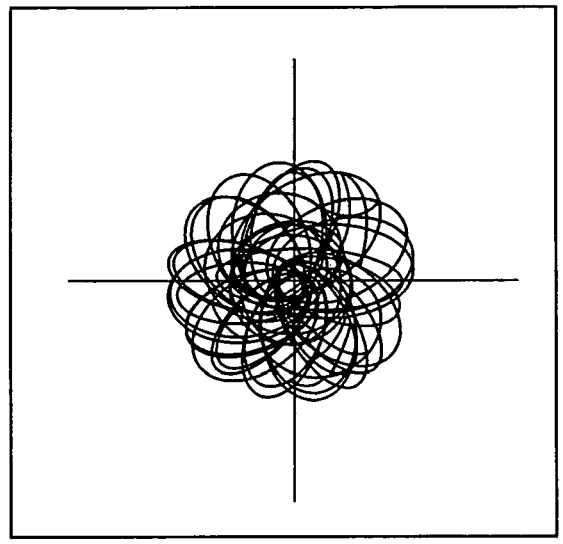
FIG. 23 shows a centerline trajectory pattern simulated according to a typical side rake angle distribution that is not optimum.

FIG. 23 shows a centerline trajectory pattern simulated with a drill bit having a typical side rake angle distribution that is not optimum, as for example the side rake distribution depicted in FIG. 11 above. It is observed that over a period of simulated drill bit revolutions, the centerline trajectory varies significantly and the trajectory pattern has relatively large diameter that can indicate side impact with the bore hole, alternating imbalance forces and instability of the drill bit. The centerline trajectory as a performance parameter is not optimized and thus the side rake angle distribution that produces such a trajectory is not optimum.

Figure 24:
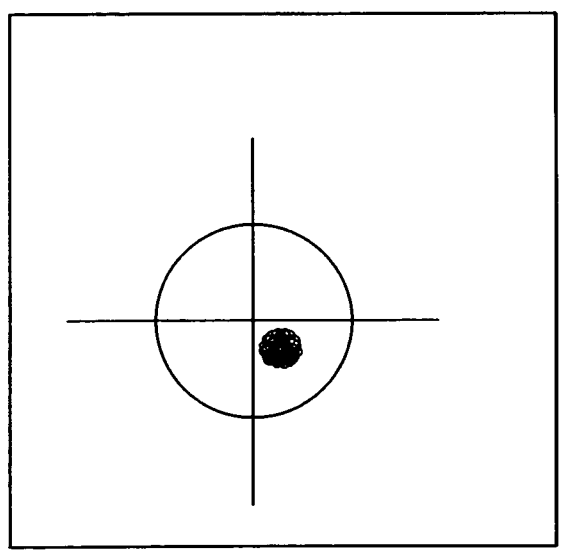
FIG. 24 shows a centerline trajectory pattern simulated according to an improved side rake angle distribution according to one embodiment of the invention.

FIG. 24 shows a centerline trajectory pattern simulated with a drill bit having an improved side rake angle distribution according to one embodiment of the invention as for example one of the side rake angle distributions shown in FIGS. 12, 13, 14, 15, or in Table 1 above. It is noted that over a period of simulated drill bit revolutions, the centerline trajectory does not vary significantly and the trajectory pattern has a relatively small total diameter that can indicate stability of the drill bit. The centerline trajectory as a performance parameter could be considered as optimized and thus the side rake angle distribution that produces such a trajectory might be considered optimized based upon observation of this performance parameter.

Figure 25:
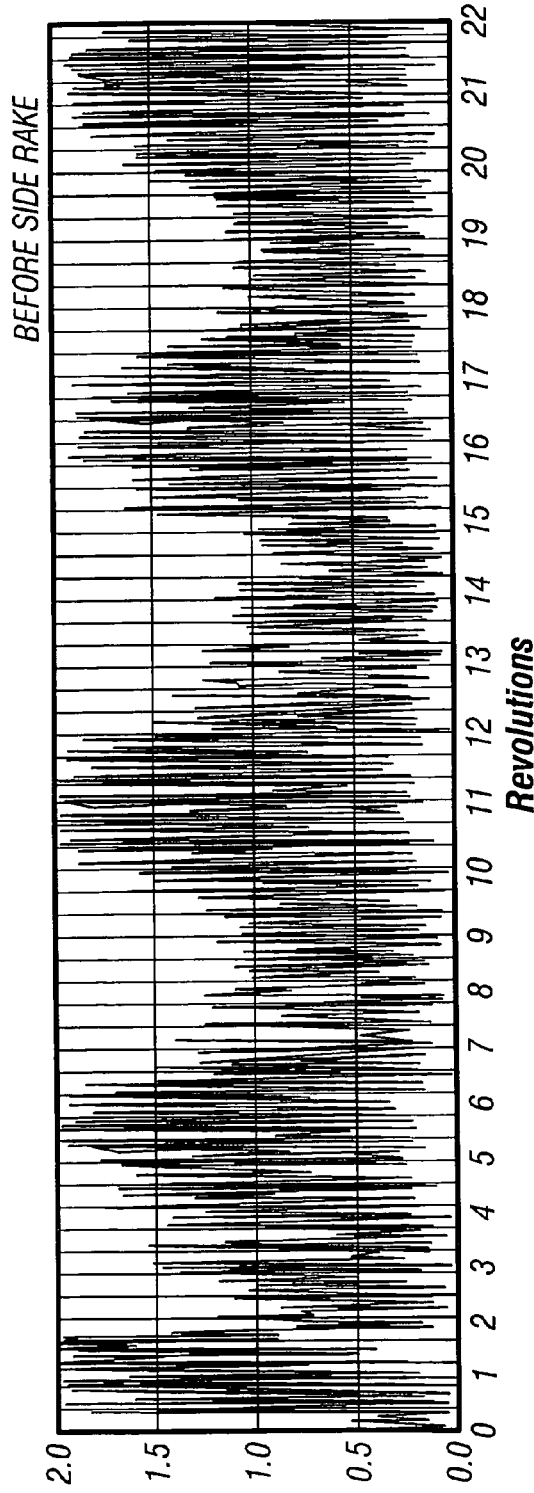
FIG. 25 shows a historic graphical plot of total imbalance forces simulated according to a typical side rake angle distribution that is not optimum.

FIG. 25 shows a historic graphical plot of total imbalance forces (TIF) simulated with a drill bit having a typical side rake angle distribution that is not optimum, as for example the side rake distribution depicted in FIG. 11 above. It is observed that over a period of simulated drill bit revolutions the TIF vary significantly and have cyclically high values that can indicate instability of the drill bit. The performance parameter TIF is not optimized and thus the side rake angle distribution that produces such a TIF plot is not optimum.

Figure 26:
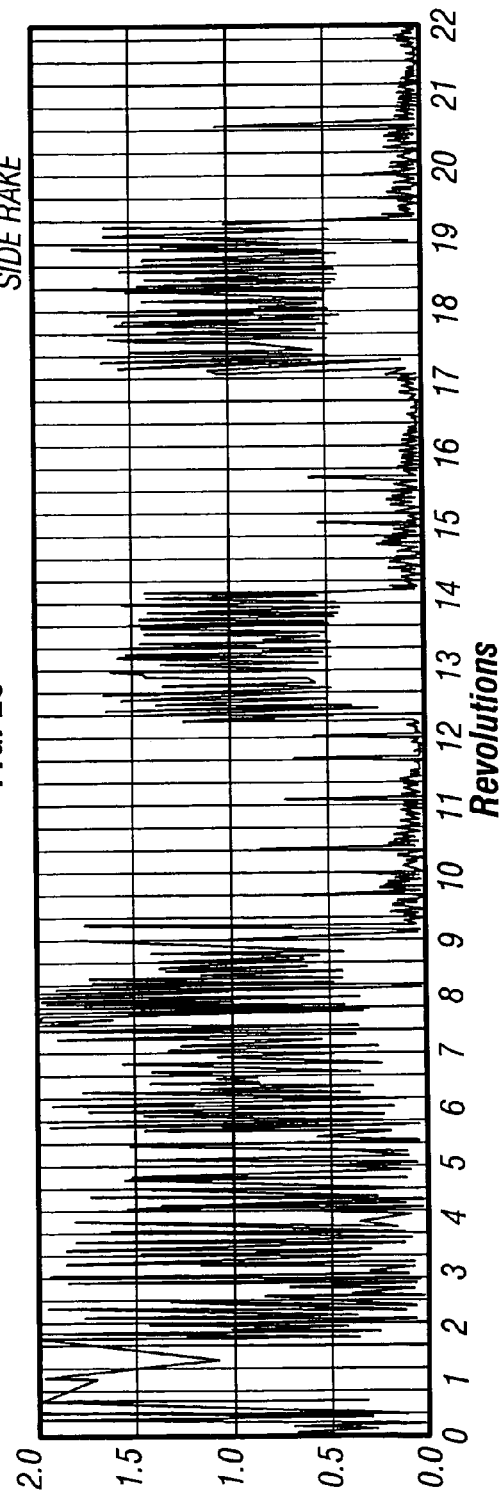
FIG. 26 shows a historic graphical plot of a total imbalance forces simulated according to an improved side rake angle distribution according to one embodiment of the invention.

FIG. 26 shows a historic graphical plot of TIF simulated with a drill bit having an improved side rake angle distribution according to one embodiment of the invention, as for example one of the side rake angle distributions shown in FIGS. 12, 13, 14, 15, or in Table 1 above. It is noted that the TIF are minimized during many of the simulated revolutions of the drill bit, the peak TIF are relatively low and there are relatively few peaks. Such a side rake angle distribution might be considered optimized based upon observation of this performance parameter.

Figure 27:
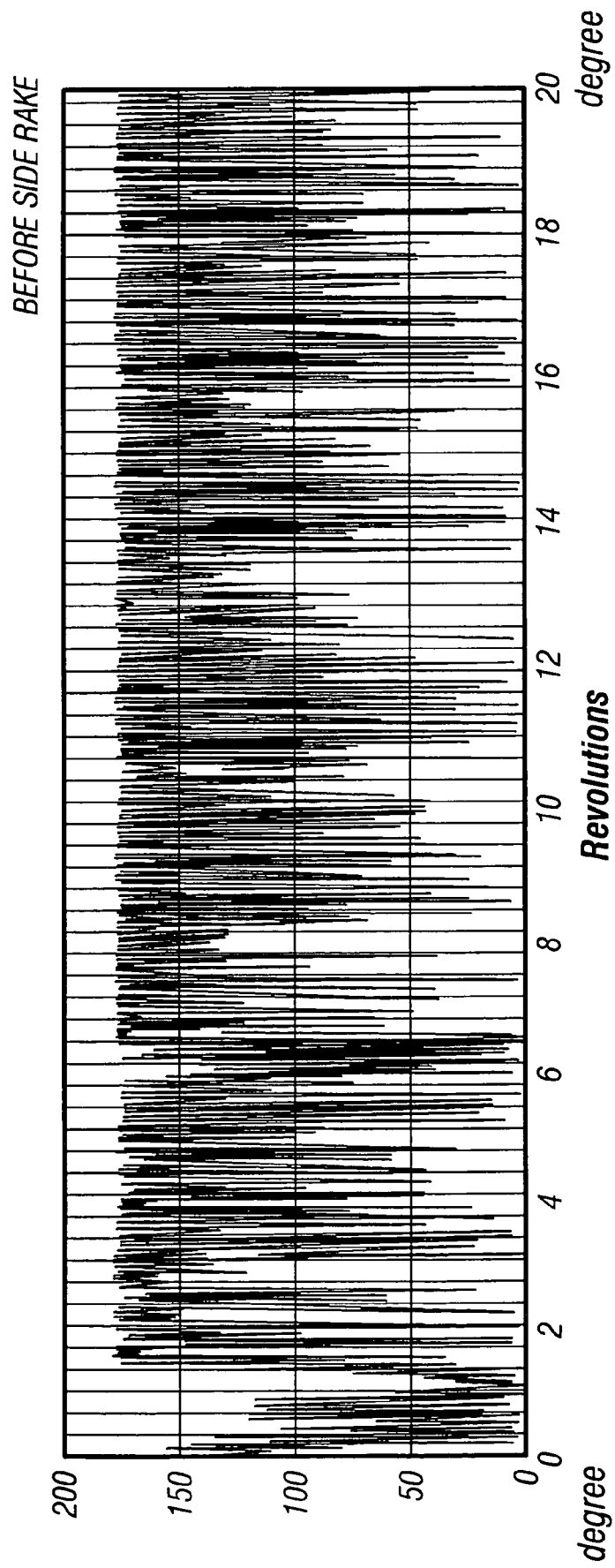
FIG. 27 shows a historic graphical plot of a Beta angle between the circumferential and the radial components of the total imbalance forces simulated according to a typical side rake angle distribution that is not optimum.

FIG. 27 shows a historic graphical plot of Beta angles between the circumferential and the radial components of the total imbalance forces simulated with a drill bit having a typical side rake angle distribution that is not optimum, as for example the side rake distribution depicted in FIG. 11 above. It is observed that over a period of simulated drill bit revolutions the Beta angles vary significantly, and during a significant percentage of the time the Beta angles are not at or near 180 degrees. The Beta angle plot as a performance parameter is not optimized and thus the side rake angle distribution that produces such a Beta angle plot is not optimum.

Figure 28:
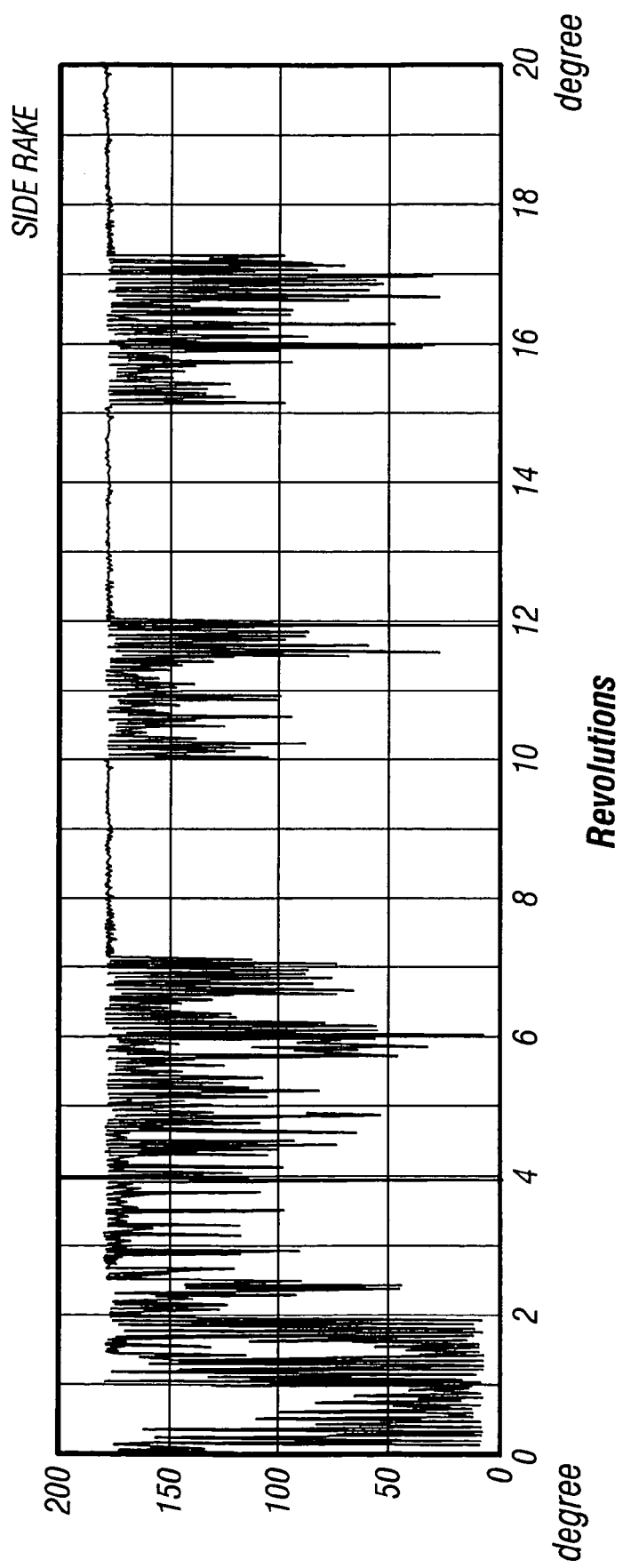
FIG. 28 shows a historic graphical plot of a Beta angle between the circumferential and the radial components of the total imbalance forces simulated according to an improved side rake angle distribution according to one embodiment of the invention.

FIG. 28 shows a historic graphical plot of Beta angles between the circumferential and the radial components of the total imbalance forces simulated with a drill bit having an improved side rake angle distribution according to one embodiment of the invention, as for example one of the side rake angle distributions shown in FIGS. 12, 13, 14, 15, or in Table 1 above. It is observed that over a period of simulated drill bit revolutions the Beta angles are maintained at or near 180 degrees during a significant period of the simulated drilling time. The Beta angle plot as a performance parameter may be considered optimized and thus the side rake angle distribution that produces such a Beta angle plot may be considered optimized.

The above examples of how graphical displays of several performance parameters may be used to design drill bits having improved side rake angle distributions. One of ordinary skill in the art will appreciate from the present disclosure that other performance parameters may be similarly used to improve the side rake angle distributions of a drill bit.

Designing Fixed Cutter Bits

A fixed cutter drill bit designed by the methods of one or more of the various embodiments of the invention has been found to have improved performance.

In one or more embodiments in accordance with the method shown in FIG. 29, bit design parameters are selected at 1152 and may include the number of cutters on the bit, cutter spacing, cutter location, cutter orientation, cutter height, cutter shape, cutter profile, cutter diameter, cutter bevel size, blade profile, bit diameter, etc. and others of a type that may subsequently be altered by the design engineer. These are only examples of parameters that may be adjusted. A drill bit having those selected parameters is simulated drilling an earth formation at 1154. At 1153 one or more performance indicating parameters such as the total imbalance force, the radial components and circumferential components of the total imbalanced force, the Beta angle between the component forces over a period of time, the bottom hole pattern, the dynamic trajectory of the centerline of the drill bit, and/or the side rake imbalance forces determined during a simulated period of drilling. Selected design parameters including the side rake angle distribution may be altered at step 1156 in the design loop 1160. Additionally, bit design parameter adjustments may be entered manually by an operator after the completion of each simulation or, alternatively, may be programmed by the system designer to automatically occur within the design loop 1160. For example, one or more selected parameters may be incrementally increased or decreased within a selected range of values for the iteration of the design loop 1160. The method used for adjusting bit design parameters is a matter of convenience for the system designer. Therefore, other methods for adjusting parameters may be employed as determined by the system designer. Thus, the invention is not limited to a particular method for adjusting design parameters.

In alternative embodiments, the method for designing a fixed cutter drill bit may include repeating the adjusting of at last one drilling parameter and the repeating of the simulating the bit drilling a specified number of times or, until terminated by instruction from the user. In these cases, repeating the "design loop" 1160 (i.e., the adjusting the bit design and the simulating the bit drilling) described above can result in a library of stored output information which can be used to analyze the drilling performance of multiple bits designs in drilling earth formations and a desired bit design can be selected from the designs simulated.

An optimal set of bit design parameters may be defined as a set of bit design parameters which produces a desired degree of improvement in drilling performance, in terms of rate of penetration, cutter wear, optimal axial force distribution between blades, between individual cutters, and/or optimal lateral forces distribution on the bit. For example, in one case, a design for a bit may be considered optimized when the resulting lateral force on the bit is substantially zero or less than 1% of the weight on bit.

Figure 29:
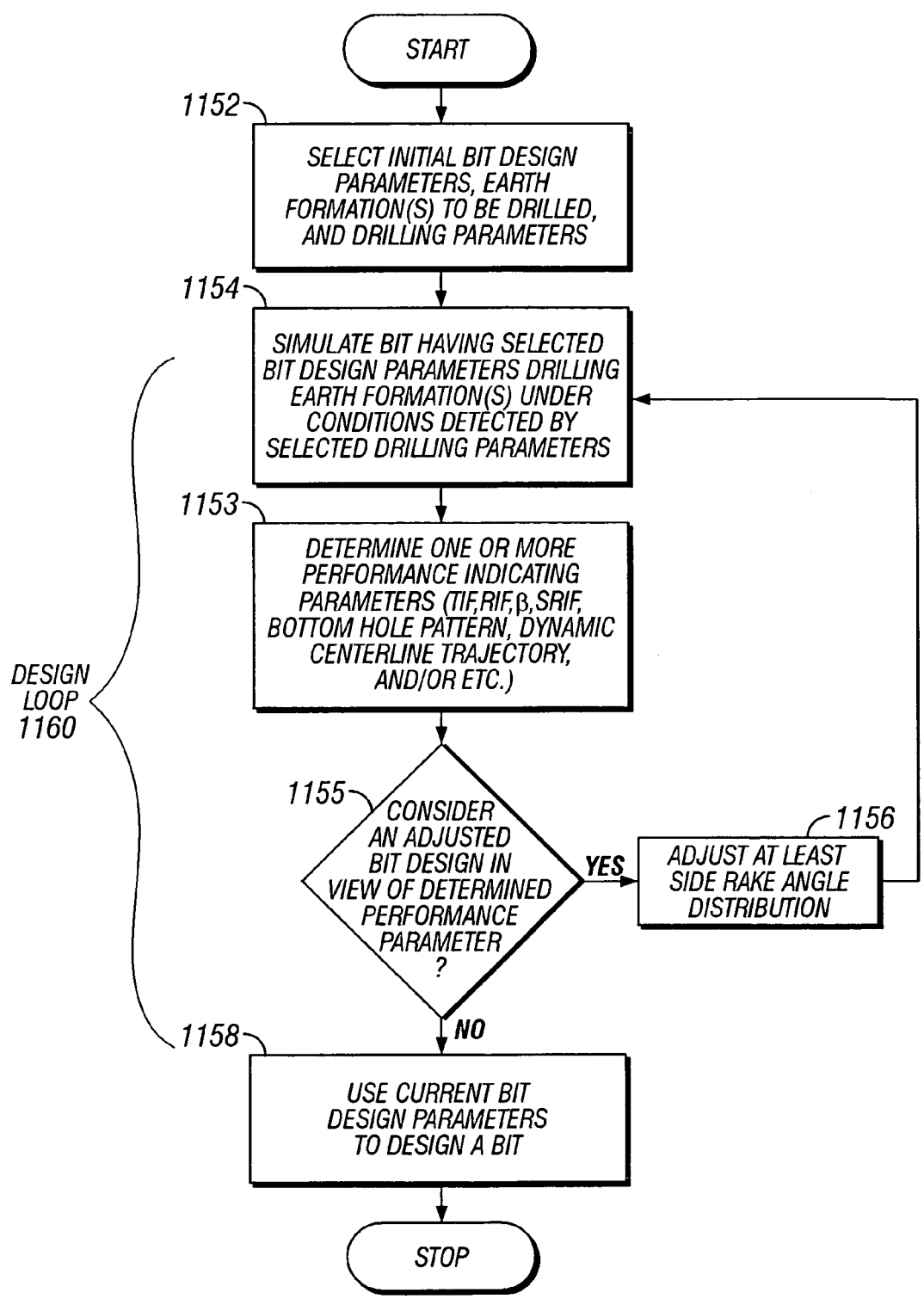
FIG. 29 shows a flow diagram of an example of a method for optimizing a drill bit design by simulating, graphically displaying, adjusting, designing, and making a fixed cutter drill bit in accordance with an embodiment of the present invention.

In one or more other embodiments, the method may be modified to adjust selected drilling parameters and consider their effect on the drilling performance of a selected bit design, as illustrated in FIG. 29. Similarly, the type of earth formation being drilled may be changed and the simulating repeated for different types of earth formations to evaluate the performance of the selected bit design in different earth formations. These methods may be used to design and evaluate a bit design having optimized side rake distributions for various formations and/or drilling conditions.

As set forth above, one or more embodiments of the invention can be used as a design tool to optimize the performance of fixed cutter bits drilling earth formations. One or more embodiments of the invention may also enable the analysis of drilling characteristics for proposed bit designs prior to the manufacturing of bits, thus, minimizing or eliminating the expensive of trial and error designs of bit configurations. Further, the invention permits studying the effect of bit design parameter changes on the drilling characteristics of a bit and can be used to identify bit designs which exhibit desired drilling characteristics. Further, use of one or more embodiments of the invention may lead to more efficient designing of fixed cutter drill bits having enhanced performance characteristics.

Example Alternative Embodiments

Figure 30:
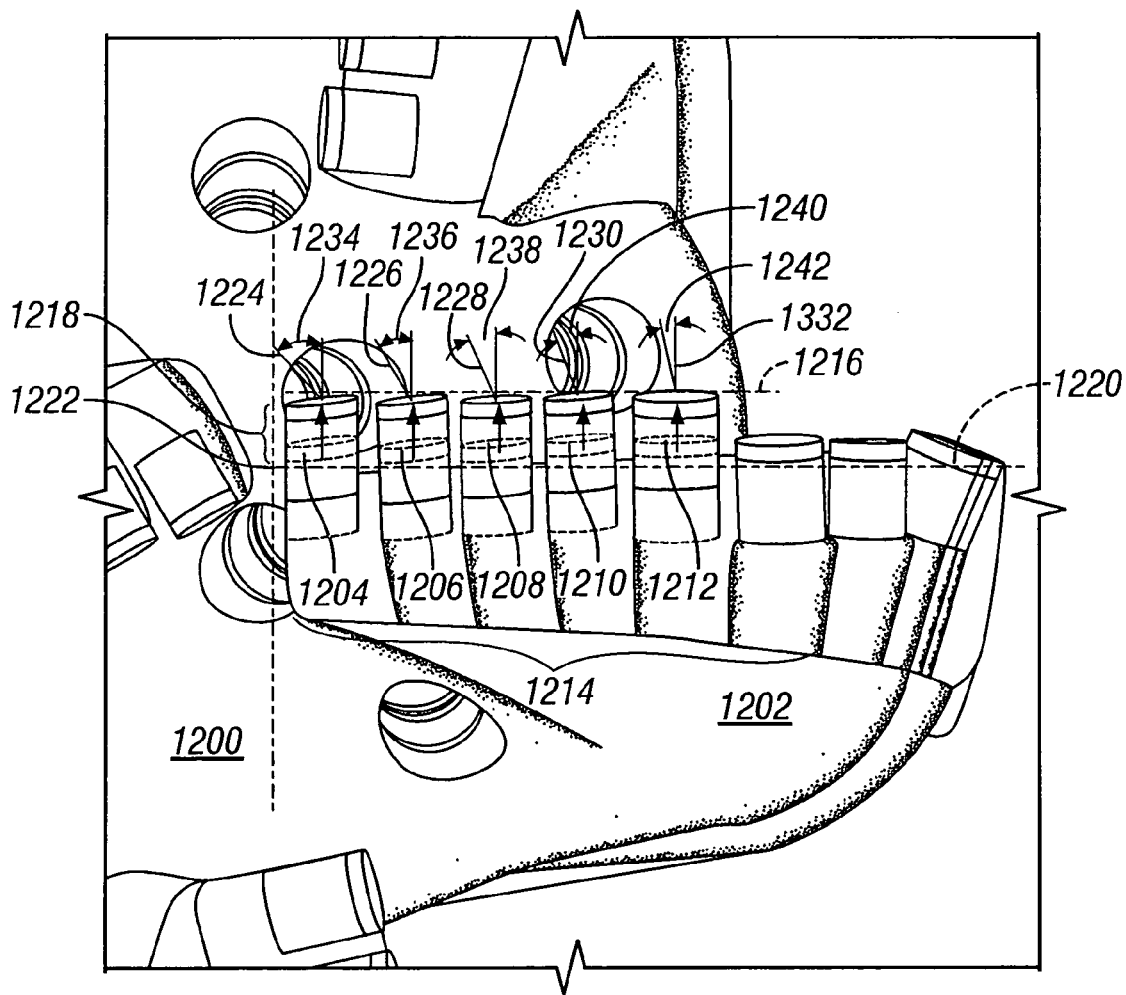
FIG. 30 shows a partial end view of a fixed cutter bit with an alternative modification of the distribution of side rake angles along one exemplary blade having cutters in the cone region that are normal to a vertical plane through the centerline of the bit and moving the cutter faces forward of the normal plane to modify the side rake angle distribution and thereby improve performance according to one embodiment of the invention.

FIG. 30 shows a partial end view of a fixed cutter bit 1200 with an alternative modification of the distribution of side rake angles along one exemplary blade 1202 having cutters 1204, 1206, 1208, 1210, and 1212 in a cone region 1214 that are positioned with their faces 1216 parallel to a radial plane 1220 through the centerline 1222 of the bit 1200. By moving the cutters 1204, 1206, 1208, 1210, and 1212 forward of the radial plane 1220 without tilting the cutters, the faces 1216 continue to be parallel to the radial plane 1220. However the offset distance 1218 causes the tangent lines 1224, 1226, 1228, 1230 and 1232 at the face of each cutter 1204, 1206, 1208, 1210, and 1212 to be at a different side rake angle 1234, 1236, 1238, 1240 and 1242, respectively, relative to the centerlines of each cutter. Thus, the side rake angle for each cutter is different and relatively larger at the center cutter 1204 and relatively smaller at cutter 1212. This shows an alternative way to modify the side rake angle distribution. This alternative method is useful for modifying the side rake angle distribution of drill bits that are already designed, by repositioning the cutters forward within existing cutter holding sockets and thereby improving performance.

Figure 31:
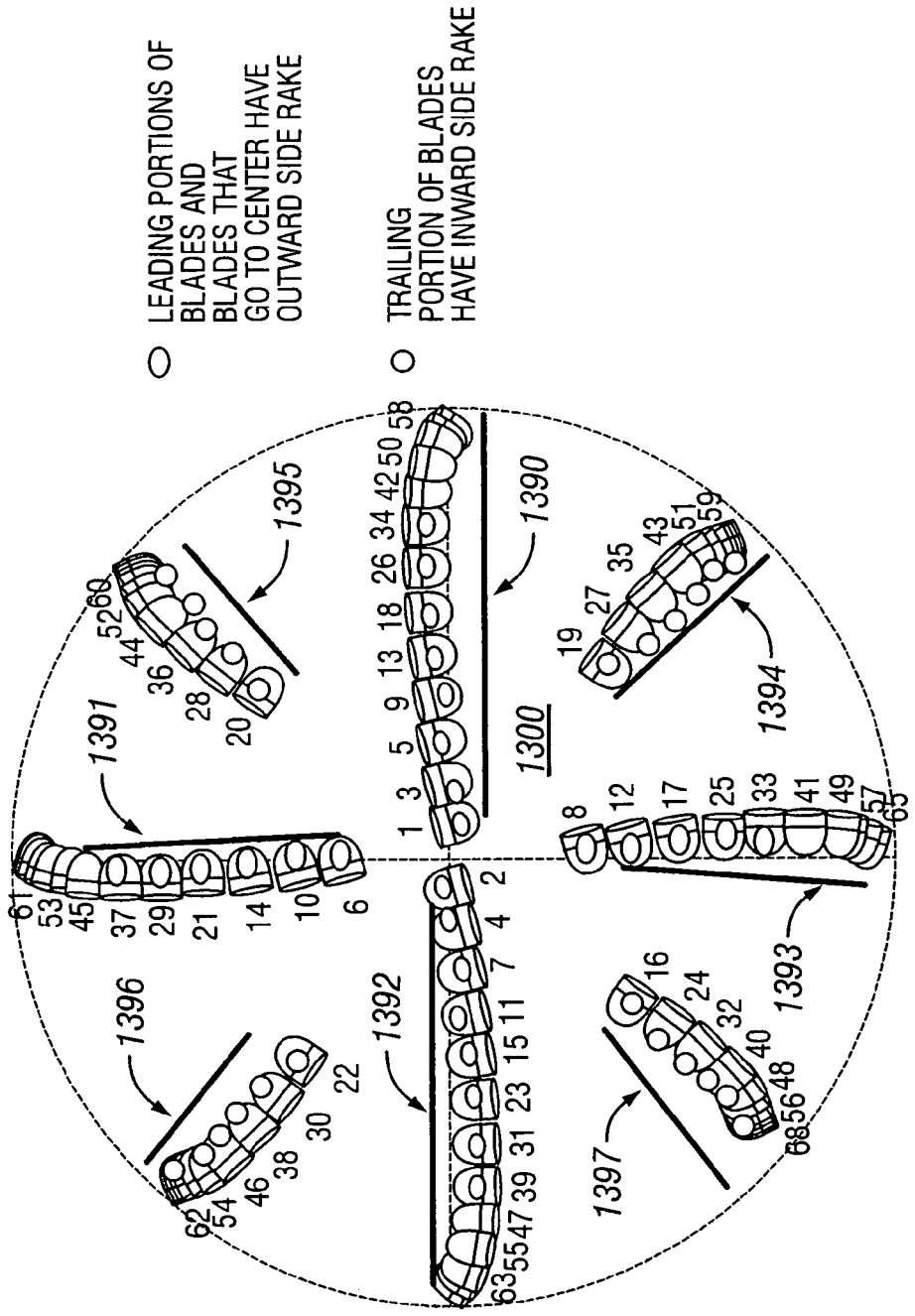
FIG. 31 shows a schematic end view layout of fixed cutters both on leading blades and on trailing blades of a drill bit and showing alternative side rake angle distributions on the leading blades and different distributions on the trailing blades

FIG. 31 shows a schematic end view of a dual set fixed cutter drill bit 1300 showing a layout of fixed cutters 1-88 both on leading blades 1390, 1391, 1392 and 1393 and on trailing blades 1394, 1395, 1396 and 1397 of a drill bit and showing alternative side rake angle distributions with outward side rake angles distributed along the cone regions of the leading blades 1390, 1391, 1392 and 1393 and inward side rake angles distributed along the cone regions of the trailing blades 1394, 1395, 1396 and 1397.

In one or more embodiments, the method described above is embodied in a computer program and the program also includes subroutines for generating a visual displays representative of the performance of the fixed cutter drill bit drilling earth formations.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A drill bit comprising cutters positioned along a blade of the drill bit in a cone region and cutters positioned along the blade in a nose region, wherein the cutters in the cone region toward a center of the drill bit have larger side rake angles than the cutters positioned along the nose region.

2. The drill bit of claim 1, wherein the cutters in the cone region have a side rake angle distribution comprising progressively smaller side rake angles from the center of the drill bit outward toward the nose region.

3. The drill bit of claim 1, wherein the cutters in the cone region have side rake angles greater than 0 degrees and no greater than about 15 degrees and cutters in a nose region have side rake angles smaller than the side rake angles of the cutter in the cone region.

4. The drill bit of claim 1, wherein the cutters in the cone region and cutters in the nose region have side rake angles no greater than about 15 degrees and the side rake angles of the cutters in the cone region have a distribution of side rake angles progressively decreasing toward the nose region.

5. The drill bit of claim 1, wherein the cutters in the cone region and cutters in the nose region have side rake angles greater than about 15 degrees and less than 90 degrees and cutters in a nose region have side rake angles smaller than the side rake angles of the cutter in the cone region.

6. The drill bit of claim 1, wherein the cutters along the cone region of the blade of the drill bit have a side rake angle distribution comprising a cutter in the cone region toward the center of drill bit having a side rake angle up to about 5 degrees, the cutters in the nose region having side rake angles less than 3 degrees, and blending the side rake angles of cutters in the cone region between the cutters toward the center and the cutters at the nose region.

7. The drill bit of claim 1, wherein a cutter in the cone region toward the center of drill bit has a side rake angle of about 12 degrees, a cutter in the nose region has a side rake angle of about 5 degrees, and cutters between the cutter toward the center of drill bit and the cutter in the nose region having a side rake angle distribution blended progressively from about 12 degrees to about 5 degrees.

8. The drill bit of claim 1, wherein the a cutter in the cone region toward the center of the drill bit has a side rake angle of about 5 degrees, cutters at the nose have side rake angles of the to about 2 degrees, and cutters in the cone region have progressively increasing side rake angles from about 5 degrees to about 2 degrees.

9. The drill bit of claim 1, wherein the cutters along the cone region of the blade of the drill bit have a side rake angle distribution comprising a cutter in the cone region toward the center of drill bit having a side rake angle in a range of greater than 15 degrees and up to about 45 degrees, the cutters in the nose region having side rake angles in a range of about −3 degrees to about 40 degrees, and blending the side rake angles of cutters in the cone region between the cutters toward the center and the cutters at the nose region.

* * * * *

UNITED STATES PATENT AND TRADEMARK OFFICE
CERTIFICATE OF CORRECTION

| | | |
|---|---|---|
| PATENT NO. | : 7,441,612 B2 | Page 1 of 1 |
| APPLICATION NO. | : 11/329976 | |
| DATED | : October 28, 2008 | |
| INVENTOR(S) | : Bala Durairajan et al. | |

It is certified that error appears in the above-identified patent and that said Letters Patent is hereby corrected as shown below:

On the Title Page:

Title page 2 section (56) References Cited, Foreign Patent Documents, line 6, "GB 0972908 A2 1/2000" should be --EP 0972908 A2 1/2000--.

Signed and Sealed this

Thirteenth Day of January, 2009

JON W. DUDAS
*Director of the United States Patent and Trademark Office*